(12) United States Patent
Rikino et al.

(10) Patent No.: US 6,356,118 B1
(45) Date of Patent: Mar. 12, 2002

(54) SEMICONDUCTOR INTEGRATED CIRCUIT DEVICE

(76) Inventors: Kunihito Rikino, c/o Hitachi Device Engineering Co., Ltd., 3681, Hayano, Mobara-shi, Chiba 297-8581; Yasuhiko Sasaki, c/o Hitachi, Ltd., Intellectual Property Group New Marunouchi Bldg. 5-1, Marunouchi 1-chome, Chiyoda-ku, Tokyo 100-8220; Kazuo Yano, c/o Hitachi, Ltd., Intellectual Property Group New Marunouchi Bldg. 5-1, Marunouchi 1-chome, Chiyoda-ku, Tokyo 100-8220; Naoki Kato, c/o Hitachi, Ltd., Intellectual Property Group New Marunouchi Bldg. 5-1, Marunouchi 1-chome, Chiyoda-ku, Tokyo 100-8220, all of (JP)

( * ) Notice: Subject to any disclaimer, the term of this patent is extended or adjusted under 35 U.S.C. 154(b) by 0 days.

(21) Appl. No.: 09/549,711

(22) Filed: Apr. 14, 2000

(30) Foreign Application Priority Data

Apr. 16, 1999 (JP) .................................. 11-108915

(51) Int. Cl.[7] .............................................. H03K 19/094
(52) U.S. Cl. ........................ 326/113; 326/101; 326/102; 326/103
(58) Field of Search ................................ 326/113, 112, 326/119, 101, 102, 103

(56) References Cited

U.S. PATENT DOCUMENTS

| | | | | |
|---|---|---|---|---|
| 5,079,614 A | * | 1/1992 | Khatakhotan | 357/42 |
| 5,200,907 A | * | 4/1993 | Tran | 364/490 |
| 5,955,912 A | * | 9/1999 | Ko | 327/410 |
| 6,194,914 B1 | * | 2/2001 | Sako | 326/113 |

* cited by examiner

Primary Examiner—Michael Tokar
Assistant Examiner—Anh Tran
(74) Attorney, Agent, or Firm—Antonelli, Terry, Stout & Kraus, LLP

(57) ABSTRACT

A pass-transistor logic circuit configuration that can form a high-speed chip in a small area with short wire length. In a selector circuit PMOS and NMOS transistors with different gate signals but with the same drain outputs are arranged, respectively, so their diffusion layers are shared. The PMOS and NMOS are staggered so that their gates are almost in line. With this arrangement, wires connecting drains of the PMOS and NMOS and wires connecting sources of the PMOS and NMOS do not intersect each other, so they can be wired with only the first wiring layer. Further, gate input signals can be wired with only polysilicon wires without crossing each other. The pass-transistor logic circuit is made to pass through the signal buffers before or after it is connected to the selector. This can make a compact, fast circuit.

9 Claims, 53 Drawing Sheets

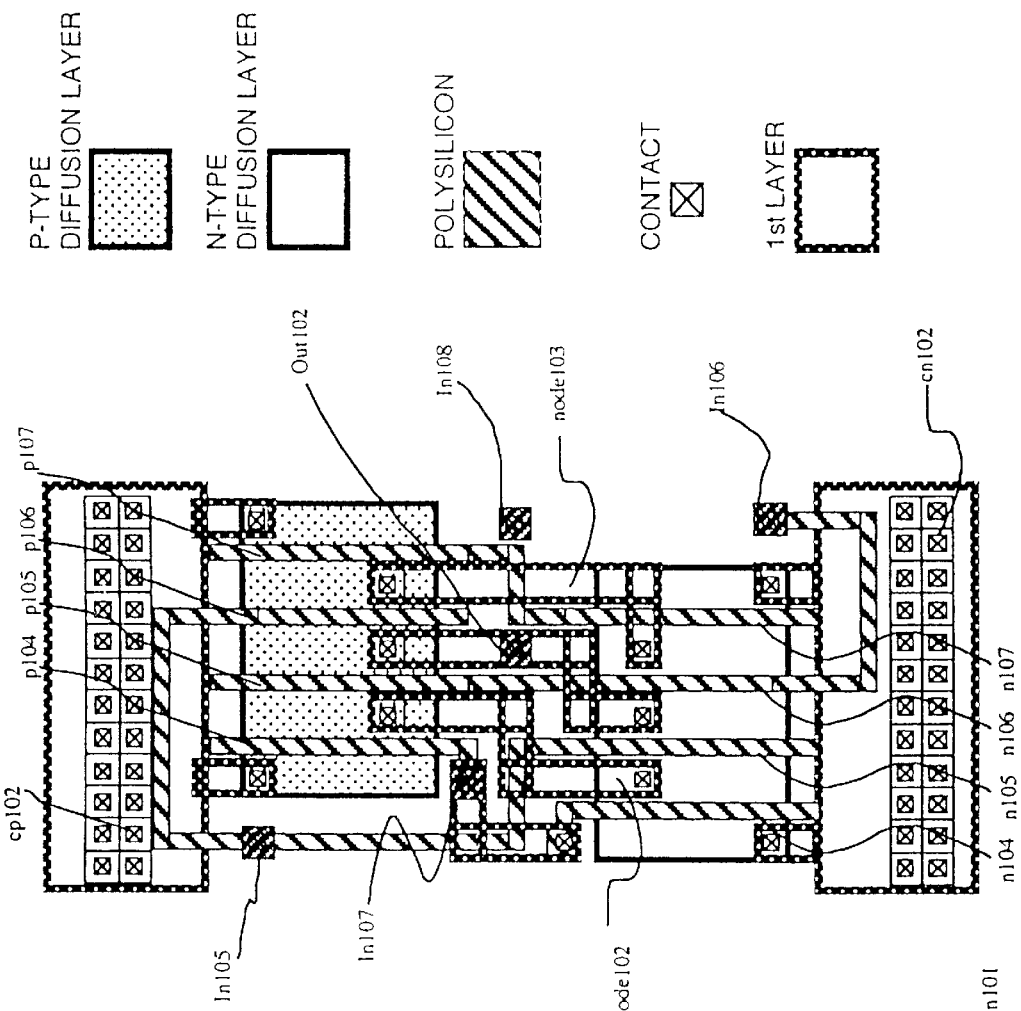

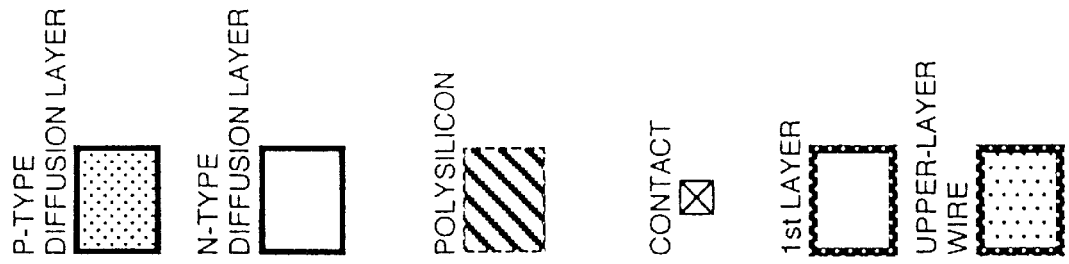
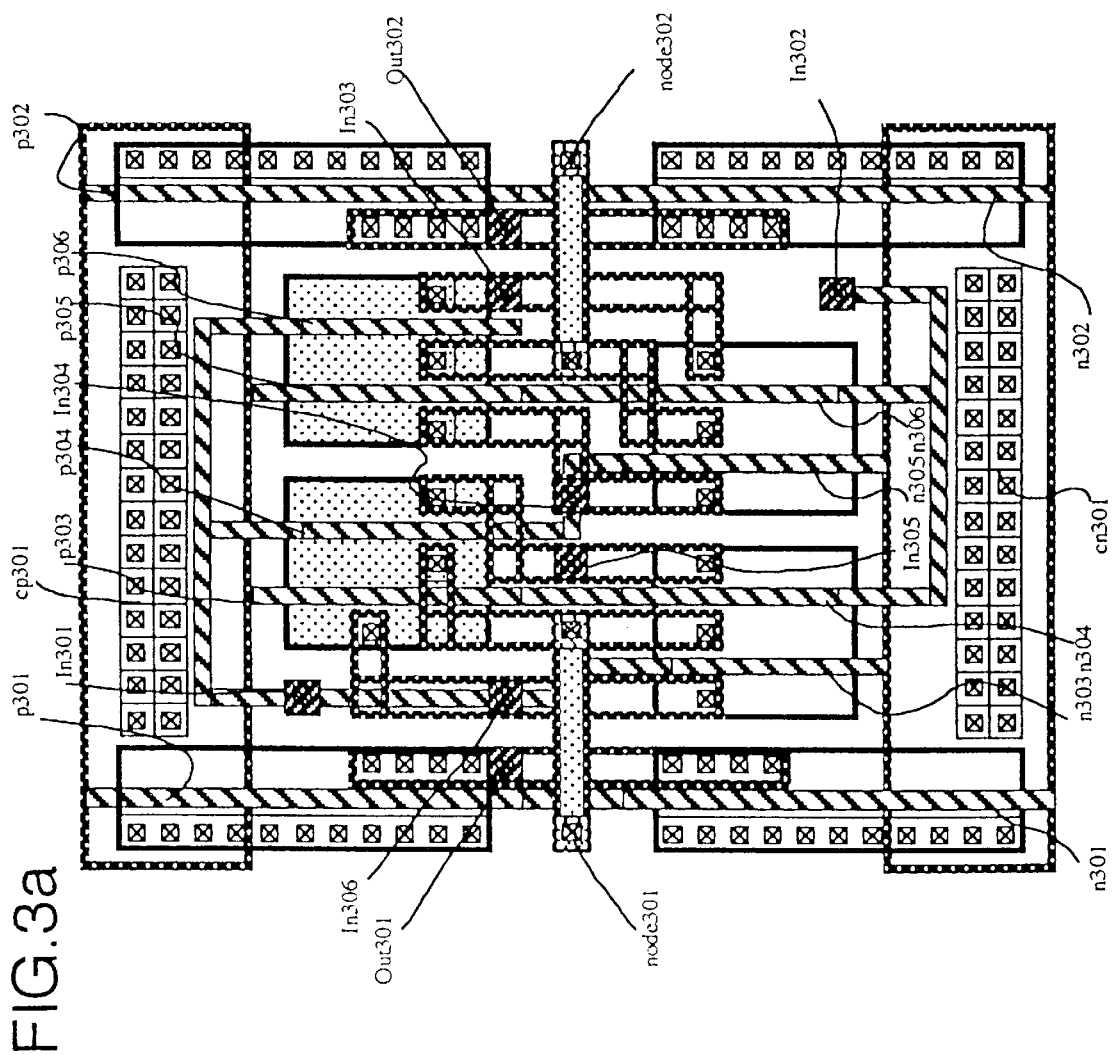
FIG.3a

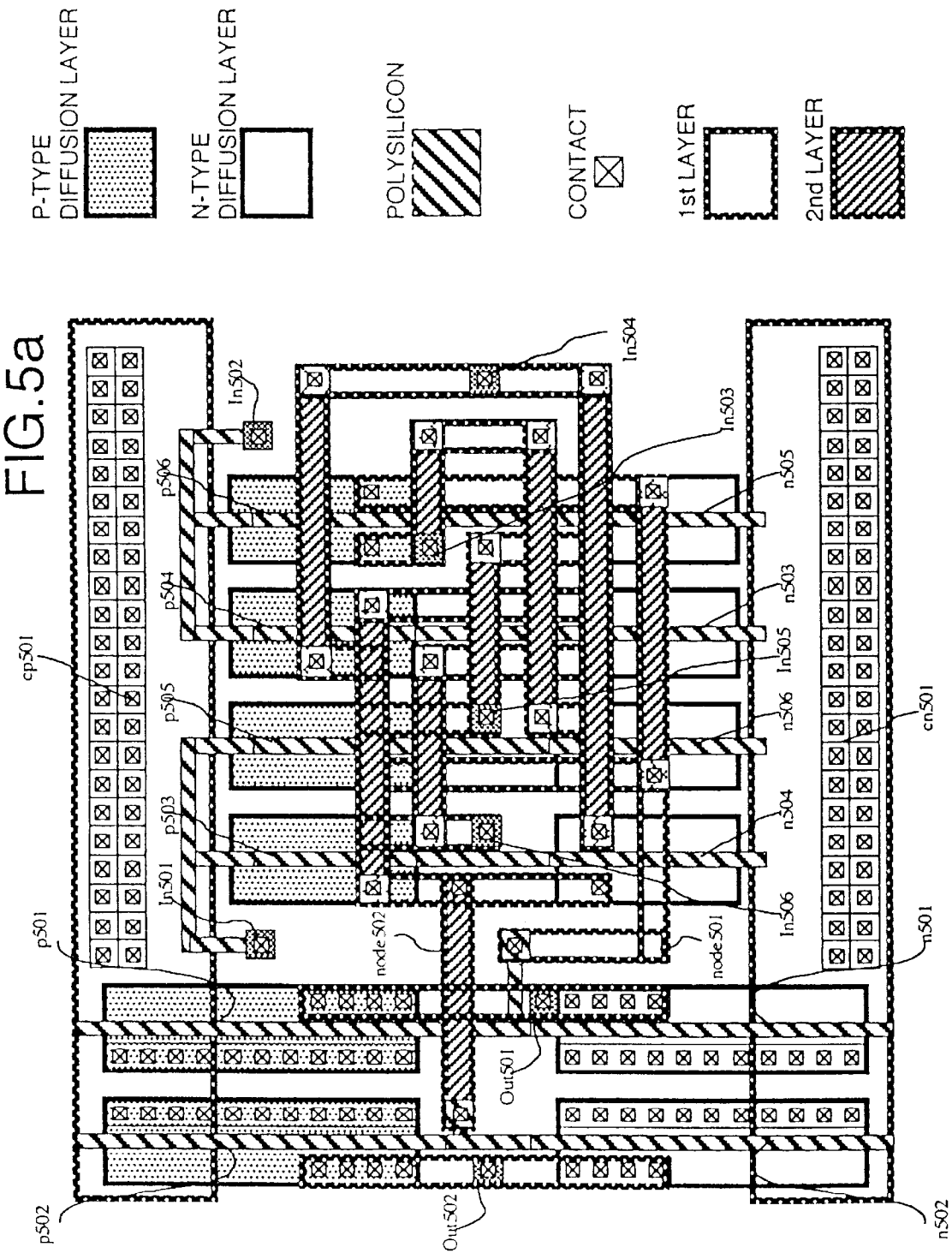

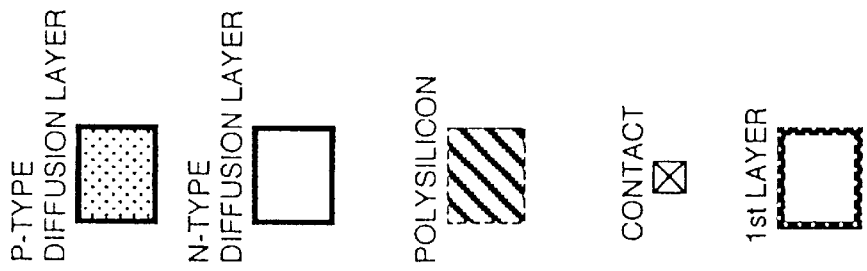
FIG.14a
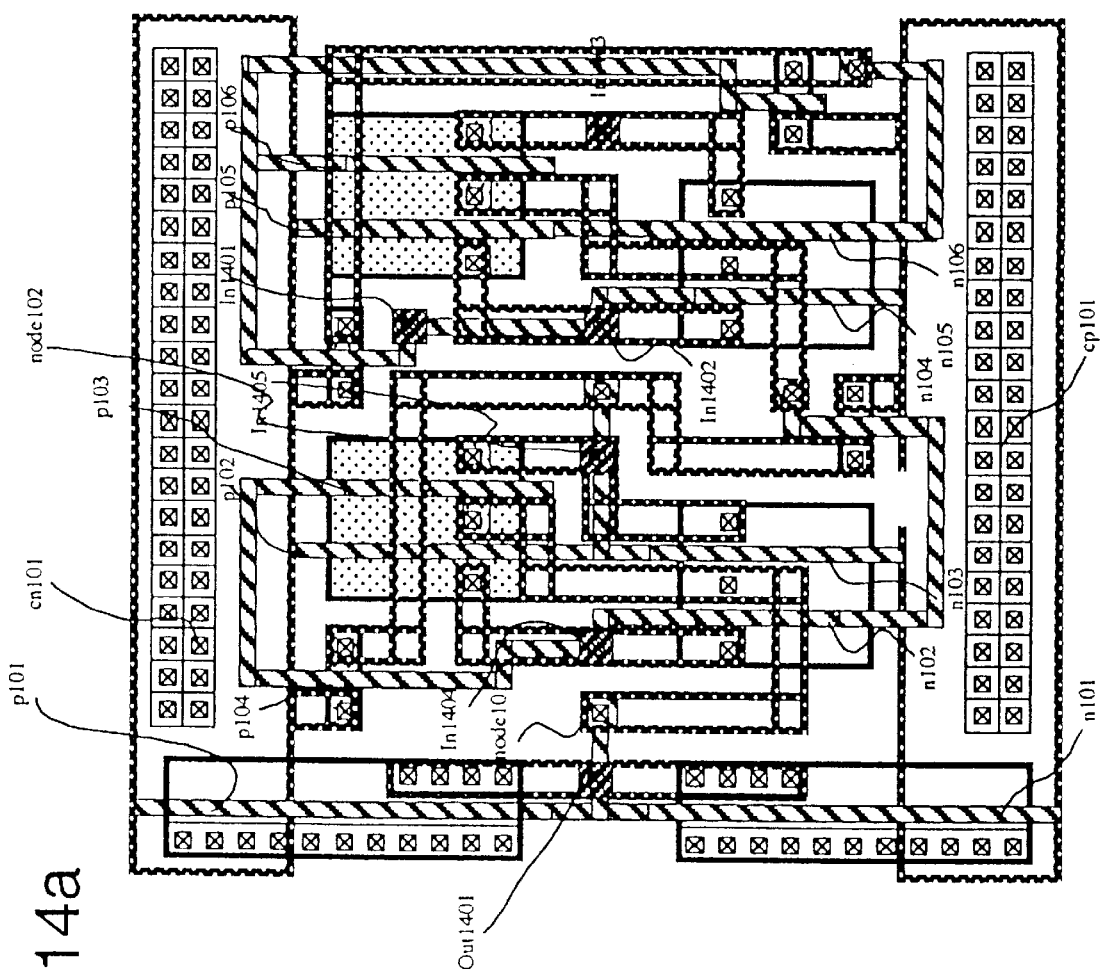

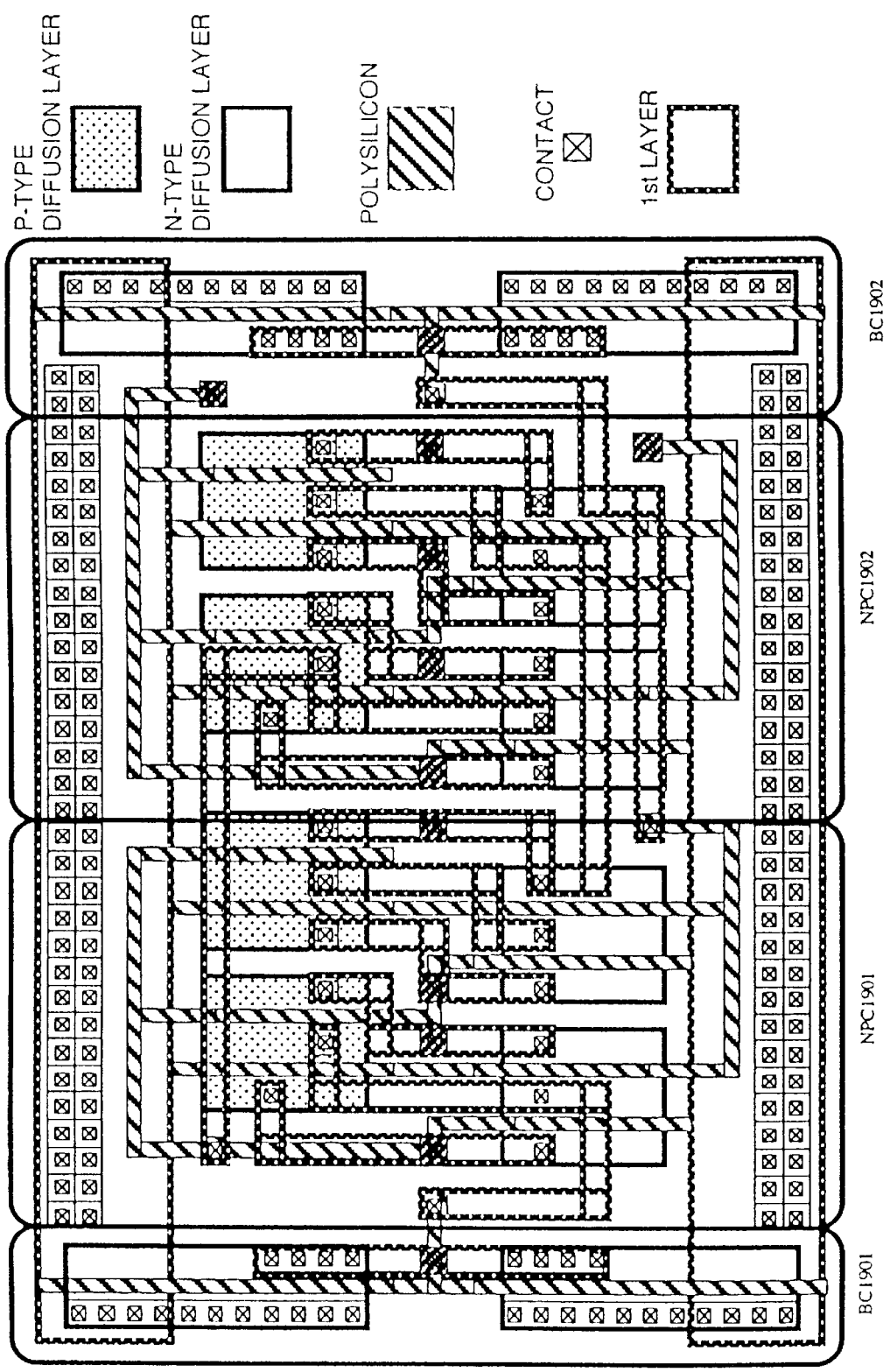

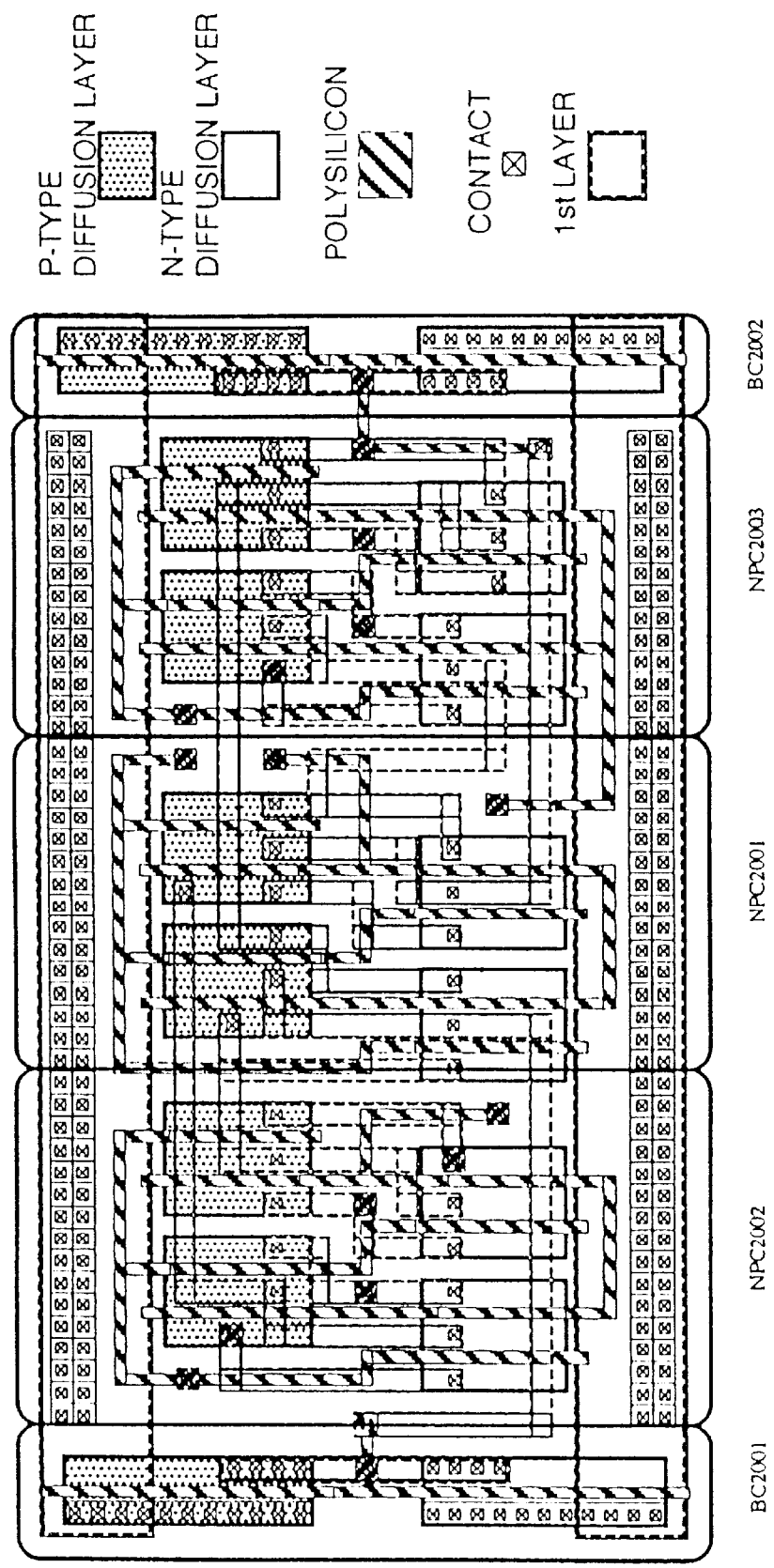

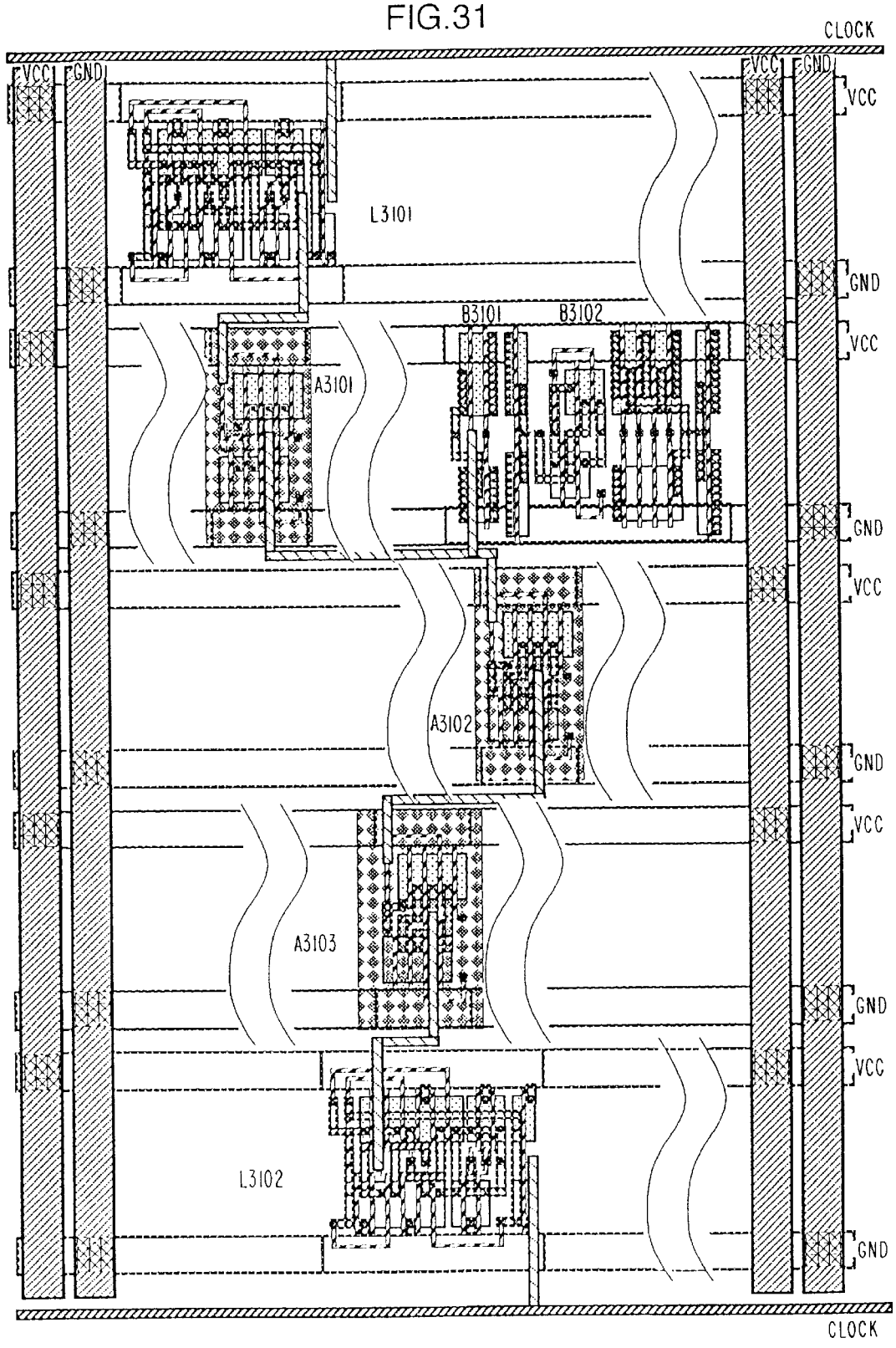

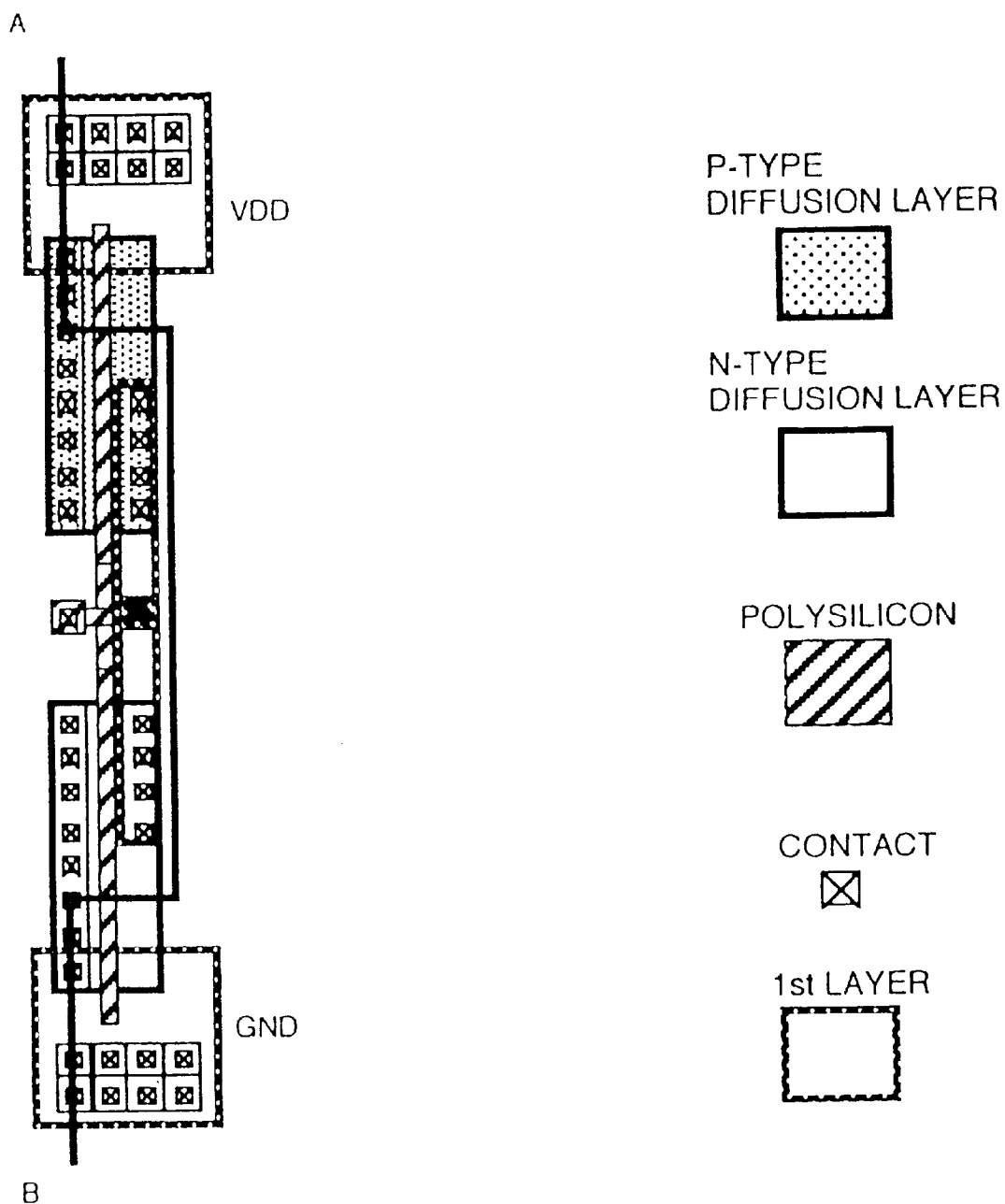

- ▦ GATE OXLDE LAYER
- ▨ GATE
- ○ ISOLATION
- ▨ ACTIVE REGION (N⁺) OF NMOS
- ▨ ACTIVE REGION (P⁺) OF PMOS
- ▨ HIGHLY-DOPED SURFACE N-REGION FOR BODY BIAS CONTACT FOR PMOS
- ▨ HIGHLY-DOPED SURFACE P-REGION FOR BODY BIAS CONTACT FOR NMOS

SEMICONDUCTOR INTEGRATED CIRCUIT DEVICE

BACKGROUND OF THE INVENTION

The present invention relates to semiconductor integrated circuits in general, and, more particularly, to semiconductor integrated circuits applicable to LSI'S, such as general purpose processors, digital signal processors, graphics processors and various control processors.

To achieve high performance design automation, gate array and cell-based IC's are currently in wide use. In particular, one type of a logic circuit referred to as a pass-transistor logic circuit, is known in this field. It is published that the pass-transistor logic circuit has a higher density, lower power consumption and smaller delay time than the CMOS logic circuits that are commonly used as the logic circuits.

So far, pass-transistor logic circuits have been introduced as a Differential Pass-Transistor Logic in the IEEE Journal of Solid-State Circuits, Vol. sc-22, No. 2, April 1987, pp216–pp222 (hereinafter referred to as a first conventional technology); as a Complementary Pass-Transistor Logic in the IEEE Journal of Solid-State Circuits, Vol. sc-25, No. 2, April 1990, pp388–pp395 (hereinafter referred to as a second conventional technology); and as a 1.5-ns 32-b CMOS ALU in Double Pass-Transistor Logic in the IEEE Journal of Solid State Circuits, Vol. 28, No. 11, November 1993, pp1145–pp1151 (hereinafter referred to as a third conventional technology).

Further, a Low-Power Logic Style: CMOS Versus Pass-Transistor Logic has been introduced in the IEEE Journal of Solid-State Circuits, Vol. 32, No. 7, July 1997, pp1079–pp1090 (hereinafter referred to as a fourth conventional technology). An example layout of a pass-transistor logic circuit is introduced in the Principles of CMOS VLSI Design—A Systems Perspective (by H. E. Weste & Kamran Eshraghian, translated by T. Tomisawa and Y. Matsuyama), published on Aug. 30, 1998, Maruzen Co., Ltd., p. 173 (hereinafter referred to as a fifth conventional technology). A circuit design technique that combines a pass-transistor circuit and the abovementioned standard-cell-based design is introduced in the IEEE 1994 Custom Integrated Circuits Conference, pp603–pp606 (hereinafter referred to as a sixth conventional technology).

Further, a circuit design technique that combines a-pass-transistor circuit and the standard-cell-based design by using a logic representation method called a binary decision diagram is introduced in the Institute of Electronics, Information and Communication Engineering, Proceedings of the 1994 IEICE Fall Conference (hereinafter referred to as a seventh conventional technology). A logic circuit cell using a pass-transistor circuit is shown in JP-A-7-130856 (laid-open on May 19, 1995, and corresponding to U.S. Pat. No. 5,581,202) (hereinafter referred to as an eighth conventional technology). A transmission gate multiplexer is disclosed in U.S. Pat. No. 5,162,666 (hereinafter referred to as a ninth conventional technology). A "Pass Transistor Network in MOS Technology" is introduced in IEEE 1983 International Symposium on Circuit and Systems, pp509–pp512 (hereinafter referred to as a tenth conventional technology).

SUMMARY OF THE INVENTION

FIGS. 4a and 4b show, as an example to be compared, the layout of a cell of a CMOS logic circuit developed by the inventors of this invention. To the knowledge of the present inventors, this layout is not known to the public. In this layout, gate terminals of PMOS and NMOS are arranged in line with each other to reduce the layout area. The inventors conducted a preliminary study on the cell layout based on the above design philosophy to realize an integrated circuit with a small layout area by using pass-transistor circuits.

FIGS. 5a and 5b show the result of a study by the present inventors. In these figures, the source (drain) diffusion layers at the same voltage cannot be used commonly to arrange the gate terminals closer together. Hence, the diffusion layers that cannot be used commonly need to be connected by upper-layer metal wires, giving rise to a problem of increased layout area and wire length. The longer total wire length as well as the increased layout area, in turn, increase the delay time. The object of the present invention is to provide a pass-transistor logic circuit that has a small layout area.

The conventional pass-transistor logic circuit has a problem that because the source (drain) terminal acts as an input terminal, the input signal waveform degrades. Further, because the input capacitance changes depending on the operating conditions, the delay calculation is difficult. To solve these problems, an inverter has been known to be provided to an input terminal of source (drain) terminal (as in the ninth and tenth conventional technology). However, the preliminary study by the inventors has found that this method increases the delay time by as much as the inverters added. Another object of the invention is to provide a pass-transistor logic circuit which is fast and allows easy delay calculation.

The present invention proposes a selector portion layout method to be used during the process of laying out the pass-transistor logic circuit cells of the above construction.

According to one aspect of the present invention, a cell is used that has at least one selector. To fabricate cells with small areas by using only polysilicon wires, or wires of the same material as gate terminals, and first-layer metal wires, the semiconductor circuit of the present invention is laid out according to the following design philosophy.

That is, in the pass-transistor circuit, pMOS's and nMOS's that are applied the same signals receive complementary gate signals. The MOS's with the same drain outputs are arranged to share their diffusion layers.

Further, according to another aspect of the present invention, when there is a plurality of selectors, output buffers are arranged at the ends of the cell, and the selectors are arranged in a direction in which the first power supply line and the second power supply line extend. With this arrangement, if there is a plurality of selectors, the number of the selectors can be increased flexibly in the direction of expansion, thus assuring a systematic layout. This in turn reduces the time required to design the layout of the selectors.

According to a further aspect of the present invention, a signal buffer is connected to the input side of the selector. As a result, all signals entering the pass-transistor circuit become gate signals, which in turn reduce the input capacitance, thus solving the problem of degraded input waveform. This arrangement can also prevent the input capacitance from varying depending on the operation conditions, making it easy to estimate the input capacitance and the delay calculation. This can be expected to shorten the design time.

Further, in this circuit which has the signal buffers connected to the source and drain terminals, because the signal path passing through the gate terminal of the pass-transistor circuit does not pass through the signal buffer, the high speed operation is possible.

According to a further aspect of the present invention, the integrated circuit including the circuit of this invention has power supply lines, of which power supply lines 1, 3, 5, ..., 2n+1, ... (n is a natural number) are at the same voltage, and power supply lines 2, 4, 6, ..., 2n, ... (n is a natural number) are at the same voltage. Thus, this integrated circuit can coexist with other circuits represented by CMOS circuits.

According to a further aspect of the present invention, the integrated circuit including the circuit of this invention has a latch. Because a signal passing through the gate terminal of the selector does not pass through the signal buffer, a high speed signal transmission between the latches is possible. The circuit of the invention therefore is an important factor in determining the specification of the integrated circuit.

According to a further aspect of the present invention, a signal that has passed through the input buffer now passes through the selector, from which it is transmitted to a plurality of input terminals. This enables the whole integrated circuit to be formed compactly.

According to one embodiment of the circuit of 15 the present invention, the integrated circuit includes a selector 1 and logic gates 1, 2 and also power supply lines 1, 2, 3, 4, 5 and 6 arranged in parallel. Of these power supply lines 1, 3, 5 are virtually at the same voltage and power supply lines 2, 4, 6 are virtually at the same voltage. The selector 1 has PMOS1, 2, and NMOS1, 2, 3, 4; a gate of PMOS1 is controlled by an input signal 1; and a source-drain path of PMOS1 is connected between an operation voltage point 1 and a node 1. A gate of PMOS2 is controlled by an input signal 2; and a source-drain path of PMOS2 is connected between the operation voltage point 1 and a node 2. A gate of NMO@L is controlled by the input signal 1, and a source drain path of NMOS1 is connected between an operation voltage point 2 and the node 1. A gate of NMOS2 is controlled by the input signal 2, and a source-drain path of NMOS2 is connected between the operation voltage point 2 and the node 2. A gate of NMOS3 is controlled by an input signal 3, and a source-drain path of NMOS3 is connected between the node 1 and a node 3. A gate of NMOS4 is controlled by an input signal 4, and a source-drain path of NMOS4 is connected between the node 2 and the node 3. The node 3 is connected to input terminals of the logic gate 1 and the logic gate 2.

Further, if the circuit is formed as a sequential circuit, it is characterized as follows. It has first and second temporary memory circuit; a first power supply line is formed in a horizontal direction; and a second power 15 supply line is formed parallel to the first power supply line. The second temporary memory circuit is controlled by the same clock signal as is used for the first temporary memory circuit. A data output node 01 of the first temporary memory circuit controls the gate terminals of NMOS1 and PMOS2. The source-drain path of NMOS1 is connected between nodes n1 and n2; the source-drain path of PMOS2 is connected between nodes n2 and n3; the source-drain path of PMOS3 is connected between the first power supply line and the node n1; the source-drain path of NMOS3 is connected between the second power supply line and the node n1; a signal of node n4 controls the gate terminals of PMOS3 and NMOS3; the source-drain path of PMOS4 is connected between the first power supply line and the node n3; the source-drain path of NMOS4 is connected between the second power supply line and the node n3; a signal of node n5 controls the gate terminals of PMOS4 and NMOS 4; the source-drain path of NMOS2 is connected to the nodes n2 and n3; the source-drain path of PMOS1 is connected between the nodes n1 and n2; a signal of node n6 controls the gate terminals of PMOS1 and NMOS2; a signal of node n2 controls the gate terminals of PMOS5 and NMOS5 and is applied to input the terminals of other logic gates; a source-drain path of PMOS5 is connected between the first power supply line and node n7; a source-drain path of NMOS5 is connected between the second power supply line and the node n7; a source-drain path of NMOS8 is connected between nodes n7 and n9; a source-drain path of NMOS8 is connected between node n7 and n9; a source-drain path of PMOS9 is connected between nodes n9 and n11; a source-drain path of NMOS9 is connected between nodes n9 and n11; a signal of node n8 controls the gate terminals of PMOS9 and NMOS8; a signal of node n10 controls the gate terminals of PMOS8 and NMOS9; a signal of node n12 controls the gate terminals of PMOS8 and NMOS8; a source-drain path of PMOS8 is connected between the first power supply line and node n11; a source-drain path of NMOS 8 is connected between the second power supply line and node n11; a signal of node n15 controls the gate terminals of PMOS9 and NMOS9; a source-drain path of PMOS9 is connected between the first power supply line and node n14; a source-drain path of NMOS9 is connected between the second power supply line and node n14; a source-drain path of PMOS10 is connected between nodes n14 and n17; a source-drain path of NMOS10 is connected between nodes n14 and n17; a source-drain path of PMOS11 is connected between nodes n9 and n17; a source-drain path of NMOS11 is connected between nodes n9 and n17; a signal of node n13 controls the gate terminals of PMOS10 and NMOS11; a signal of node n16 controls the gate terminals of PMOS11 and NMOS10; a signal of node n18 controls the gate terminals of PMOS15 and NMOS15; a source-drain path of PMOS15 is connected between the first power supply line and node n18; a source-drain path of NMOS15 is connected between the second power supply line and node n18; a source-drain path of PMOS13 is connected between nodes n20 and n22; a source-drain path of NMOS13 is connected between nodes n20 and n22; a source-drain path of PMOS14 is connected between nodes n18 and n20; a source-drain path of NMOS14 is connected between nodes n18 and n20; a signal of node n17 controls the gate terminals of PMOS13 and NMOS14; a signal of node n21 controls the gate terminals of PMOS14 and NMOS13; a signal of node n23 controls the gate terminals of PMOS12 and NMOS12; a source-drain path of PMOS12 is connected between the first power supply line and node n22; a source-drain path of NMOS12 is connected between the second power supply line and node n22; and a signal of node n20 is connected between the inputs of the second temporary memory circuit.

FIGS. 7a–7c are circuit diagrams of logic circuits to which the present invention is applicable. FIG. 7a shows a circuit in which a signal is amplified after it has passed through the selector. FIG. 7c shows a circuit in which a signal is amplified before it passes through the selector. As a result, in the circuit of FIG. 7c, the input capacitance produced when the circuit receives drain inputs is only that of the gates of the input buffers, thus significantly reducing the input capacitance. FIG. 7b shows a circuit with a plurality of selectors. The layouts suited for these circuits will be described in detail.

BRIEF DESCRIPTION OF THE DRAWINGS

FIGS. 1a–1d are layout and circuit diagrams of pass-transistor logic circuits according to one embodiment of the invention.

FIGS. 3a–3b are layout and circuit diagrams of a pass-transistor logic circuit according to one embodiment of the invention.

FIGS. 5a–5b are layout and circuit diagrams of a logic circuit cell shown as an example for a comparison that does not use an embodiment of the invention, and which was devised by the inventors prior to the present invention.

FIGS. 13a–13b, 14a–14b, 15a–15b, 16a–16b, 17a–17b, 18a–18b, 19a–19b, 20a–20b, 21a–21b, 22a–22b, 23a–23b, 24a–24b, 25a–25b, 26a–26b, and 27a–27b are each layout and circuit diagrams of pass-transistor logic circuits according to embodiments of the present invention.

FIG. 31 is a layout diagram of a chip according to one embodiment of the present invention (double threshold 5 value).

FIGS. 32a–32b are a layout diagram of a pass-transistor logic circuit according to one embodiment of the present invention and a cross section of a device.

DETAILED DESCRIPTION OF EMBODIMENTS

Embodiments of the present invention will be described by referring to the accompanying drawings. FIGS. 1a–1d are layout and circuit diagrams of one embodiment of the invention. In FIGS. 1a–1d, p101–p107 and n101–n107 represent transistors, and In101–In108 represent input signals from outside. Node101–node103 denote inputs-and outputs of a selector; Out101 and Out102 denote outputs of a pass-transistor logic circuit; BC101 denotes an output buffer; IB101, 102 denote input buffers; cp101, 102 denote body bias contacts; and cn101, 102 denote well bias contacts.

In the pass-transistor logic circuit of this invention, PMOS and NMOS that receive the same signal at their sources are applied with complementary gate signals. The circuit is arranged so that a pair of MOS's with the same drain outputs share their diffusion layers.

In FIGS. 1a–1d, p102 and p103, and n102 and n103 are paired to share their diffusion layers. Further, p102 and n103 are arranged and connected so that their gates are in line in a direction perpendicular to the power supply line. With this arrangement, a wire connecting the drains of PMOS and NMOS, and a wire connecting the sources of PMOS and NMOS do not cross each other, so that they can be wired with only a polysilicon wire and a metal wire of a first layer. Further, the gate input signals In101, In102 do not cross each other, and thus can be wired with only a polysilicon wire.

Further, the unused MOS areas by the side of p102 10 and n103, that are created by arranging the p102 and n103 so that their gates are in line in a direction perpendicular to the power supply line, may be utilized for placing the gate terminals, thus eliminating dead space.

When laying out a semiconductor integrated circuit having at least one selector, if a direction parallel to a first power supply line and a second power supply line is set in a horizontal or lateral direction, output buffers are arranged at the left and right ends of the cell, with the selector connecting to the inputs of the output buffers placed between them. This arrangement is made to avoid a situation in which, because the input of the output buffer formed by wiring the gates of PMOS and NMOS with a poly-silicon wire, and the output formed by wiring the drains of pMOS And nMOS with the first wiring layer are lead out in a direction perpendicular to the power supply line, internal wiros-in the cell must use the second wiring layer in order to pass-over the output buffer. This arrangement allows the output of the selector and the output's inverted signal to be sent smoothly to the output buffer, reducing the layout area. That is, in this embodiment, because the output buffers are arranged on both sides of the selector, with respect to the direction of the power supply line, if two or more selectors exist, the output buffers do not interfere with the lines running between the selectors, making it possible to reduce the layout area with ease.

Figure 1D:
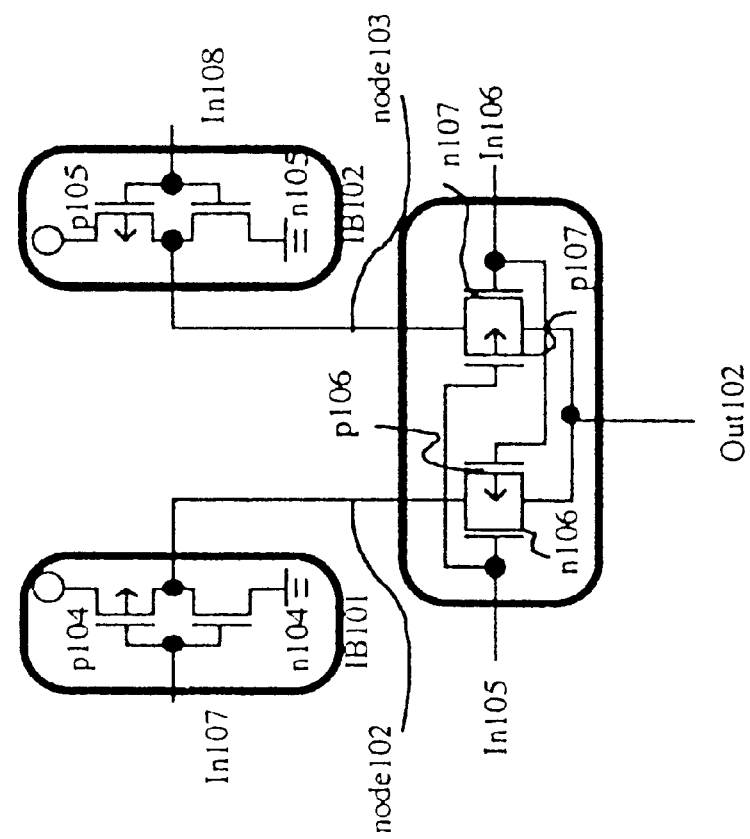
Figure 1B:
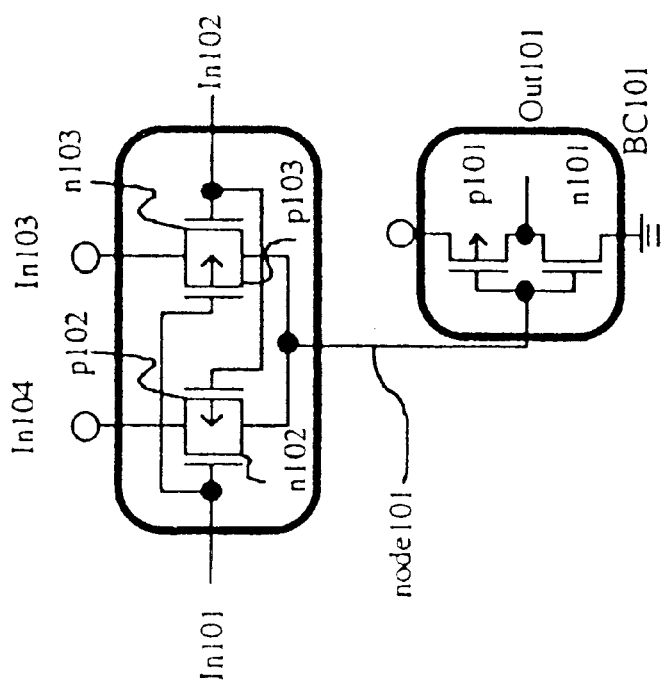
Figure 2A:
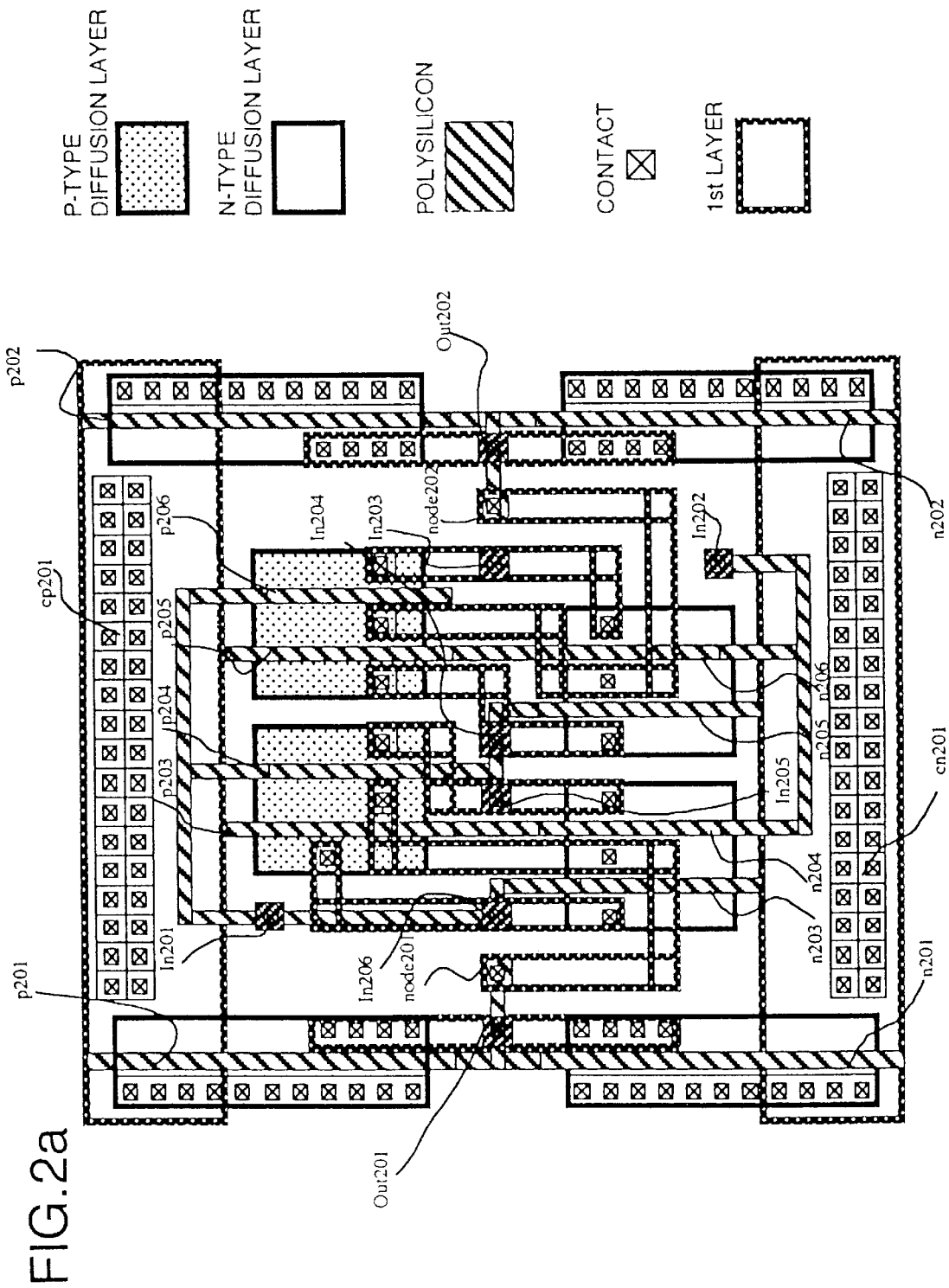
FIGS. 2a–2b are layout and circuit diagrams of a pass-transistor logic circuit according to one embodiment of the invention.
Figure 2B:
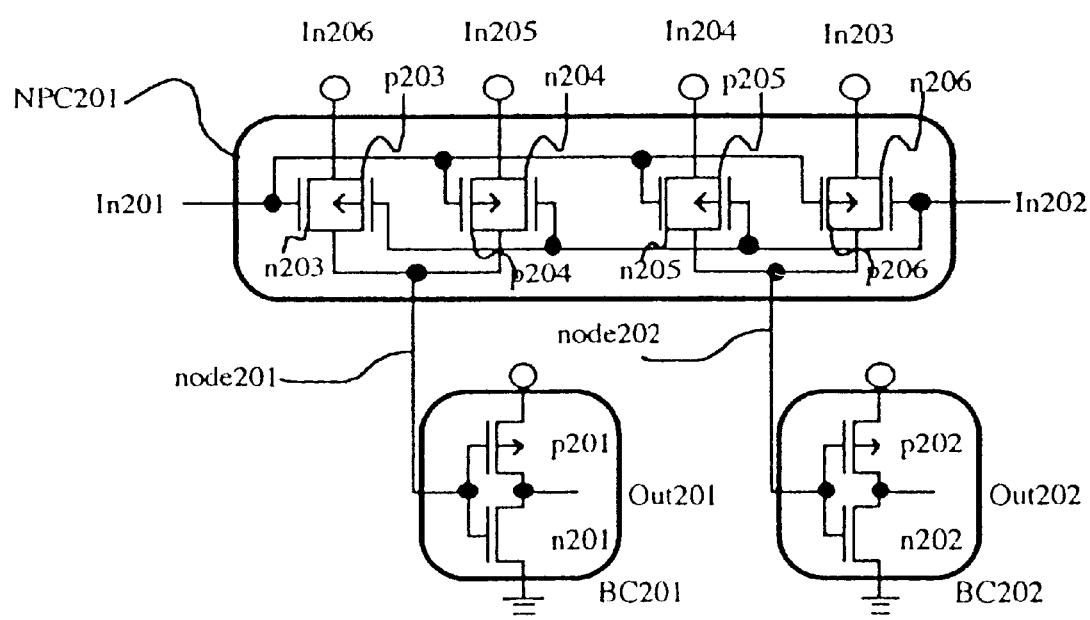

An example shown in FIGS. 2a–2b will be explained as follows. In FIGS. 2a–2b, p201–p206 and n201–n206 designate transistors, and In201–In206 input signals from outside. NPC201 is a selector circuit, node201 and node202 are outputs of the selector circuit, Out201 and out202 outputs of pass-transistor logic circuits, BC201 and BC202 are output buffers, cp201 is a body bias contact, and cn201 is a well bias contact.

The selector circuit which has different gate signals for pMOS and nMOS, is laid out so that MOSS with the same drain outputs share their diffusion layers. The MOSS that are paired to share their diffusion layers are p203 and p204; p205 and p206; n203 and n204; and n205 and n206 in FIGS. 2a–2b. Further, the pair of p203 and p204 and the pair of p205 and p206 are arranged with a minimum interval, and the pair of n203 and n204 and the pair of n205 and n206 are also arranged with a minimum interval. Further, p203 and n204, and p205 and n206 are arranged in line and wired. A wire connecting the drains of pMOS and nMOS, and a wire connecting the sources of pMOS and nMOS do not cross each other, so they can be wired with only a first layer's metal wire. Further, the gate input signals In201, In202 do not cross each other and thus can be wired with only a polysilicon wire. Further, the unused MOS areas above n203 and below p206, which are created by arranging p203 and n204 and also p205 and n206 in line, may be used for leading out the gate input terminals to eliminate a dead space.

Figure 8:
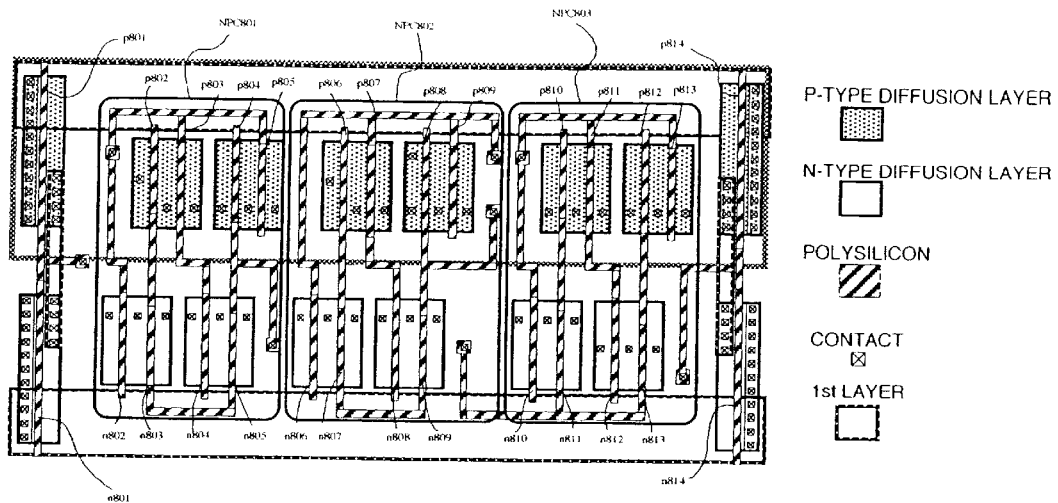
FIG. 8 is a layout diagram of a pass-transistor 5 logic circuit according to one embodiment of the present invention.

As described later, in the above semiconductor integrated circuit of this embodiment, when there is a plurality of selector circuits (for example, NPC901, NPC902 and NPC903 in FIG. 9), they are arranged in the direction of the first power supply line and the second power supply line. In FIG. 8, NPC801, NPC802 and NPC803 are arranged in that order.

In the above semiconductor integrated circuit of this embodiment, the output buffers are arranged at the ends of the cell (p801, p802, n801 and n802 in FIG. 8). If two or more selector circuits (for example, NPC901, NPC902 and NPC903 in FIG. 9) exist, they can be laid out in a systematic manner because the number of selector circuits can be increased flexibly in the expansion direction. This can reduce the time required for the layout design.

Figure 3B:
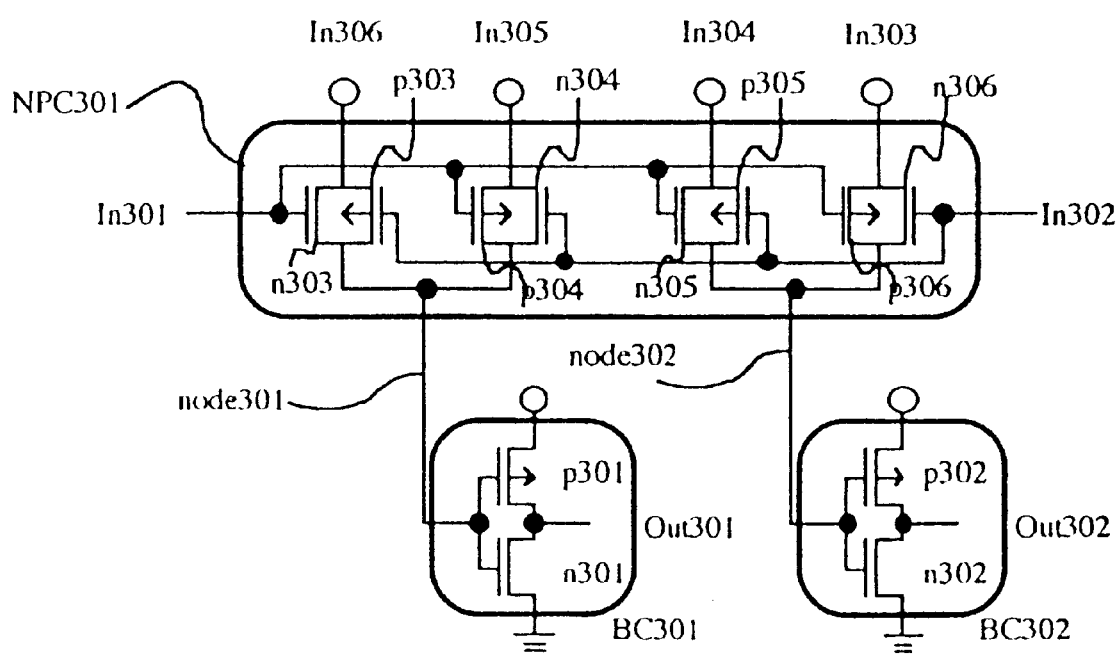

In FIGS. 3a and 3b, p301–p306 and n301–n306 denote transistors, and In301–In306 denote input signals from outside. NPC301 represents a selector, node301 and node302 represent outputs of the selector, Out301 and Out302 represent outputs of pass-transistor logic circuits, BC301 and BC302 represent output buffers, cp301 represents a body bias contact, and cn301 represents a well bias contact.

Figure 4A:
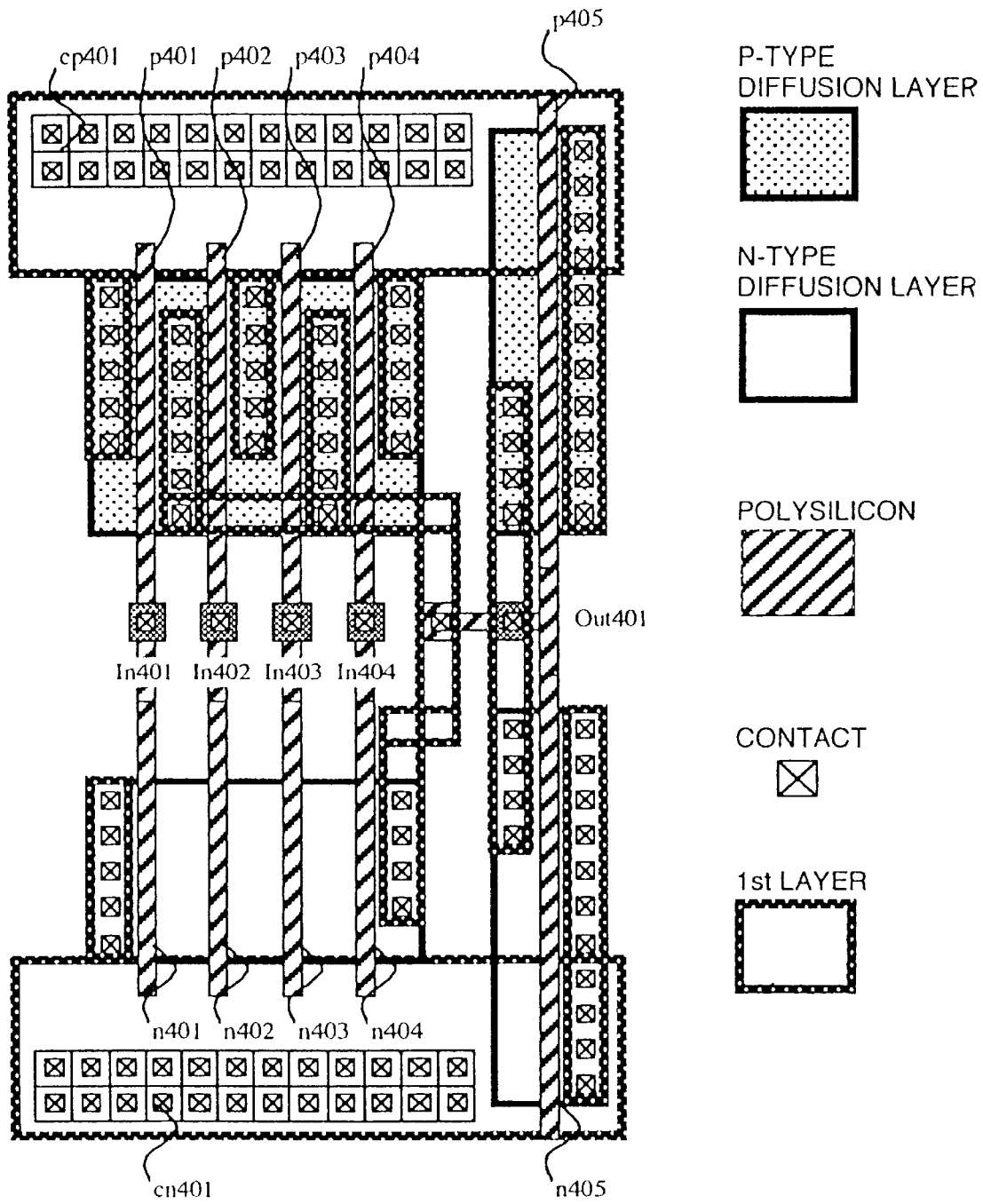
FIGS. 4a–4b are layout and circuit diagrams of a CMOS logic circuit (4-input AND) devised by the inventors prior to the present invention.
Figure 4B:
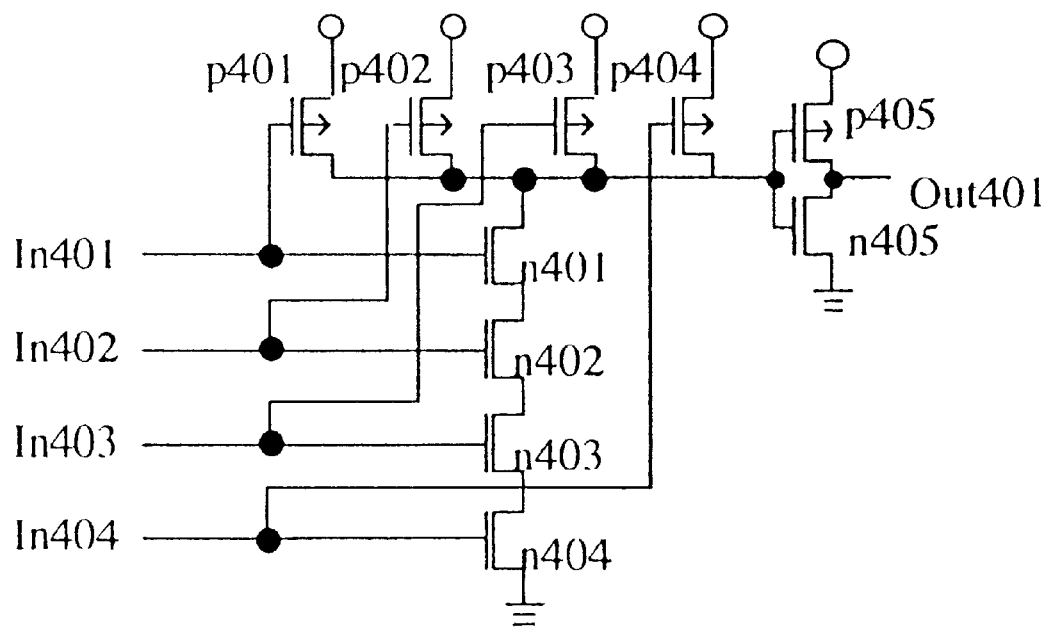

In FIGS. 4a and 4b, p401–p405 and n401–n405 denote transistors, In401–In404 denote input signals from outside, Out491 denotes an output signal, cp401 denotes a base bias contact, and cn401 denotes a well bias contact.

Figure 5B:
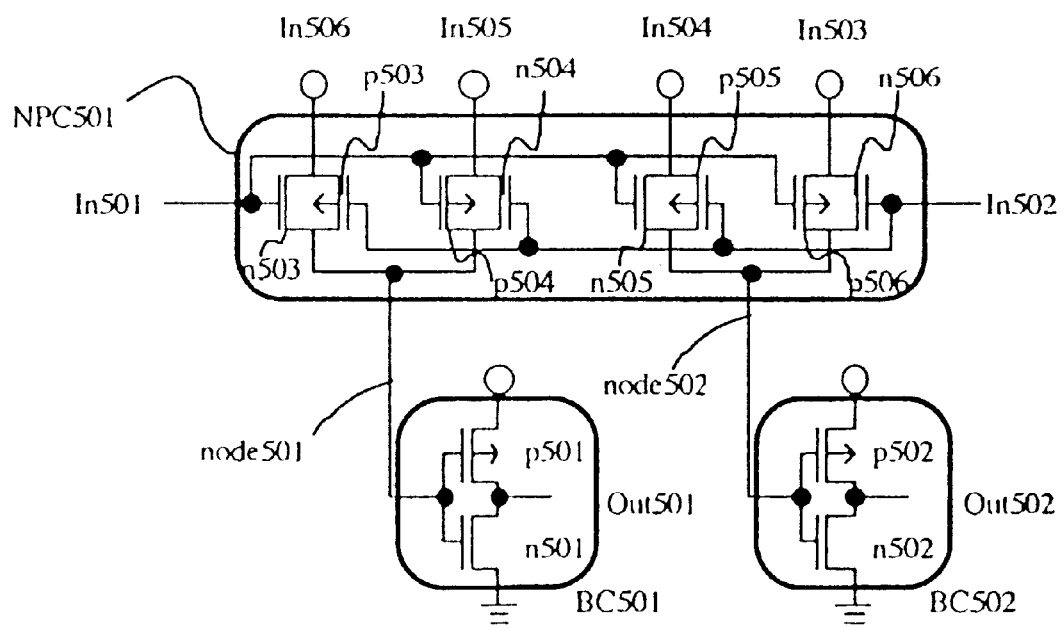

In FIGS. 5a and 5b, p501–p506 and n501–n506 denote transistors, In501–In506 denote input signals from outside. NPC501 represents a selector, node 501 and node 502 represent outputs of the selector, out501 and Out502 represent outputs of pass-transistor logic circuits, BC501 and BC502 represent output buffers, cp501 represents a body bias contact, and cn501 a well bias contact.

Figure 6A:
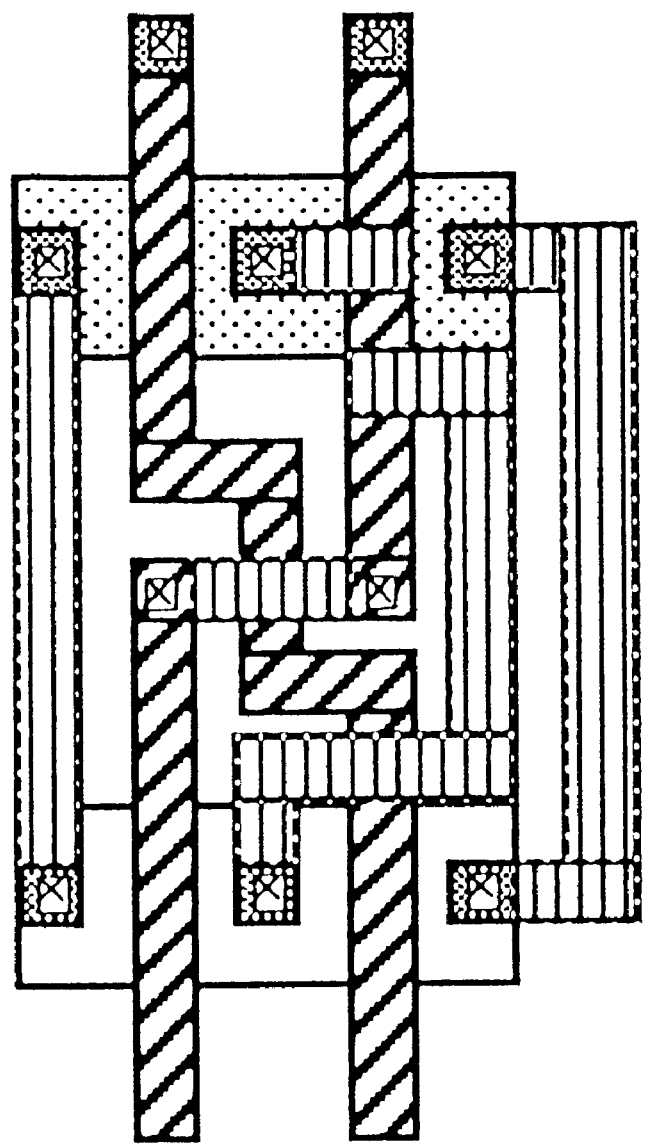
FIGS. 6a–6c are layout and circuit diagrams of a logic circuit shown as an example for a comparison which was devised by the inventors prior to the present invention.
Figure 6C:
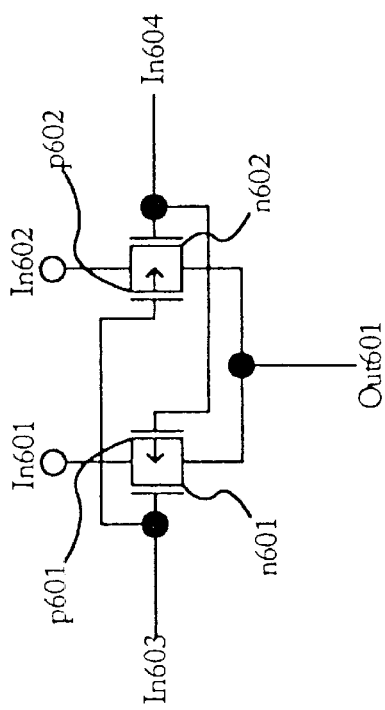
Figure 6B:
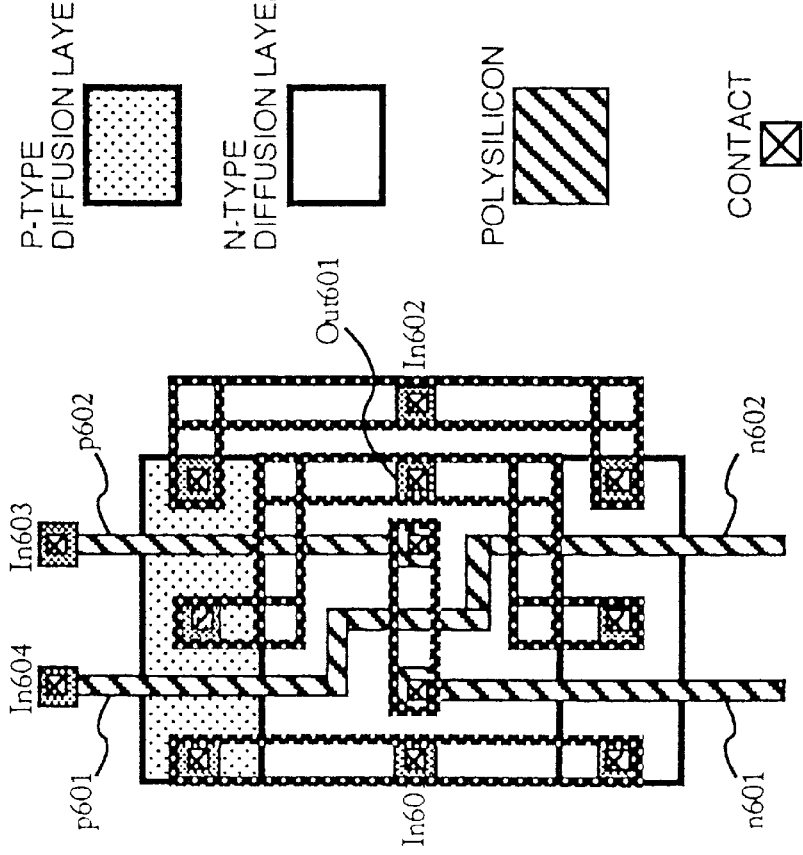

In FIGS. 6a–6c, p601–p602 and n601–n602 represent transistors, In601–In604 represent input signals from outside, and Out601 represents an output of the circuit.

Figure 7A:
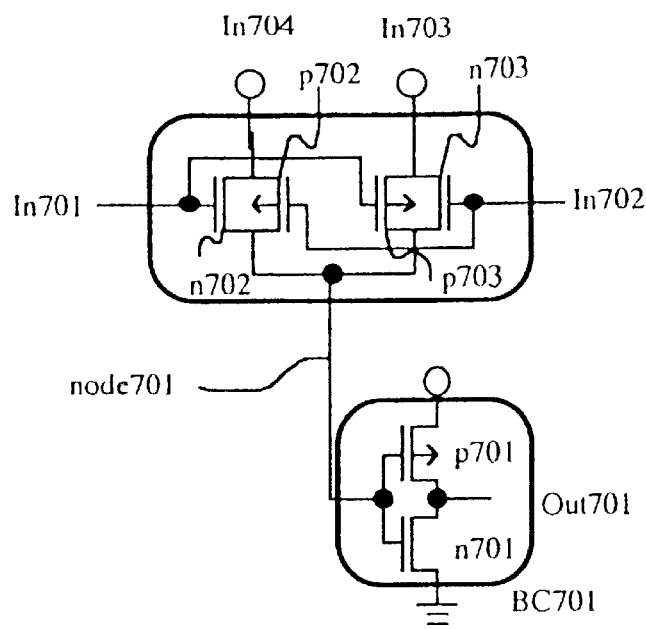
FIGS. 7a–7c are circuit diagrams of logic circuits according to one embodiment of the present invention.
Figure 7B:
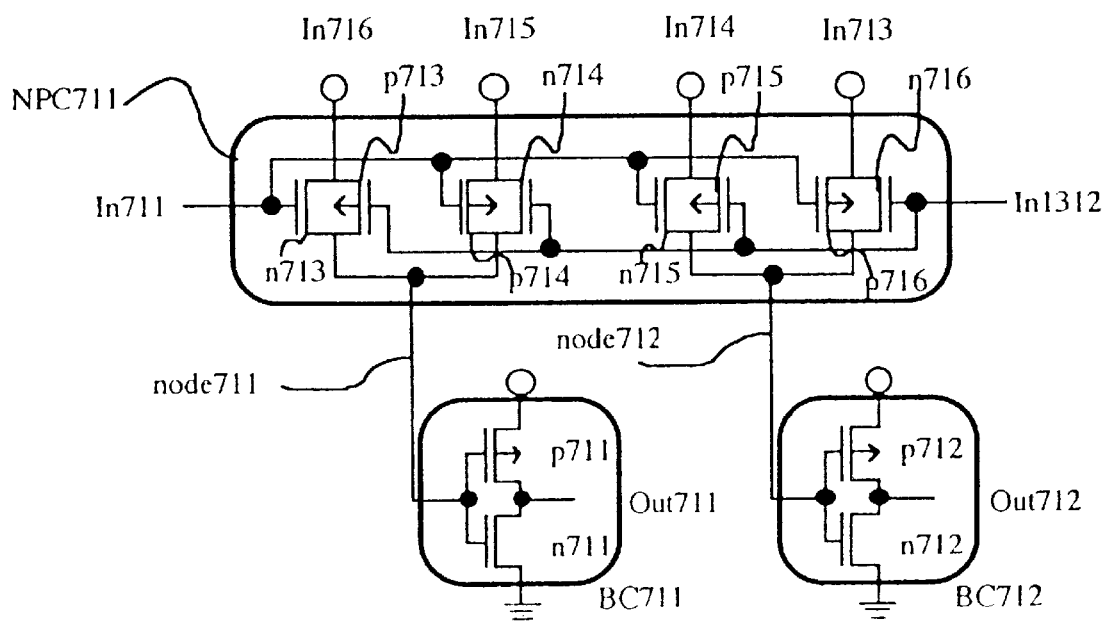
Figure 7C:
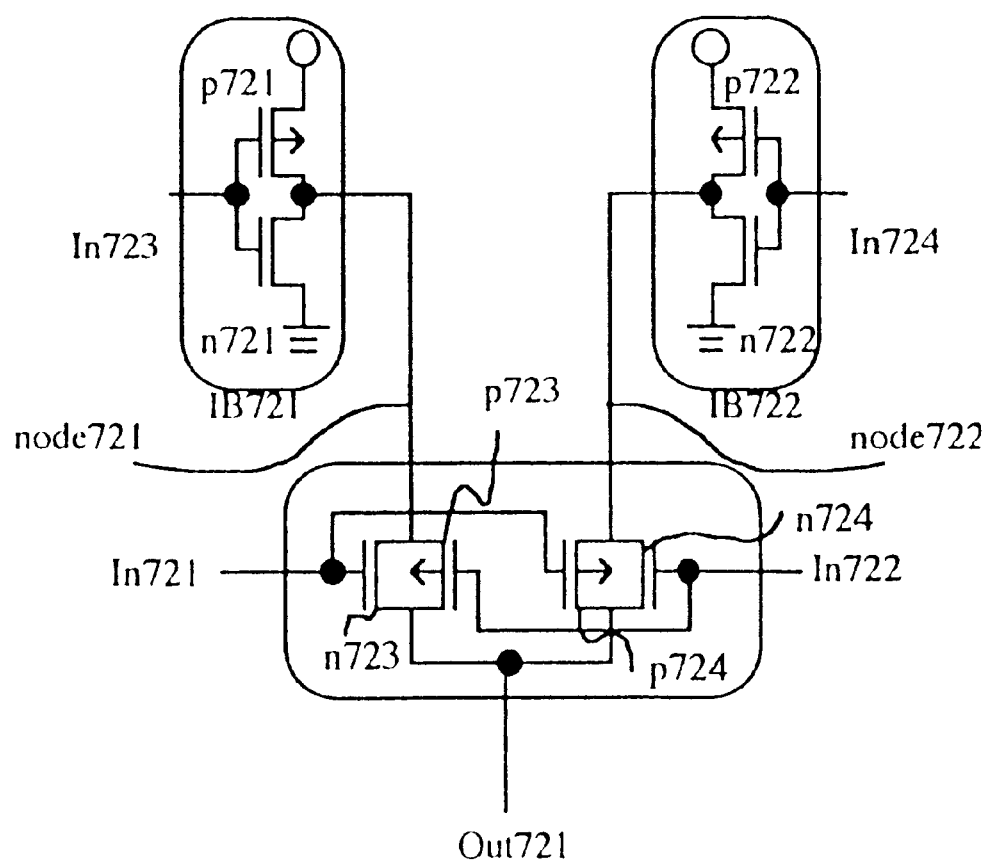

In FIGS. 7a–7c, p701–p703, n701–n703, p711–p716, n711–n716, p721–p724 and n721–n724 denote transistors, and In701–In704, In711–In716 and In721–In724 denote input signals from outside. NPC711 denotes a selector; node701–node702, node711–node712 and node721–node722 denote outputs of the selector; Out701, Out711–Out712 and Out721 denote outputs of pass-transistor logic circuits; BC711–BC712 denote output buffers; and IB721–IB722 denote input buffers.

In FIG. 8, p801–p814 and n801–n814 indicate transistors, and NPC801–NPC803 indicate selectors. In the embodiment shown in FIG. 8, the output buffers (p801, p802, n801 and n802) are arranged near the cell boundary along the direction in which the power supply line extends (in the horizontal direction in FIG. 8), so that if two or more selector circuits exist, the output buffers do not interfere with the connections between the selectors, and, therefore cells can be laid out in a small area without difficulty.

Figure 9:
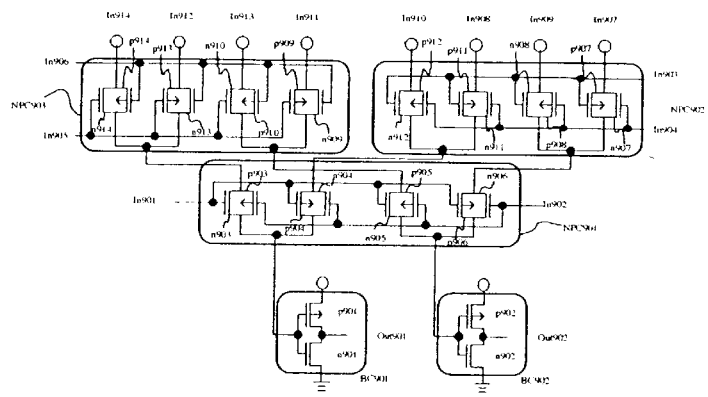
FIG. 9 is a circuit diagram of a pass-transistor logic circuit according to one embodiment of the present invention.

FIG. 9 shows an example circuitry that applies the layout of FIG. 8. When a plurality of selector circuits (NPC901, NPC902, NPC903) exist, they are arranged in the direction in which the first and second power supply lines extend. In FIG. 9, p901–p914 and n901–n914 denote transistors and In901–In914 denote input signals from outside. NPC901–NPC903 represent selectors, Out901–Out902 represent outputs of pass-transistor logic circuits, and BC901–BC902 represent output buffers. When the layout concept of FIG. 8 is applied, because the output buffers (p801, pB02, n801, n802 in FIG. 8) are arranged close to the cell boundary in the direction in which the power supply line extends (in the horizontal 15 direction in FIG. 8), if two or more selector circuits exist as described above, the output buffers do not interfere with the connections between the selectors, and, therefore, cells can be laid out in a small area without difficulty.

Figure 10:
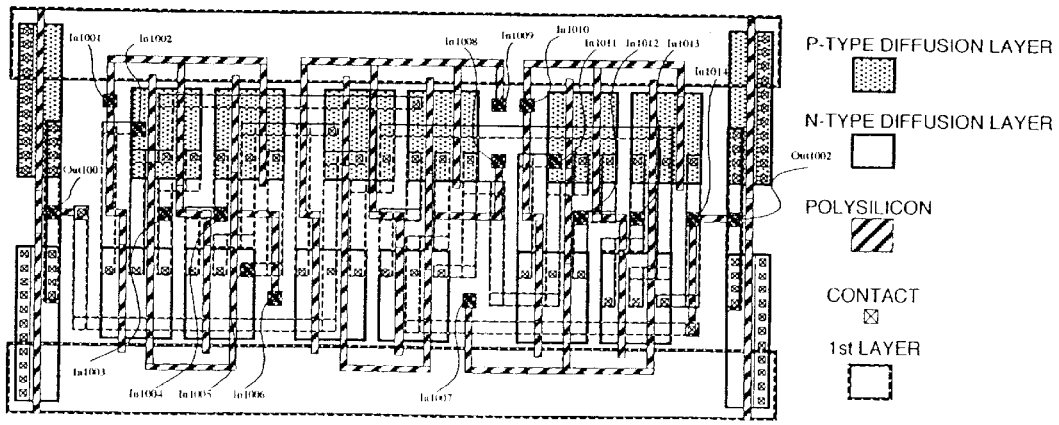
FIG. 10 is a layout diagram of a pass-transistor logic circuit according to one embodiment of the present invention.

In FIG. 10, In1001–In1014 denote input signals from outside, and Out1001–Out1002 denote outputs of pass-transistor logic circuits.

Figure 11:
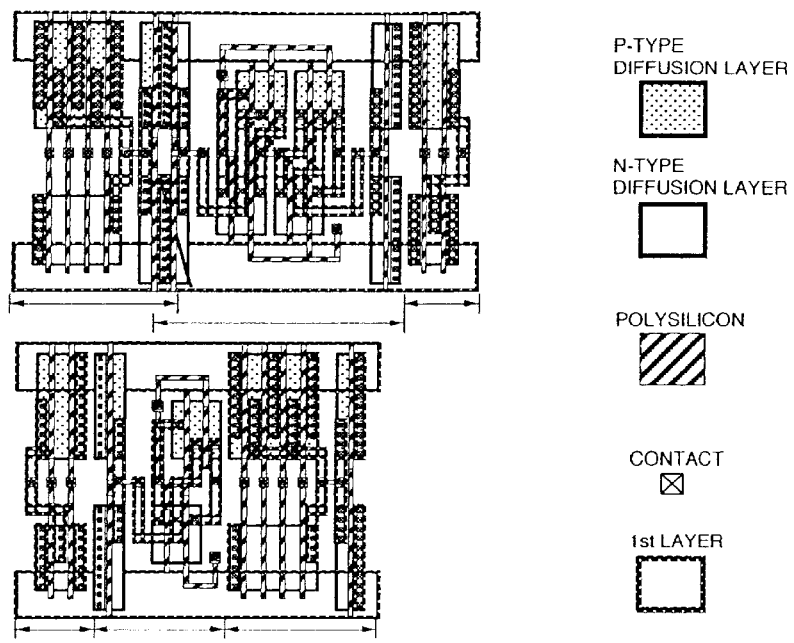
FIG. 11 is an array configuration of a pass-transistor logic circuit according to one embodiment of the 15 present invention.
Figure 12:
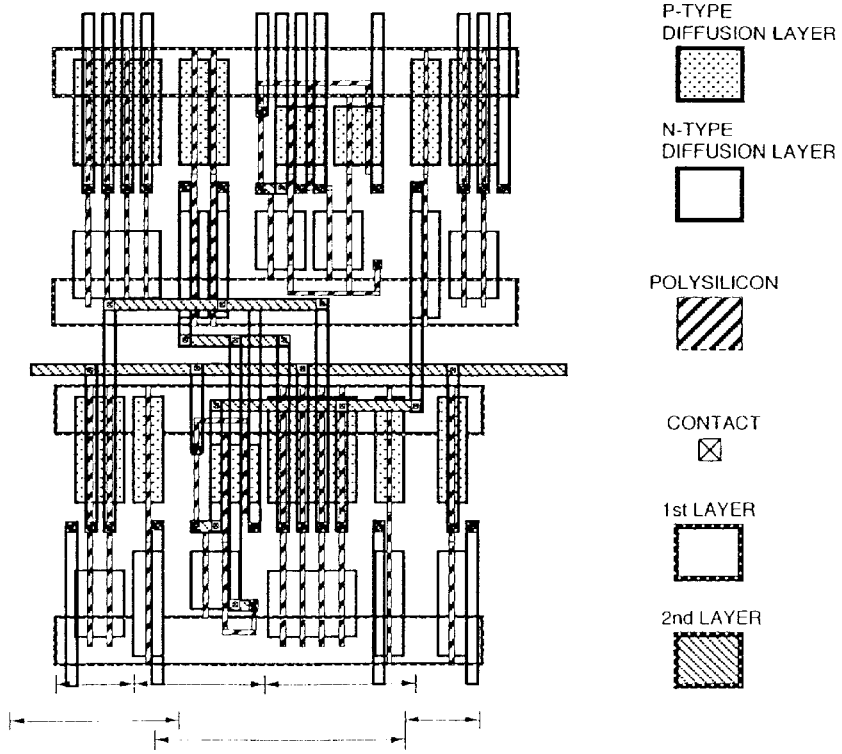
FIG. 12 is an array configuration of a pass-transistor logic circuit according to one embodiment of the present invention.

FIGS. 11 and 12 show example layouts applying the present invention, in which the pass-transistor logic circuits and CMOS,s are mixed together. It is seen in the figures that the cells can be arranged with minimum intervals, whatever the adjoining cells. When a transistor at the cell end adjoining another cell connects to the power supply line, and if a transistor at the end of the adjoining cell similarly connects to the power supply line, their diffusion layers can be shared, further reducing the chip area.

Figure 13A:
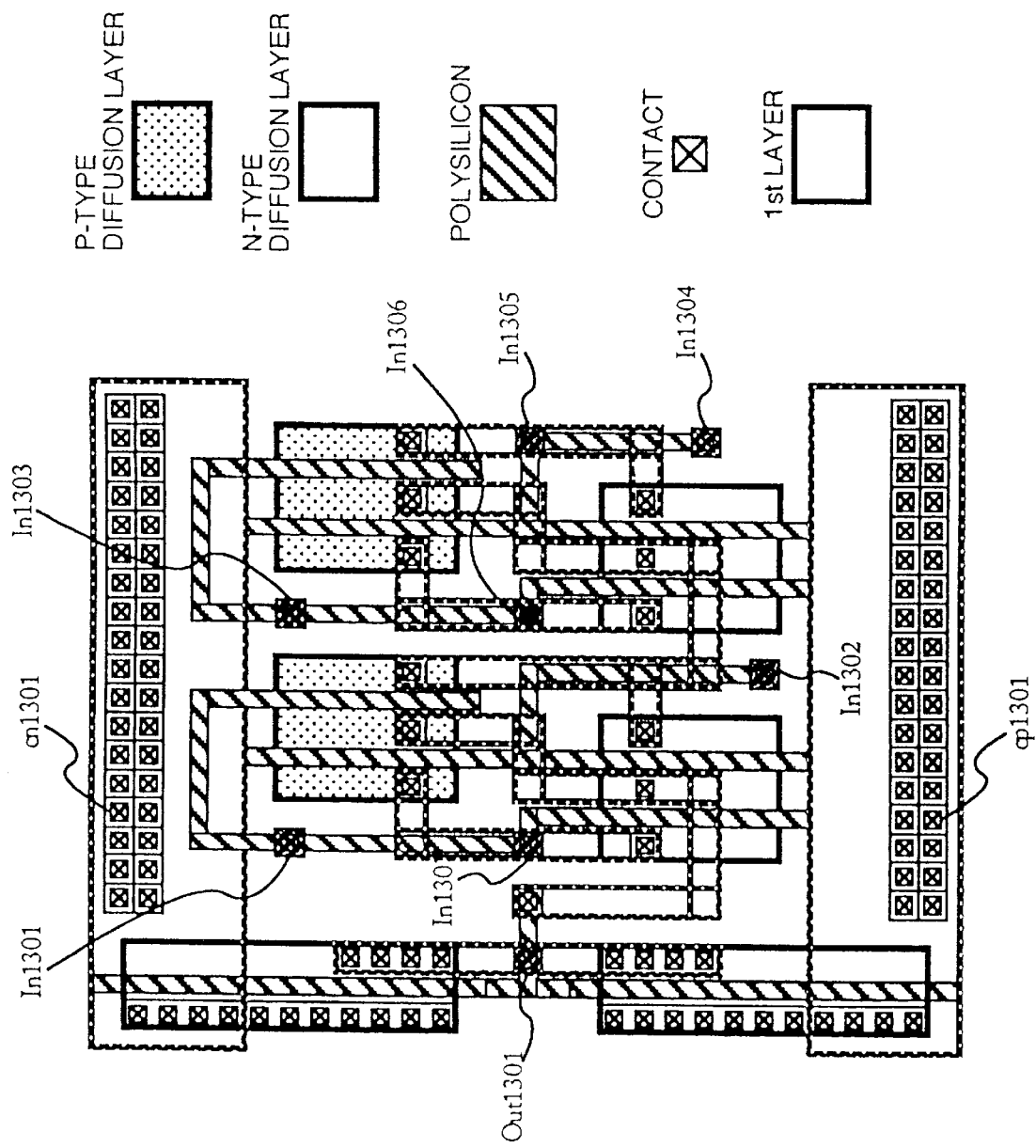
Figure 13B:
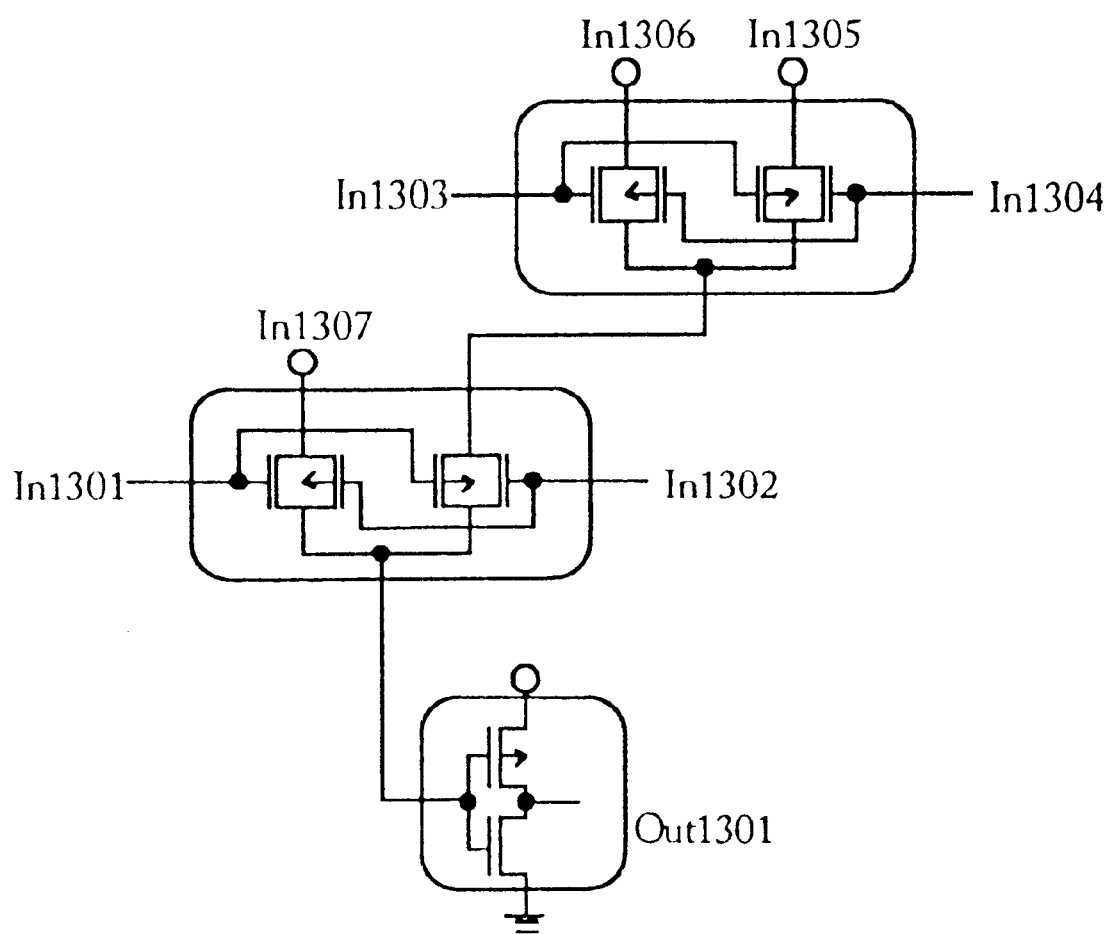

FIGS. 13a–13b show a circuit constructed by using the present invention. FIGS. 13a–13b are, respectively, a layout diagram (13a) and a circuit diagram (13b) using two selector circuits. The output of one selector circuit connects to the drain input of the other selector circuit. In this case, as well, the use of this invention can provide a layout with no dead space. In FIG. 13, In1301–In1307 represent input signals from outside, Out1301 represents an output of a pass-transistor logic circuit, cp1301 represents a base bias contact, and cn1301 represents a well bias contact.

Figure 14B:
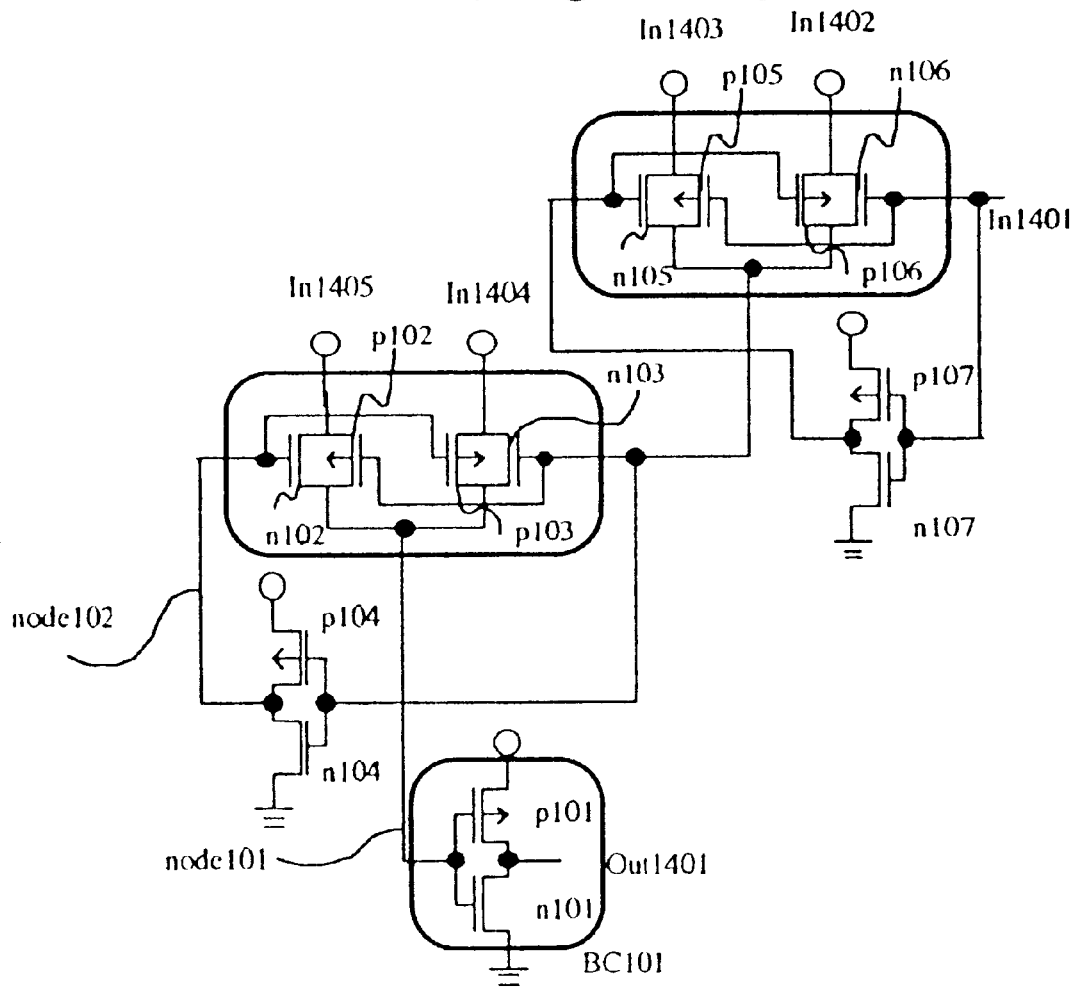

FIGS. 14a–14b show a circuit using the present invention. FIGS. 14a and 14b are, respectively, a layout diagram (14a) and a circuit diagram (14b) in which two selector circuits are used. The output of one selector circuit connects to the input gate of the other selector circuit to generate an inverted signal of the gate of the selector by an internal inverter. In this case, as well, the use of the present invention can generate a layout with no dead space. In FIGS. 14a–14b, In1401–In1405 indicate input signals from outside, Out1401 indicates an output of a pass-transistor logic circuit, cp1401 indicates a base bias contact, and cn1401 indicates a well bias contact.

Figure 15A:
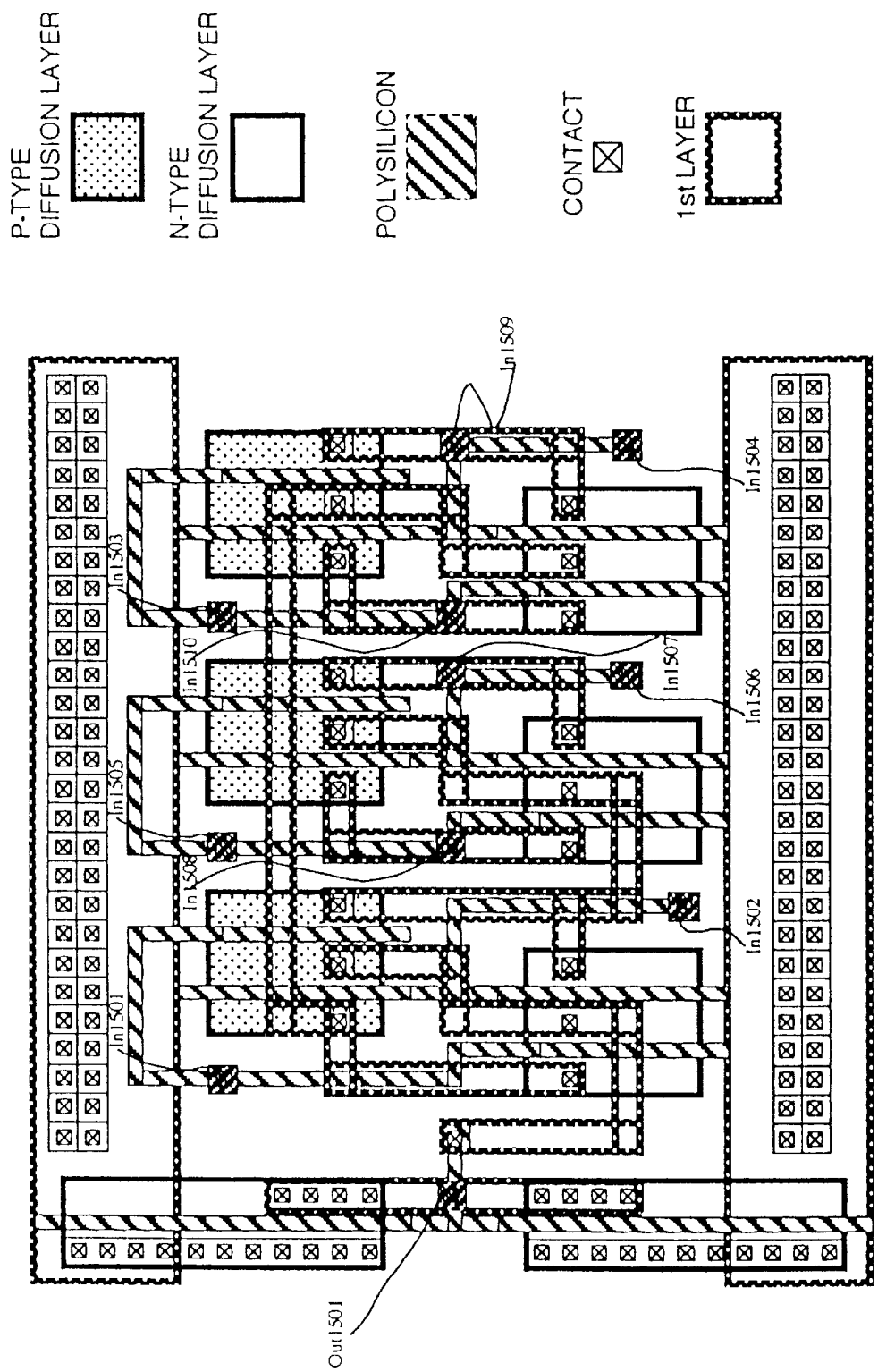
Figure 15B:
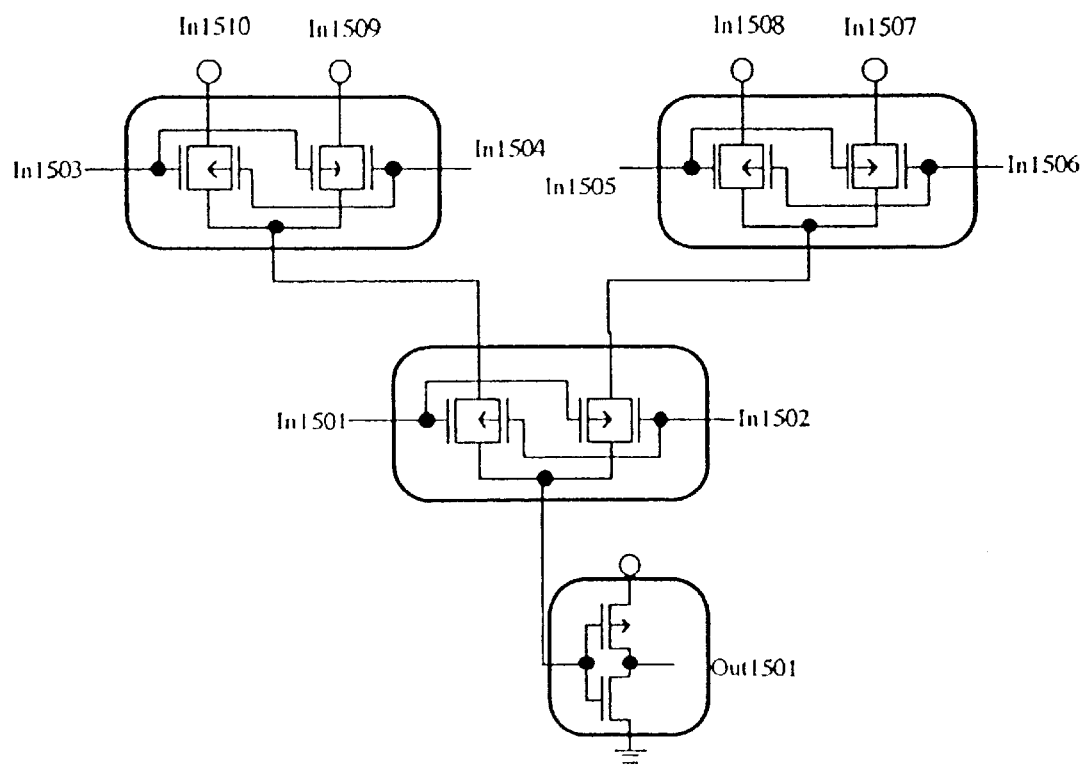

FIGS. 15a–15b show a circuit using the present invention. FIGS. 15a and 15b are, respectively, a layout diagram (15a) and a circuit diagram (15b) in which three selector circuits are used. The outputs of selectors near the inputs of another selector connect to drain inputs of the other selector which are close to the corresponding outputs. In this case, as well, the use of the present invention can generate a layout with no dead space. In FIGS. 15a–15b, In1501–In1510 denote input signals from outside, Out1501 denotes an output of a pass-transistor logic circuit, cp1501 denotes a base bias contact, and cn1501 denotes a well bias contact.

Figure 16A:
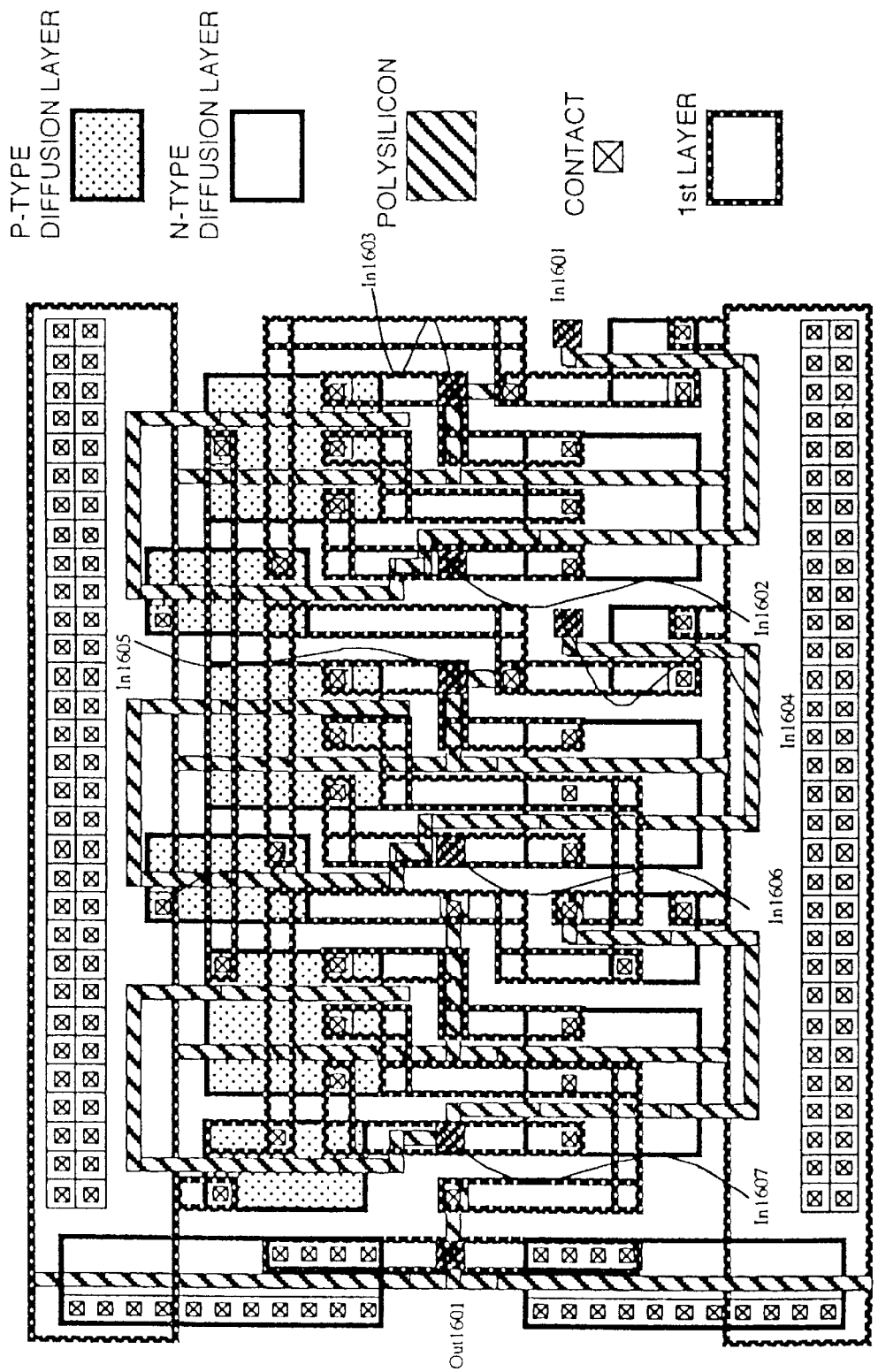
Figure 16B:
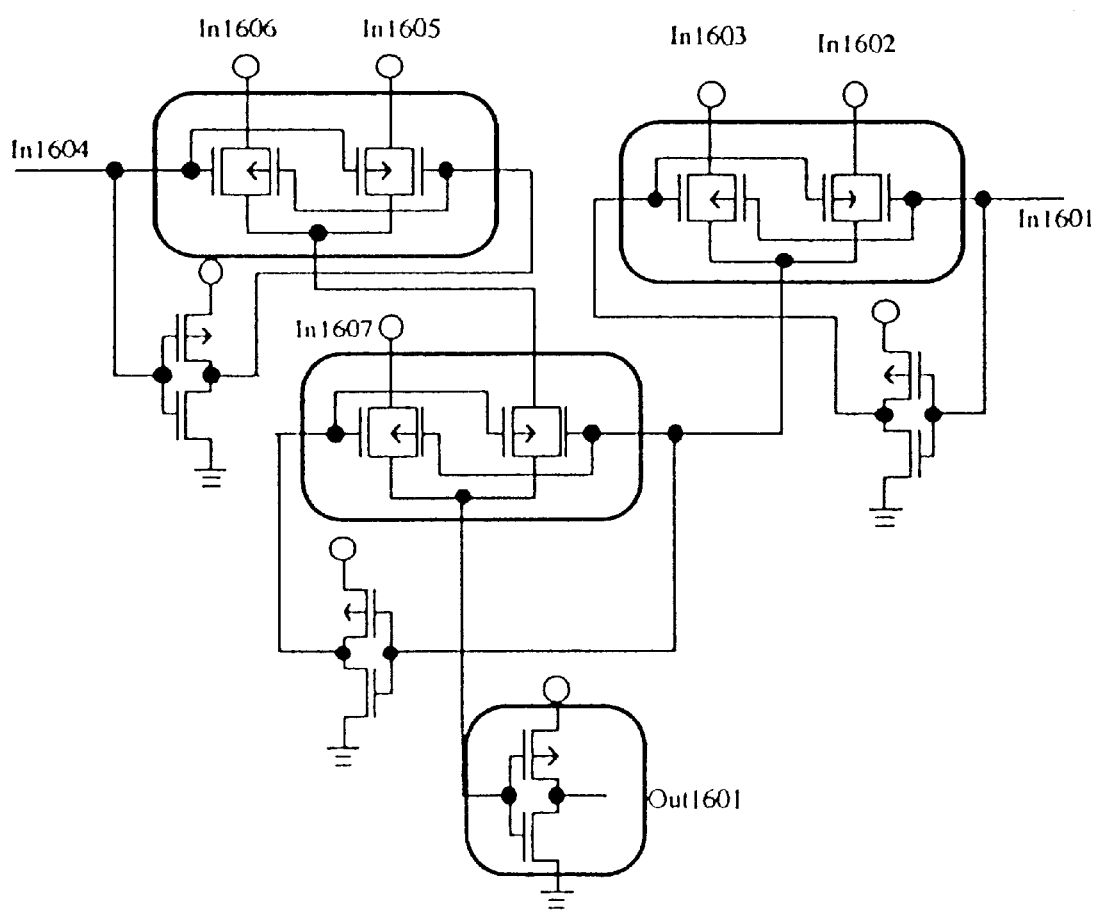

FIGS. 16a–16b show a circuit using the present invention. FIGS. 16a and 16b are, respectively, a layout diagram (16a) and a circuit diagram (16b) in which three selector circuits are used, and the inverted signal of the gate of the selector is generated by an internal inverter. The outputs of selectors near the inputs of another selector, connect to a drain input add a gate input of the other selector which are close to the corresponding outputs. In this case, as well, the use of the present invention can produce a layout with no dead space. In FIGS. 16a–16b, In1601–In1607 denote input signals from outside, Out1601 denotes an output of a pass-transistor logic circuit, cp1601 denotes a base bias contact, and cn1601 denotes a well bias contact.

Figure 17A:
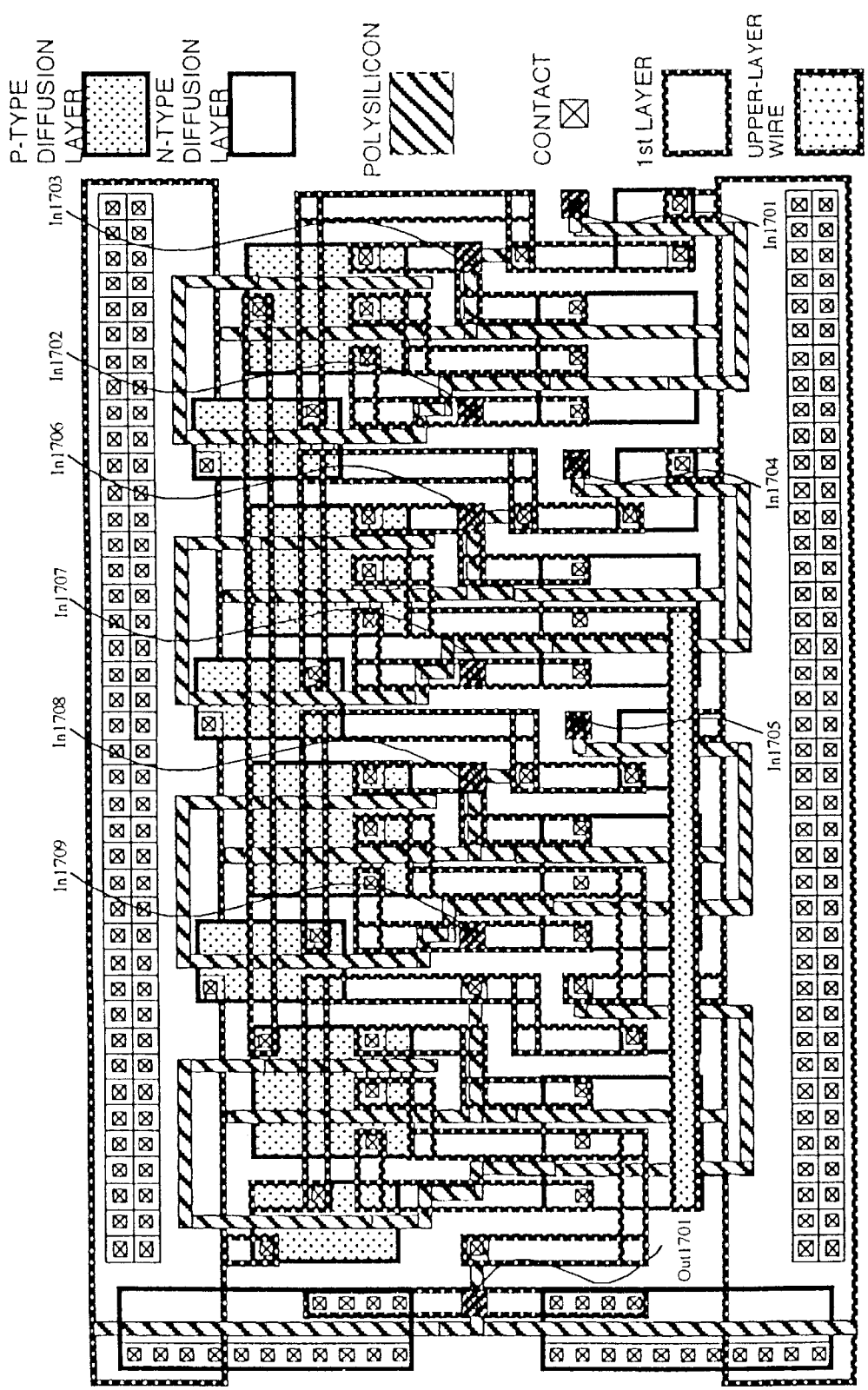
Figure 17B:
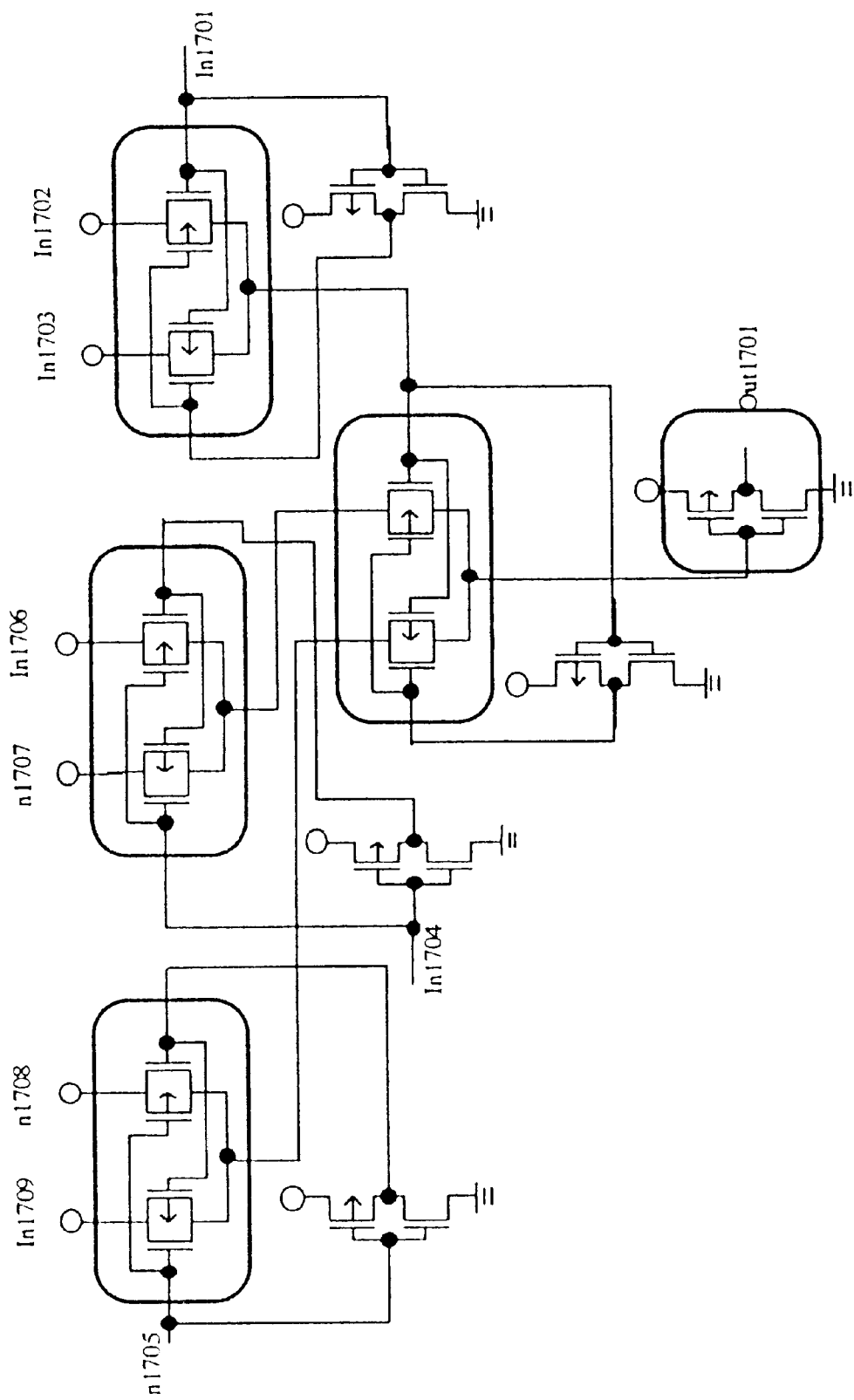

FIGS. 17a–17b show a circuit using the present invention. FIGS. 17a and 17b are, respectively, a layout diagram (17a)

and a circuit diagram (17b) in which four selector circuits are used, and the inverted signal of the gate of the selector is generated by an internal inverter. The outputs of selectors near the inputs of another selector, connect to drain inputs and a gate input of the other selector which are close to the corresponding outputs. In this case, as well, the use of the present invention can produce a layout with no dead space. In FIGS. 17a–17b, In1701–In1709 denote input signals from outside, Out1701 denotes an output of a pass-transistor logic circuit, cp1701 denotes a base bias contact, and cn1701 denotes a well bias contact.

Figure 18A:
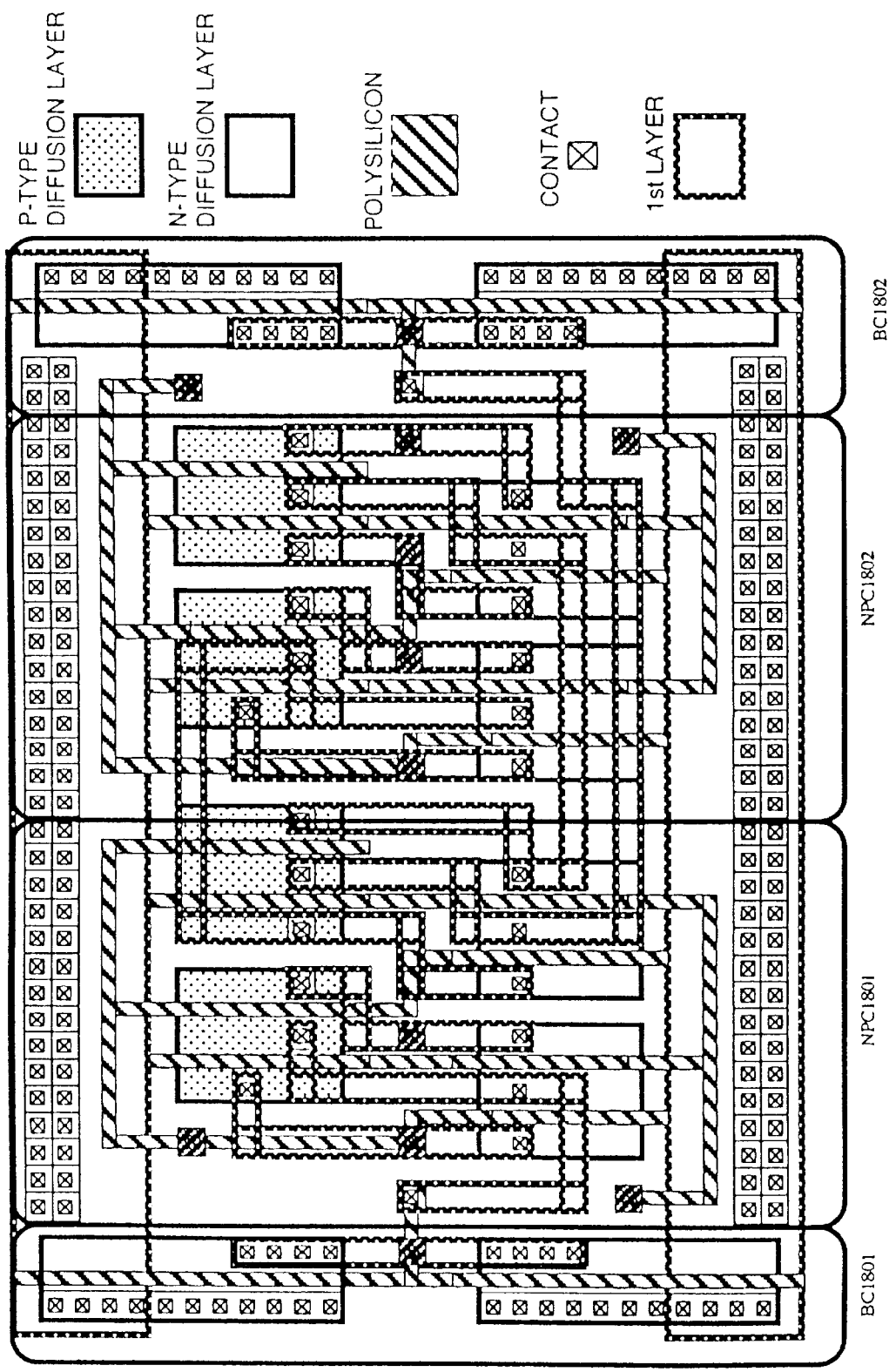
Figure 18B:
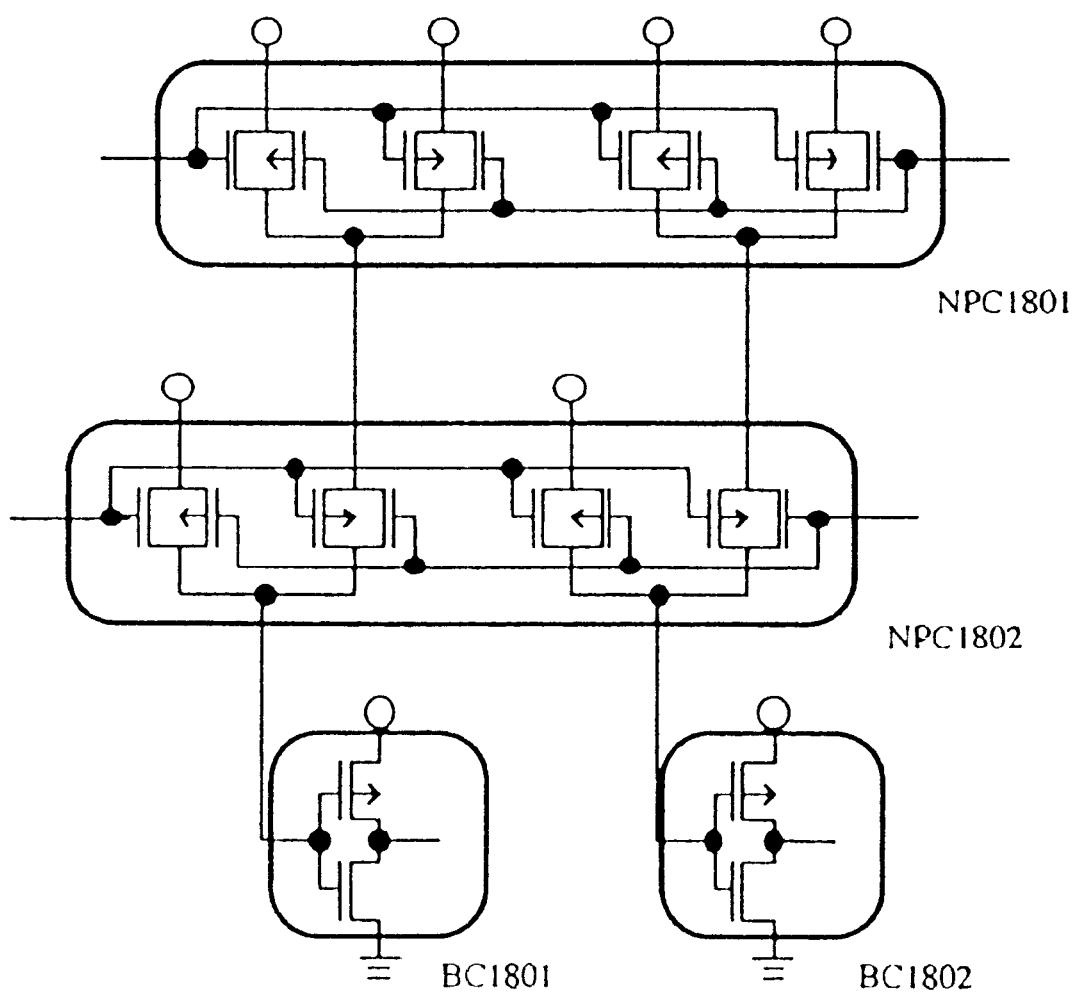

FIGS. 18a–18b show a circuit using the present invention. FIGS. 18a and 18b are, respectively, a layout diagram (18a) and a circuit diagram (18b) in which when four selector circuits are used. The outputs of one selector connect to the drain inputs of the other selector. In this case, as well, the use of the present invention can produce a layout with no dead space. In FIGS. 18a–18b, NPC1801–NPC1802 denote selectors, BC1801–BC1802 denote output buffers, cp1801 denotes a base bias contact, and cn1801 denotes a well bias contact.

Figure 19B:
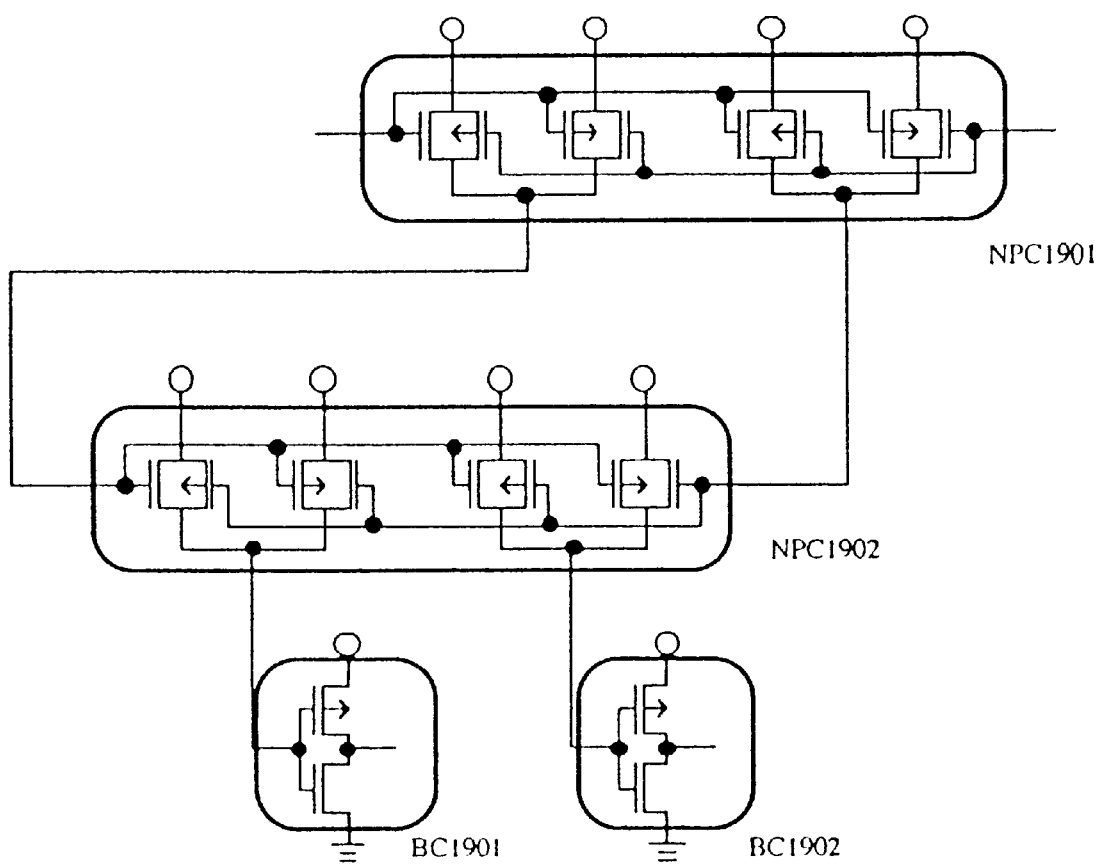

FIGS. 19a–19b show a circuit using the present invention. FIGS. 19a and 19b are, respectively, a layout diagram (19a) and a circuit diagram (19b) in which four selector circuits are used. The outputs of one selector connects to the gate inputs of the other selector. In this case, as well, the use of the present invention can produce a layout with no dead space. In FIGS. 19a–19b, NPC1901–NPC1902 denote selectors, BC1901–BC1902 denote output buffers, cp1901 denotes a base bias contact, and cn1901 denotes a well bias contact.

Figure 20B:
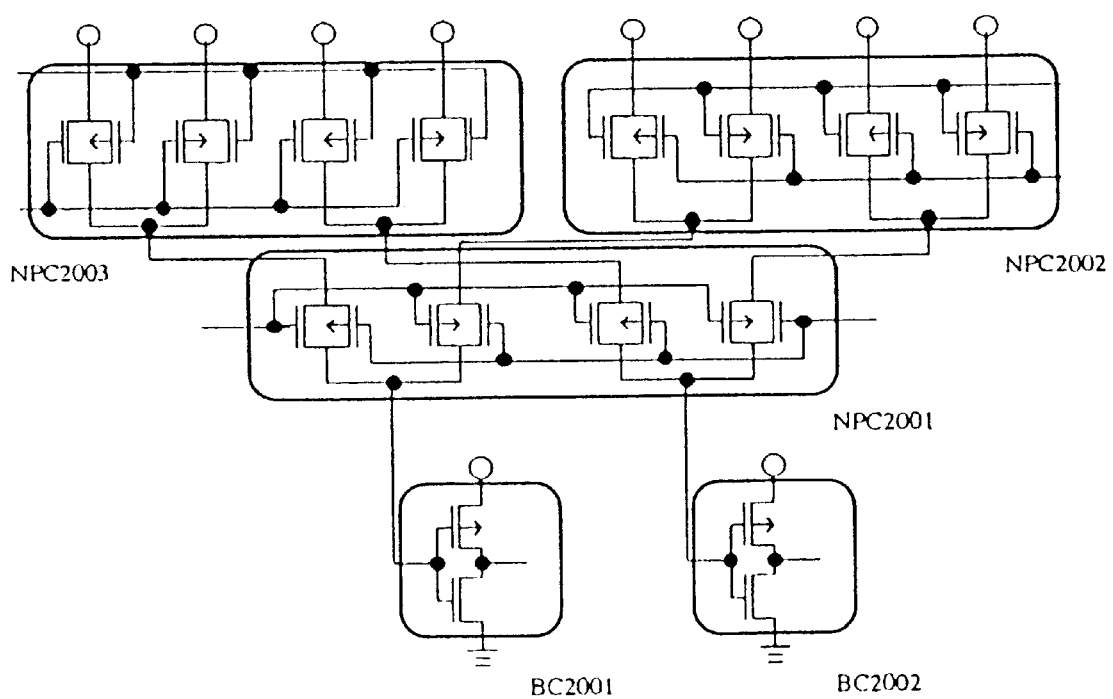

FIGS. 20a–20b show a circuit using the present invention. FIGS. 20a and 20b are, respectively, a layout diagram (20a) and a circuit diagram (20b) in which six selector circuits are used. The outputs of selectors near the inputs of another selector connect to drain inputs of the other selector, which are close to the corresponding outputs. In this case, as well, the use of the present invention can produce a layout with no dead space. In FIGS. 20a–20b, NPC2001–NPC2003 denote selectors, BC2001–BC2002 denote output buffers, cp2001 denotes a base bias contact, and cn2001 denotes a well bias contact.

Figure 21A:
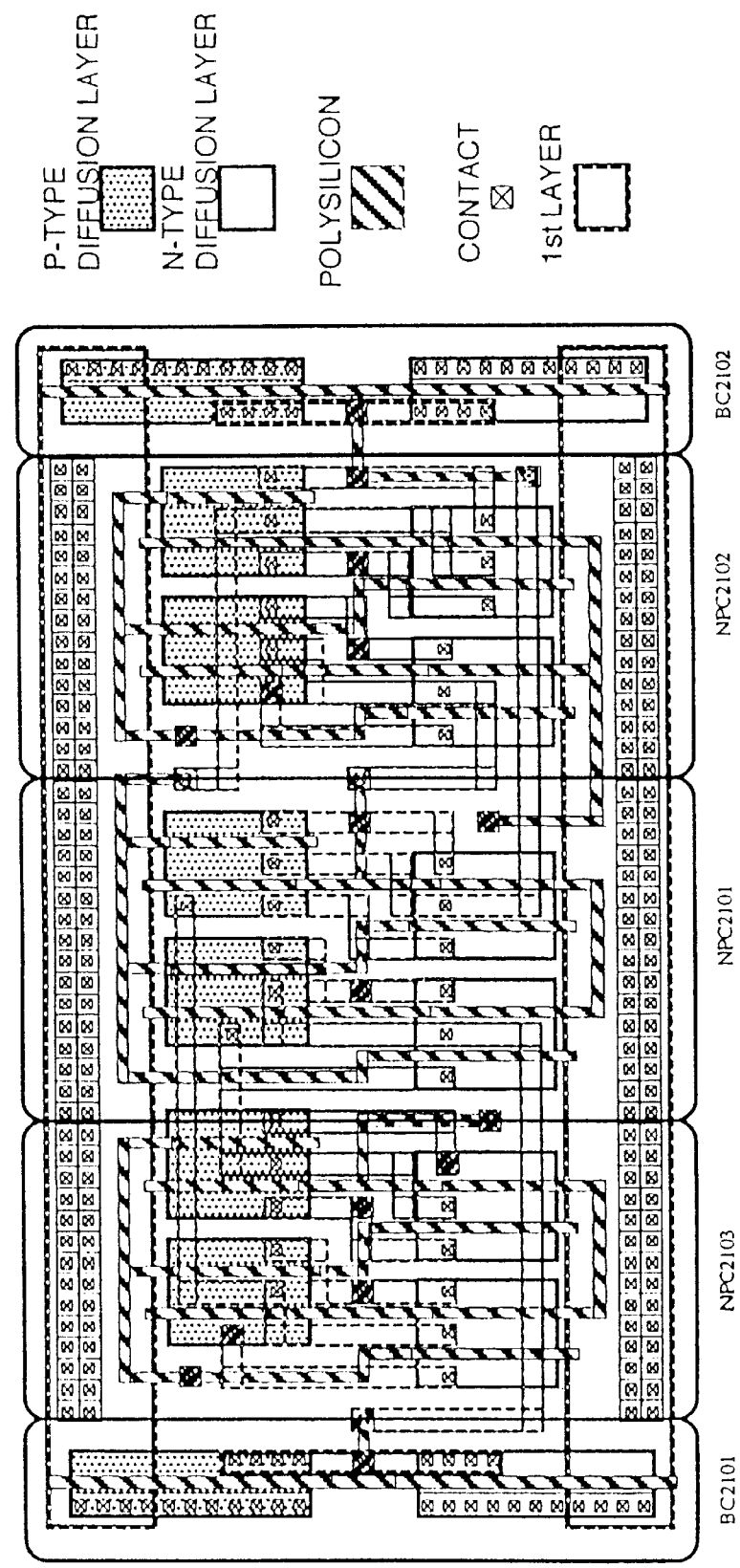
Figure 21B:
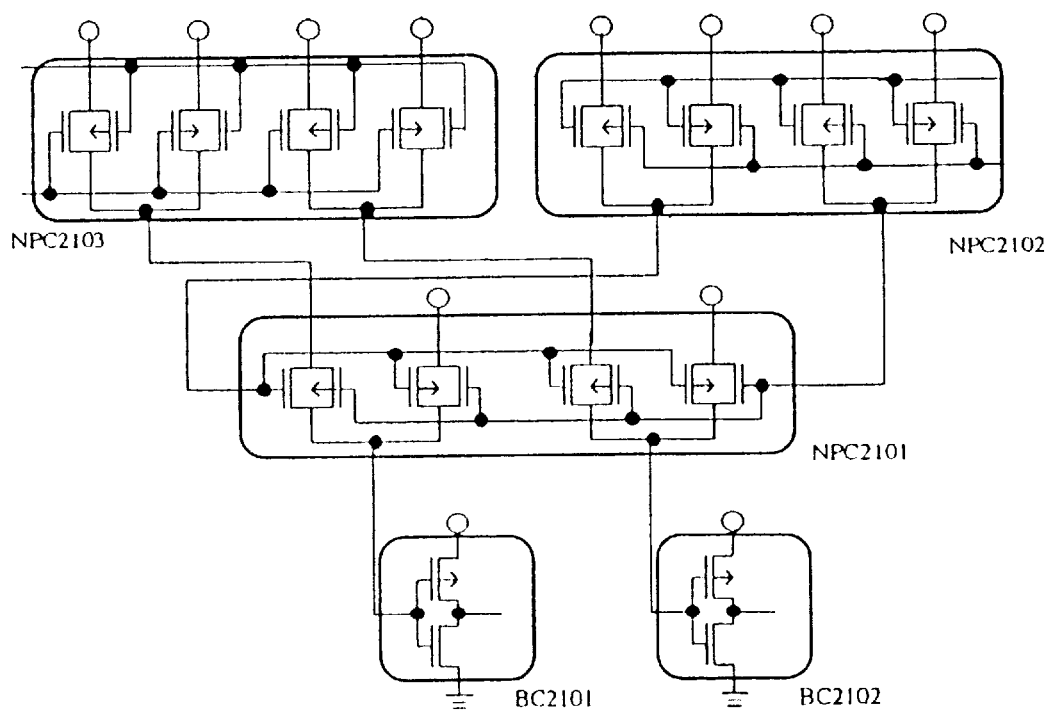

FIGS. 21a–21b show a circuit using the present invention. FIGS. 21a and 21b are, respectively, a layout diagram (21a) and a circuit diagram (21b) in which six selector circuits are used. The outputs of selectors near the inputs of another selector connect to drain inputs and gate inputs of the other selector, which are close to the corresponding outputs. In this case, as well, the use of the present invention can produce a layout with no dead space. In FIGS. 21a–21b, NPC2101–NPC2103 denote selectors, BC2101–BC2102 denote output buffers, cp2101 denotes a base bias contact, and cn2101 denotes a well bias contact.

Figure 22A:
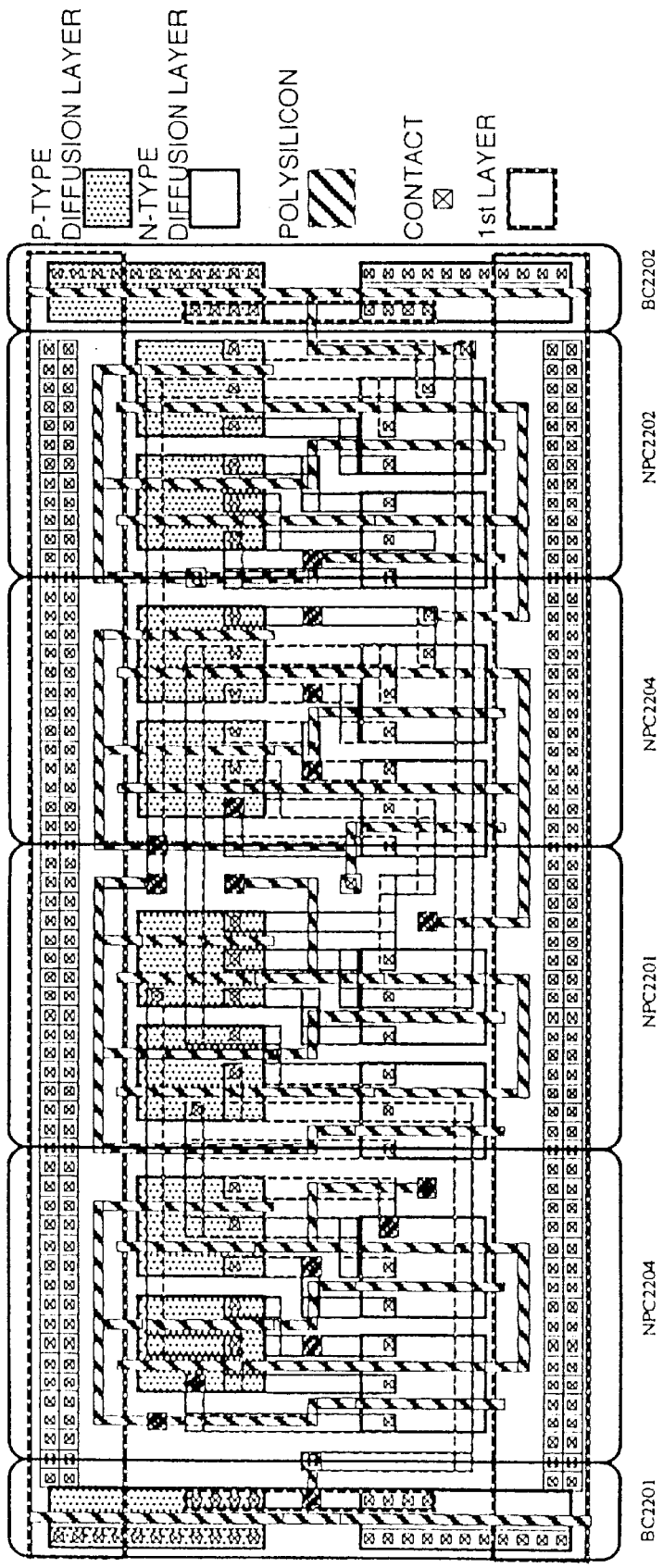
Figure 22B:
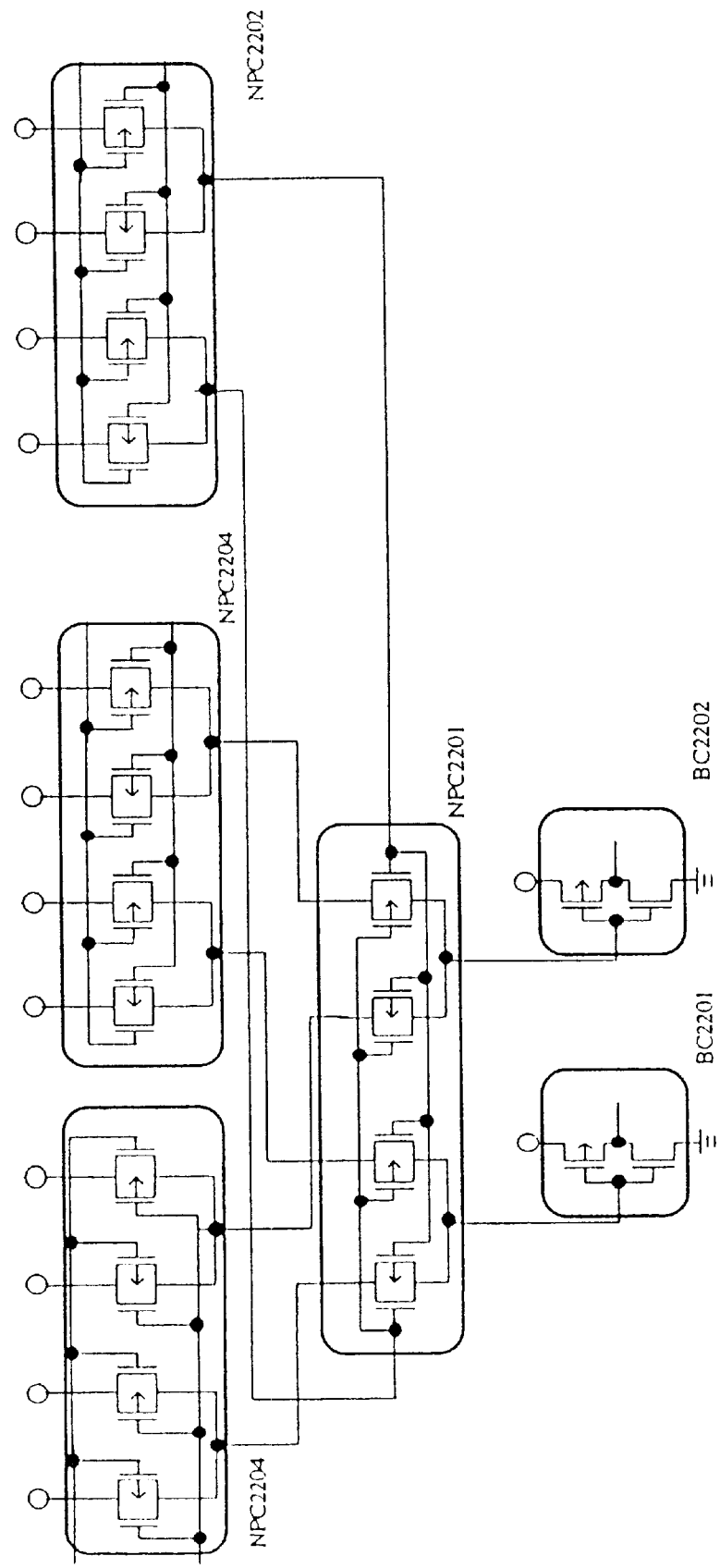

FIGS. 22a–22b show a circuit using the present invention. FIGS. 22a and 22b are, respectively, a layout diagram (22a) and a circuit diagram (22b) in which eight selector circuits are used. The outputs of selectors near the inputs of another selector connect to drain inputs and gate inputs of the other selector, which are close to the corresponding outputs. In this case, as well, the use of the present invention can produce a layout with no dead space. In FIGS. 22a–22b, NPC2201–NPC2204 denote selectors, BC2201–BC2202 denote output buffers, cp2201 denotes a base bias contact, and cn2201 denotes a well bias contact.

Figure 23A:
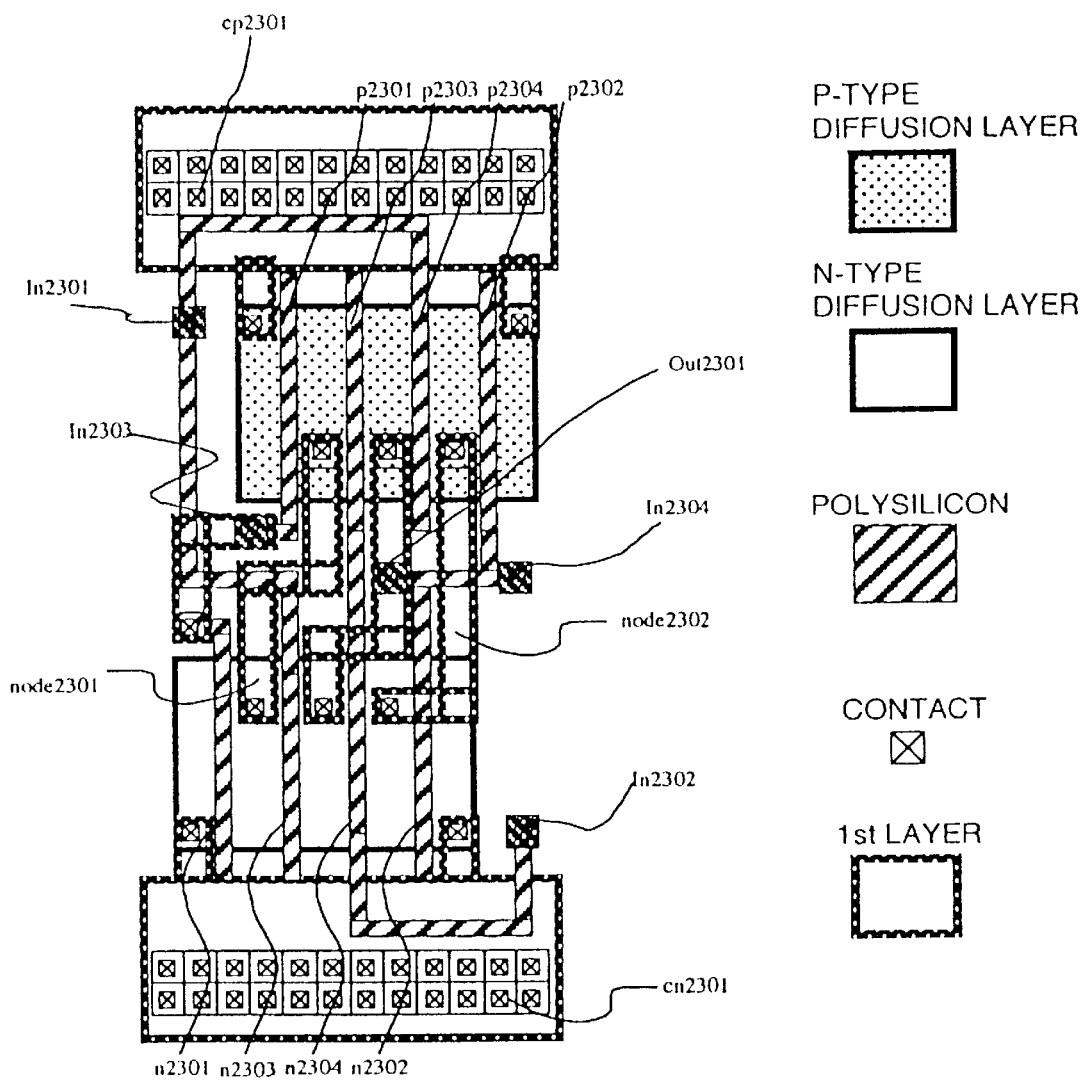
Figure 23B:
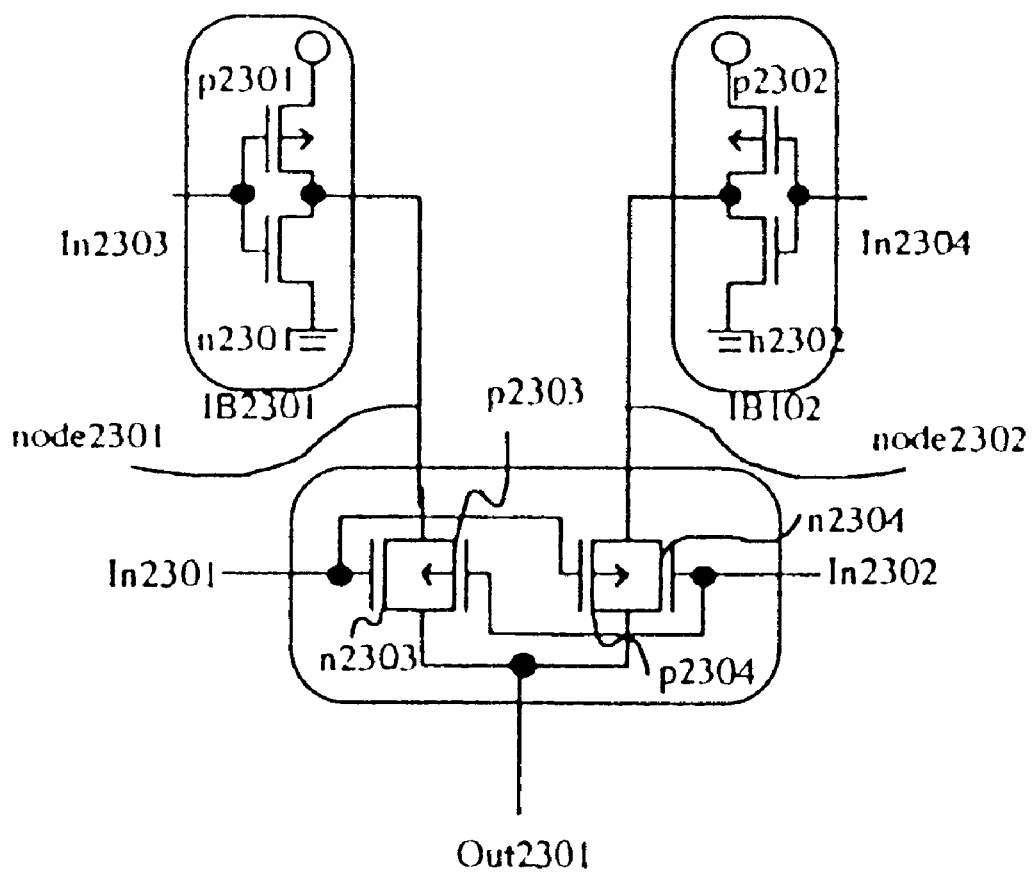

FIGS. 23a–23b show a circuit using the present invention. FIGS. 23a and 23b are, respectively, a layout diagram (23a) and a circuit diagram (23b) showing a selector circuit having signal amplifying devices at its inputs. This circuit reduces an input capacitance of the drain and the use of the present invention results in a layout with no dead space. In FIGS. 23a–23b, p2301–p2304 and n2301–n2304 denote transistors, and In2301–In2304 denote input signals from outside. IB2301–IB2302 are input buffers, node2301–node2302 are outputs of the input buffers, Out2301 is an output of a pass-transistor logic circuit, cp2301 is a base bias contact, and cn2301 is a well supply contact.

Figure 24A:
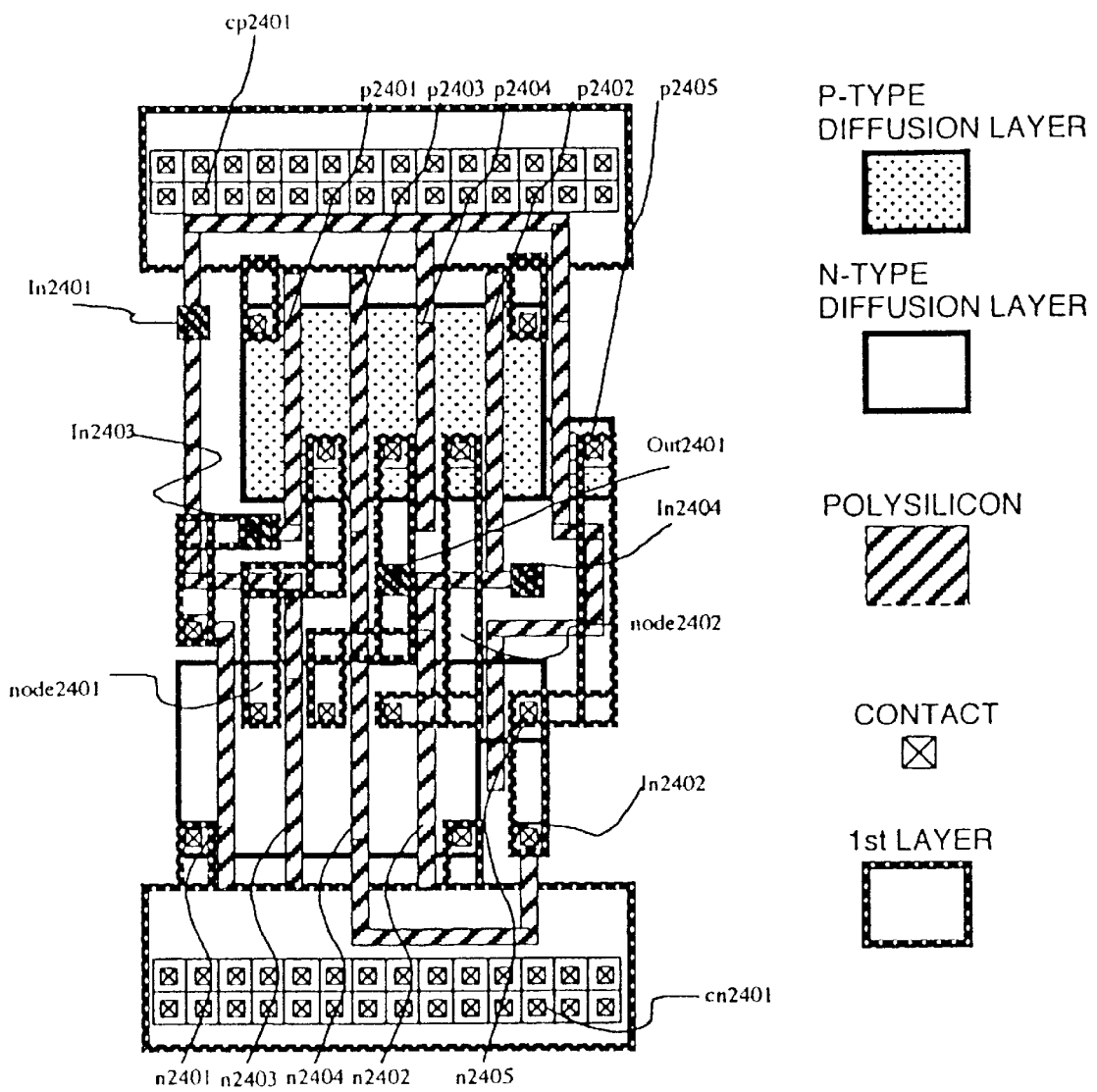
Figure 24B:
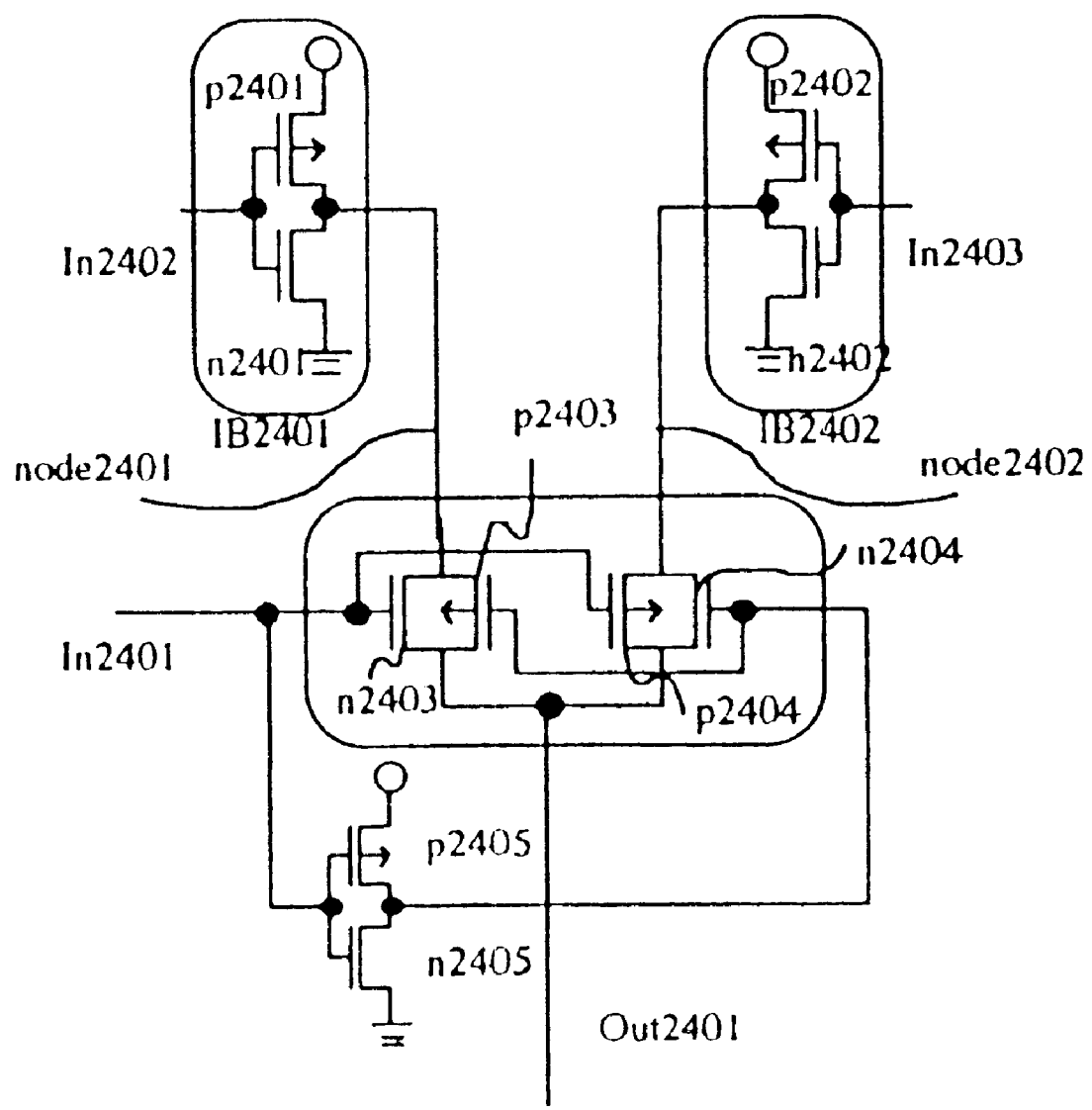

FIGS. 24a–24b show a circuit using the present invention. FIGS. 24a and 24b are, respectively, a layout diagram (24a) and a circuit diagram (24b) showing a selector circuit which has signal amplifying devices at its inputs, and in which there is one selector and an inverted signal of the gate of the selector, is generated by an internal inverter. This circuit reduces an input capacitance of the drain and the use of the present invention results in a layout with no dead space. In FIGS. 24a–24b, p2401–p2405 and n2401–n2405 denote transistors, and In2401–In2403 denote input signals from outside. IB2401–IB2402 are input buffers, node2401–node2402 are outputs of the input buffers, Out2401 is an output of a pass-transistor logic circuit, cp2401 is a base bias contact, and cn2401 is a well supply contact.

Figure 25A:
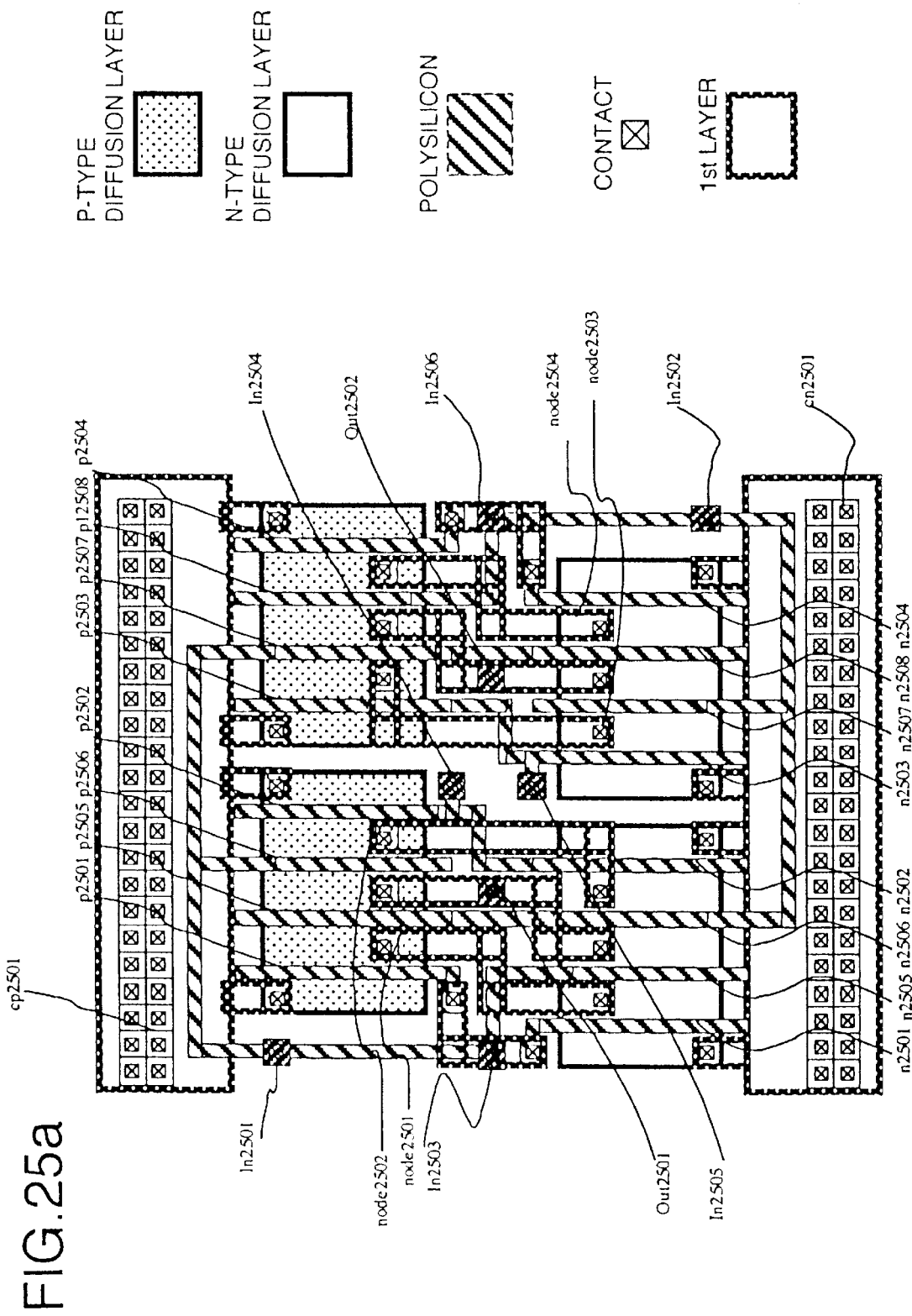
Figure 25B:
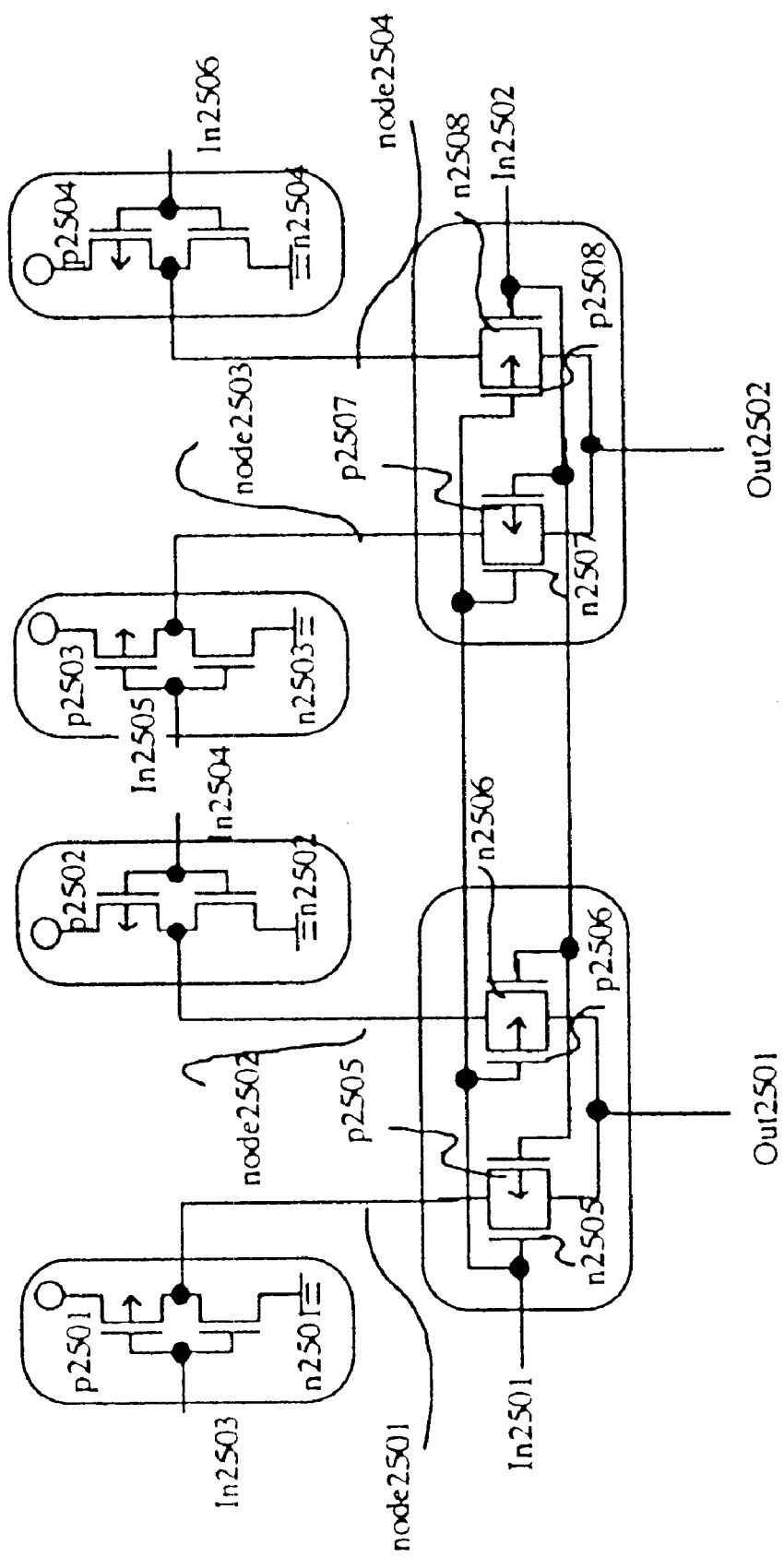

FIGS. 25a–25b show a circuit using the present invention. FIGS. 25a and 25b are, respectively, a layout diagram (25a) and a circuit diagram (25b) showing a selector circuit which has signal amplifying devices at its inputs and in which there are two selectors. This circuit reduces an input capacitance of the drain and the application of the present invention can produce a layout with no dead space by sharing the diffusion layers. In FIGS. 25a–25b, p2501–p2508 and n2501–n2508 denote transistors, and In2501–In2506 denote input signals from outside. IB2501–IB2504 are input buffers, Out2501–Out2502 are outputs of pass-transistor logic circuits, cp2501 is a base bias contact, and cn2501 is a well supply contact.

Figure 26A:
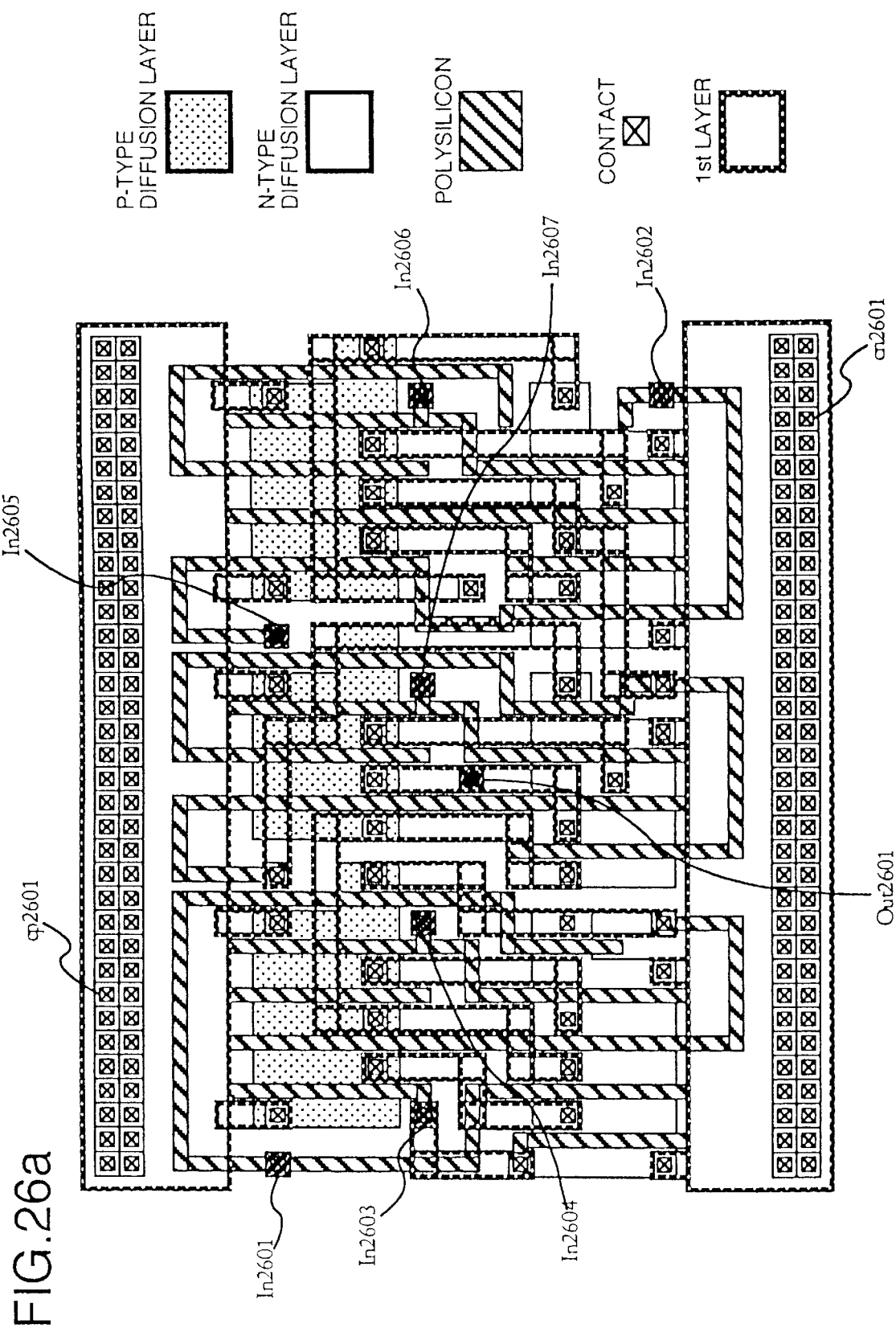
Figure 26B:
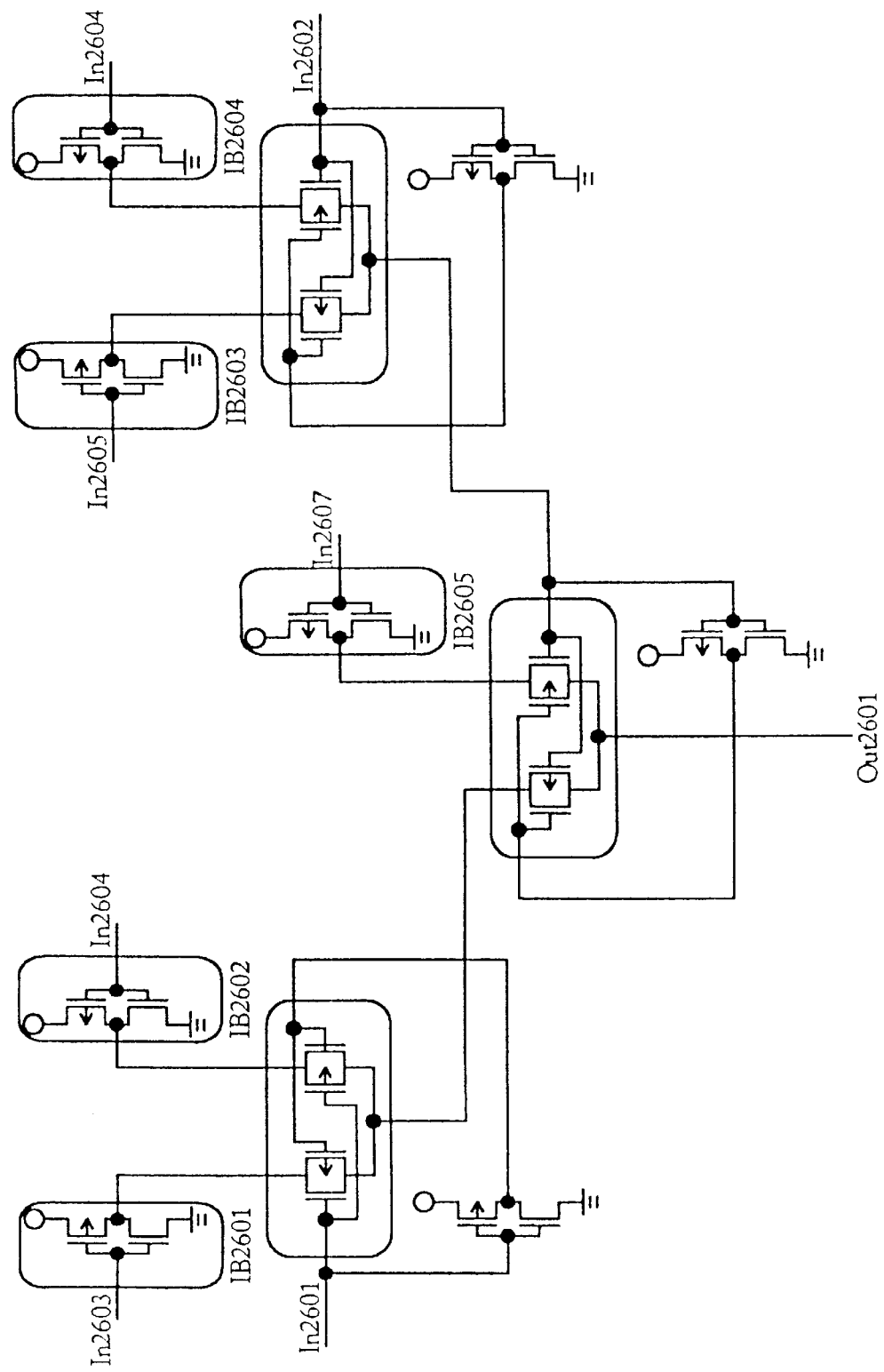

FIGS. 26a–26b show a circuit using the present invention. FIGS. 26a and 26b are, respectively, a layout diagram (26a) and a circuit diagram (26b) showing a selector circuit which has signal amplifying devices at its inputs and in which there are three selectors, and an inverted signal of the gate of each selector is generated by an internal inverter. This circuit reduces an input capacitance of the drain, and the application of the present invention can produce a layout with no dead space by sharing the diffusion layers.

In FIGS. 26a–26b, p2601–p2611 and n2601–n2611 denote transistors, and In2601–In2607 denote input signals from outside. IB2601–IB2605 are input buffers, Out2601 is an output of a pass-transistor logic circuit, cp2601 a base bias contact, and cn2601 a well supply contact.

Figure 27A:
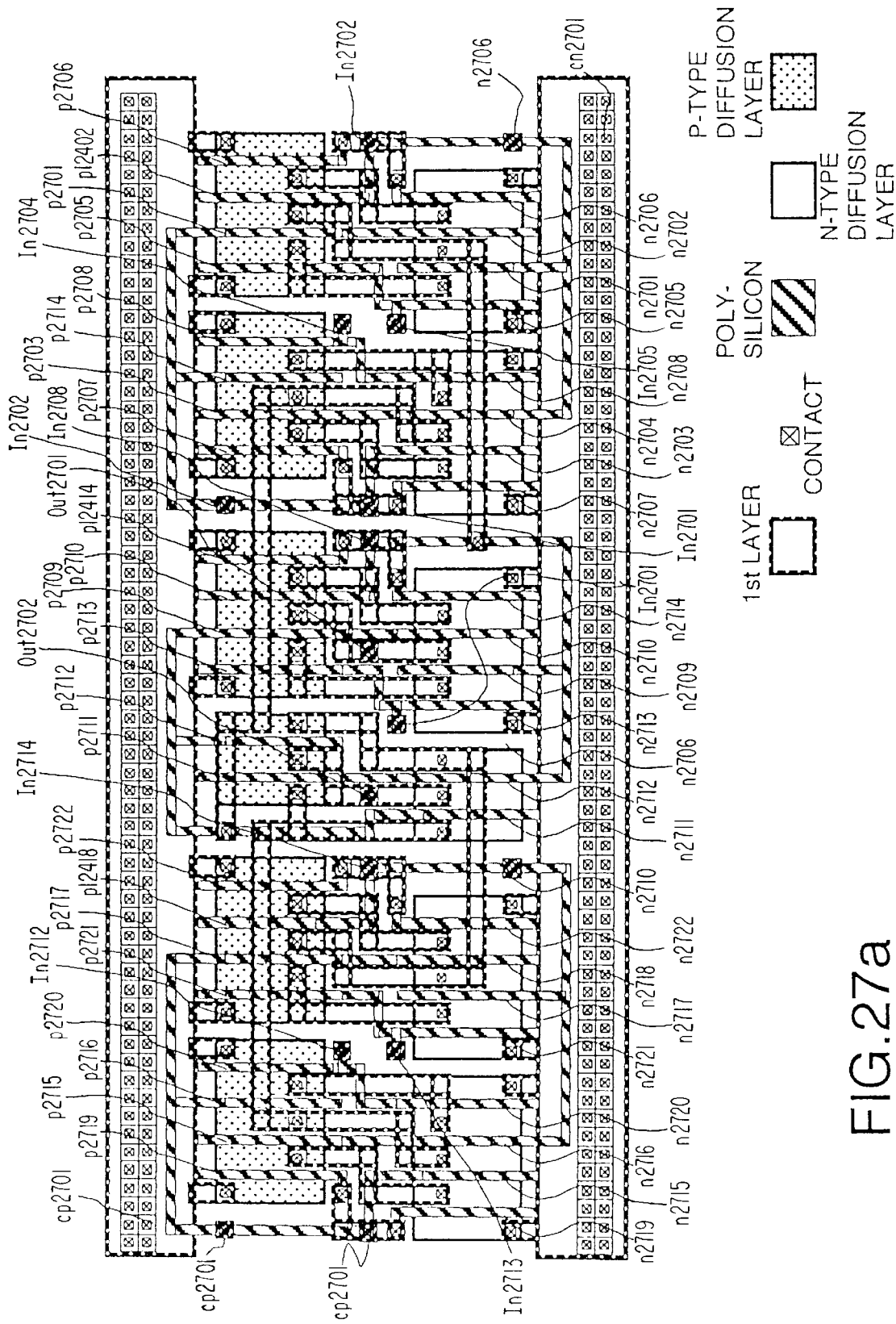
Figure 27B:
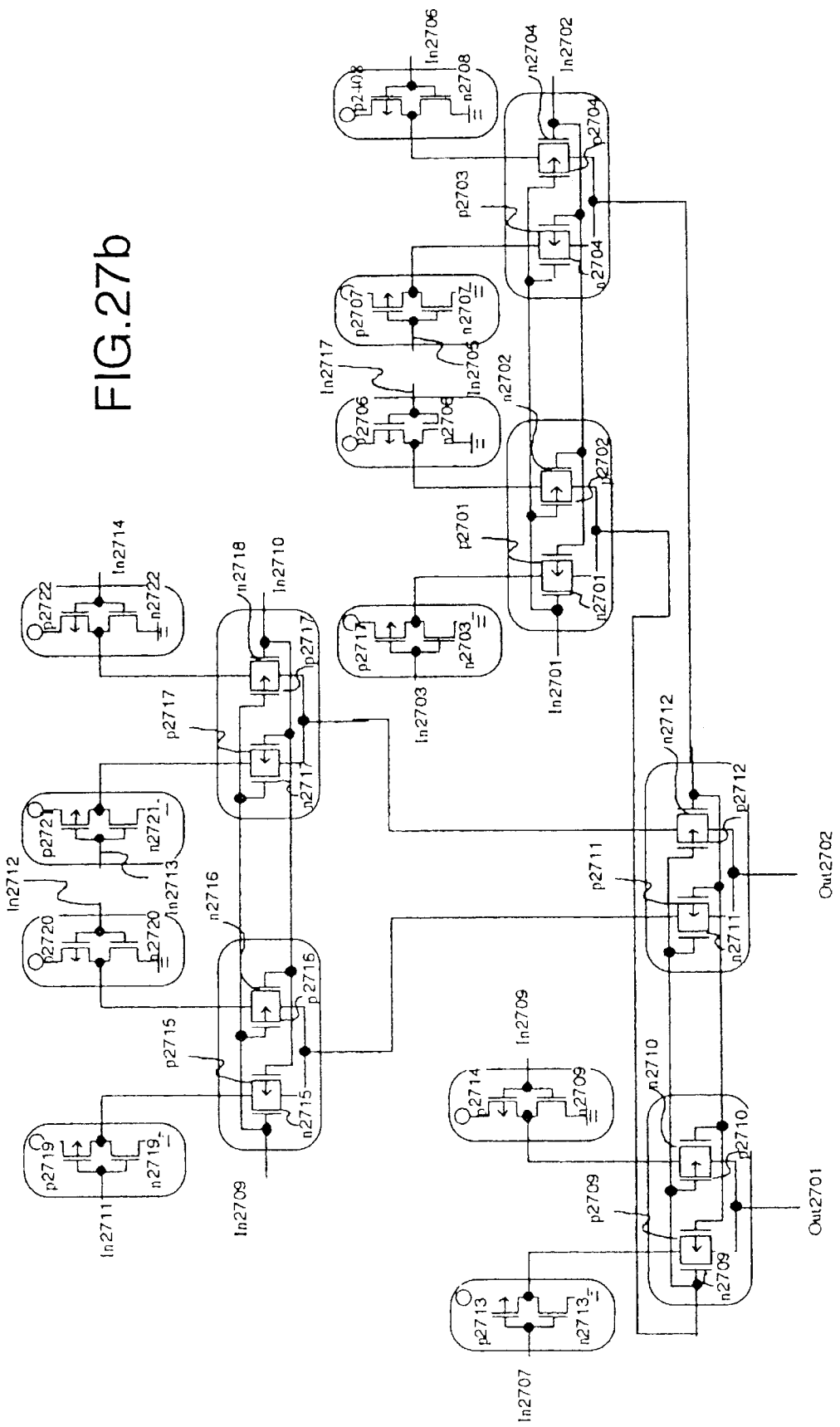

FIGS. 27a–27b show a circuit using the present invention. FIGS. 27a and 27b are, respectively, a layout diagram (27a) and a circuit diagram (27b) showing a selector circuit which has signal amplifying devices at its inputs and in which there are six selectors. This circuit reduces an input capacitance of the drain and the application of the present invention can produce a layout with no dead space by sharing the diffusion layers. In FIGS. 27a–27b, p2701–p2722 and n2701–n2722 denote transistors, and In2701–In2714 denote input signals from outside. Out2701–Out2702 are outputs of pass-transistor logic circuit, cp2701 is a base bias contact, and cn2701 a well supply contact.

Figure 28A:
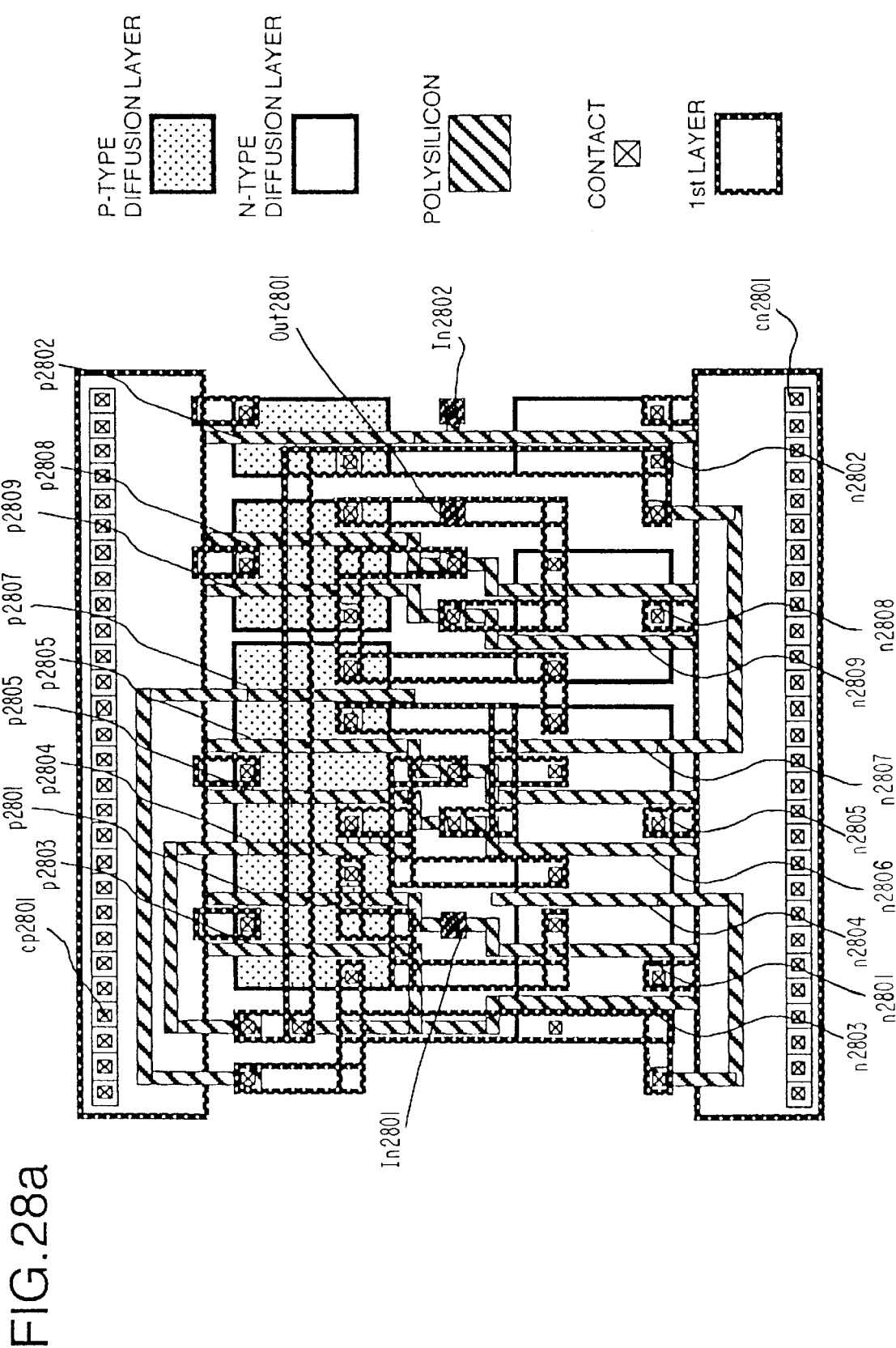
FIGS. 28a–28b are layout and circuit diagrams of a latch according to one embodiment of the invention.
Figure 28B:
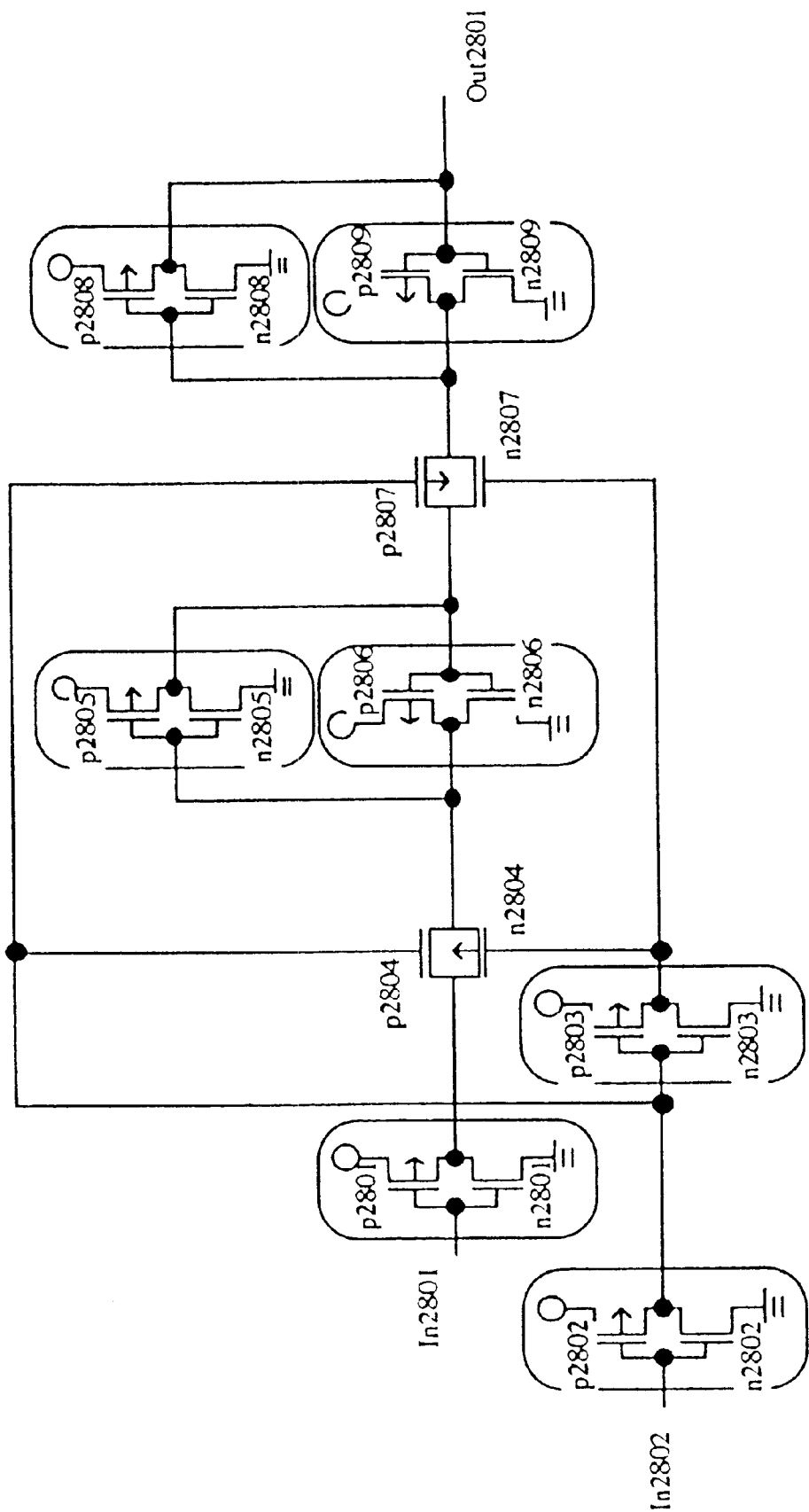

FIGS. 28a–28b show a circuit using the present invention. FIG. 28a is a latch layout and FIG. 27b is a circuit diagram (27b). The application of the present invention can produce a layout with no dead space by sharing the diffusion layers. In FIGS. 28a–28b, p2801–p2809 and n2801–n2809 denote transistors, and In2801–In2802 denote input signals from outside. out2801 is an output of a pass-transistor logic circuit, cp2801 is a base bias contact, and cn2801 is a well supply contact.

Figure 29:
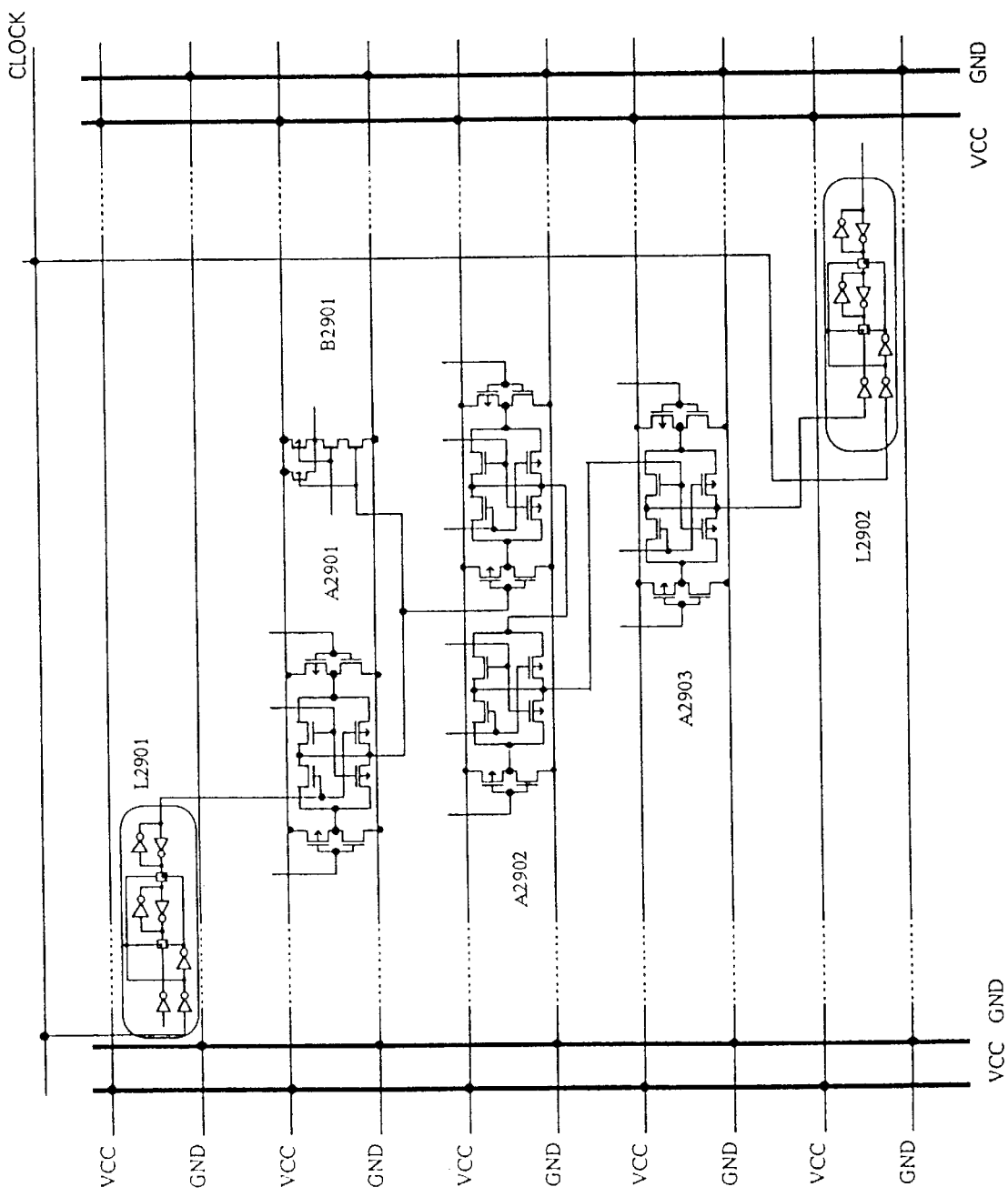
FIG. 29 is a circuit diagram of a chip accordingly to one embodiment of the present invention.

FIG. 29 shows a circuitry inside the chip of this invention. L2901 and L2902 are latches that are supplied with the same clock signal. A2901, A2902 and A2903 are pass-transistor logic circuit cells constructed by using the present invention. B2901 is a CMOS circuit. A2901, A2902 and A2903 are arranged between a first power supply line (VCC in this embodiment) and a second power supply line (GND in this embodiment), and these circuits are interconnected with signal lines. A signal that has passed through the selector of A2901 is connected to a plurality of terminals that use this signal.

Figure 30:
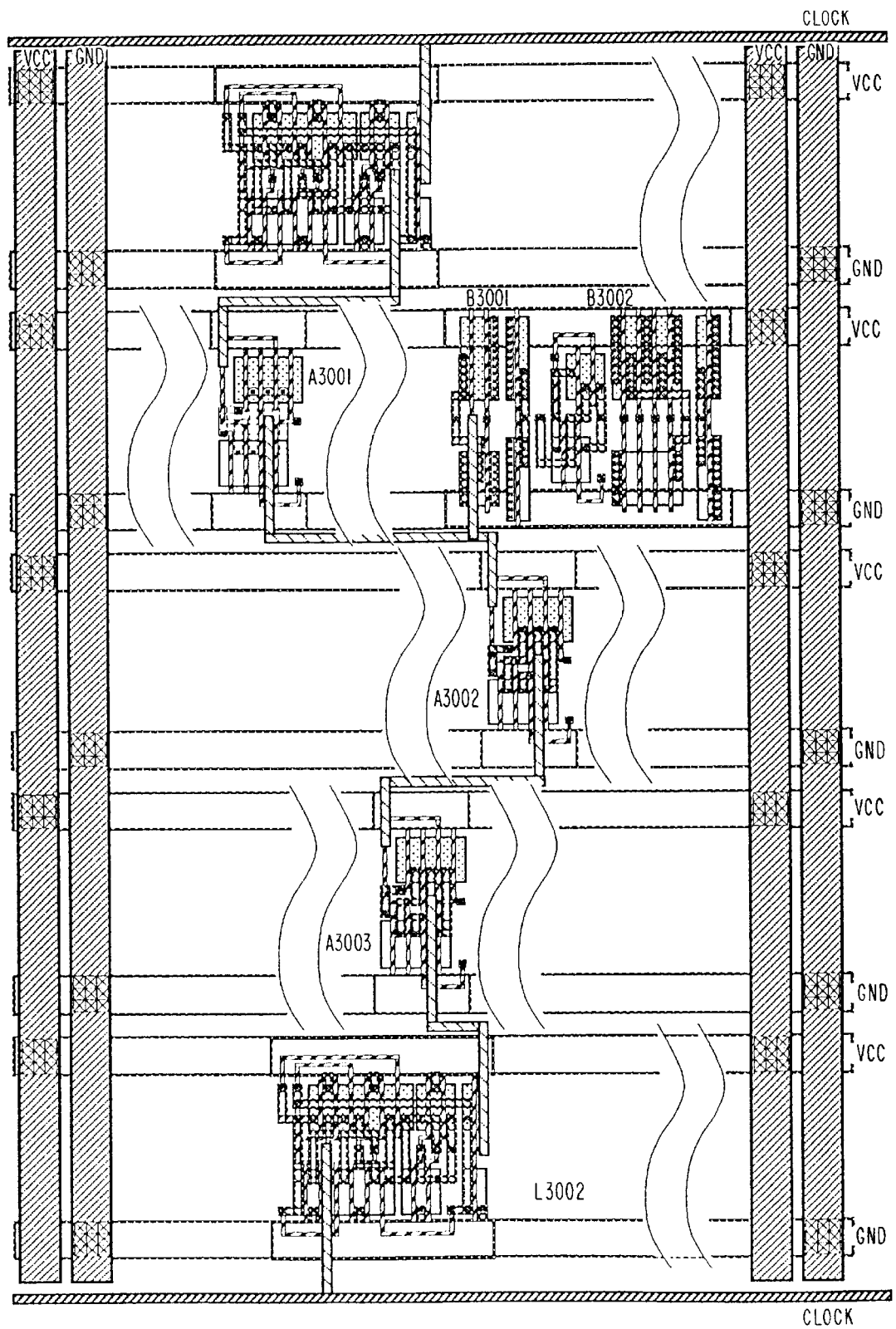
FIG. 30 is a layout diagram of a chip according to one embodiment of the present invention.

FIG. 30 is a layout diagram inside the chip of this invention. L3001 and L3002 are latches that are supplied with the same clock signal. A3001, A3002 and A3003 are pass-transistor logic circuit cells constructed by using the present invention, and B3001 and B3002 are CMOS circuit cells. A3001, A3002 and A3003 are arranged between a first power supply line (VCC in this embodiment) and a second power supply line (GND in this embodiment), and these circuits are interconnected with signal lines. A signal that has passed through the selector of A3001 is connected to a plurality of terminals that use this signal. This circuit of the present invention can coexist with conventional CMOS circuits in a chip without a problem.

FIG. 31 is a layout diagram inside the chip of this invention. L3101 and L3102 are latches that are supplied with the same clock signal. A3101, A3102 and A3103 are pass-transistor logic circuit cells constructed by using the present invention, and B3101 and 23102 are CMOS circuit cells. A3101, A3102 and A3103 are arranged between a first power supply line (VCC in this embodiment) and a second power supply line (GND in this embodiment), and these circuits are interconnected with signal lines. In a system of L3101-A3101-A3102-A3103-L3102 when a faster signal transmission is required, circuits using low-threshold-voltage transistors are prepared. The circuits using low-threshold-voltage transistors can be constructed by this invention and the circuit performance can be improved by the invention.

Figure 32B:
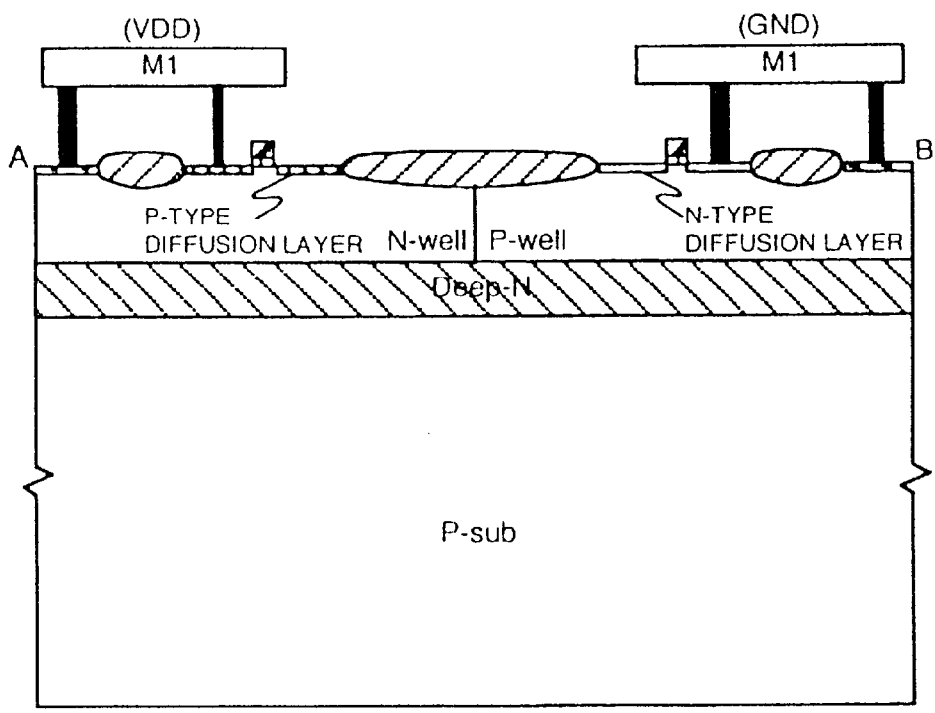

FIG. 32b shows a cross-sectional structure of circuit using this invention.

With the above embodiments, it is possible to 10 provide semiconductor integrated circuits having pass-transistor logic circuit cells with a small area which can reduce power consumption, delay time and also design time.

What is claimed is:

1. A semiconductor integrated circuit device, having at least one selector, the selector in the integrated circuit comprising:

first and second PMOS transistors;

first and second NMOS transistors;

first to fourth input terminals; and a first node;

wherein a source-drain path of the first PMOS transistor is connected between the first input terminal and the first node;

a source-drain path of the first NMOS transistor is connected between the first input terminal and the first node;

a source-drain path of the second PMOS transistor is connected between the second input terminal and the first node;

a source-drain path of the second NMOS transistor is connected between the second input terminal and the first node;

a gate terminal of the first PMOS transistor is controlled by a first signal applied to the third input terminal;

a gate terminal of the second NMOS transistor is controlled by the first signal applied to the third input terminal;

a gate terminal of the second PMOS transistor is controlled by a second signal applied to the fourth input terminal;

a gate terminal of the first NMOS transistor is controlled by the second signal applied to the fourth input terminal;

the first signal and the second signal are complementary signals;

the drain of the first PMOS transistor and the drain of the second PMOS transistor are arranged to share their diffusion layers so that they are connected to each other; and the drain of the first NMOS transistor and the drain of the second NMOS transistor are arranged to share their diffusion layers so that they are connected to each other;

wherein common portions of the source of the first PMOS transistor and the drains of the first and second NMOS transistors are arranged in line in a direction intersecting a direction in which a power supply line extends; and common portions of the source of the second NMOS transistor and the drains of the first and second PMOS transistors are arranged in line in a direction intersecting a direction in which the power supply line extends.

2. A semiconductor integrated circuit device according to claim 1, wherein a gate signal of each of the PMOS and NMOS transistors is supplied via polysilicon wires;

the source of the first PMOS transistor and the source of the first NMOS transistor are connected by a first-layer metal;

the source of the second PMOS transistor and the source of the second NMOS transistor are connected by the first-layer metal; and a common portion of the drain of the first PMOS transistor and the drain of the second PMOS transistor and a common portion of the drain of the first NMOS transistor and the drain of the second NMOS transistor are connected by using the first-layer metal at least as part of a connecting means.

3. A semiconductor integrated circuit device according to claim 1, wherein the gate of the first PMOS transistor and a the gate of the second NMOS transistor face each other in a direction perpendicular to a direction in which the power supply line extends; and when a direction parallel to the power supply line is set in a horizontal or lateral direction, the first NMOS transistor and the second PMOS transistor are on opposite left and right sides with respect to a wire connecting the gate of the first PMOS transistor and the gate of the second NMOS transistor.

4. A semiconductor integrated circuit device according to claim 1, wherein the gate terminal of the first PMOS transistor and the gate terminal of the second PMOS transistor are arranged at a smaller interval than other terminal-to-terminal distances in the selector; and the gate terminal of the first NMOS transistor and the gate terminal of the second NMOS transistor are arranged at a smaller interval than other terminal-to-terminal distances in the selector.

5. A semiconductor integrated circuit device according to claim 1, wherein, when a direction in which the power supply line extends is set in a horizontal or lateral direction, at least one gate signal input terminal is arranged in a space formed above or below the second PMOS transistor and in a space formed below or above the first NMOS transistor.

6. A semiconductor integrated circuit device according to claim 1, wherein at least two of the selectors are used and, when a direction in which the power supply line extends is set in a horizontal or lateral direction, a space formed above or below the second PMOS transistor or a space formed below or above the first NMOS transistor in one selector and a space formed above or below the second PMOS transistor or a space formed below or above the first NMOS transistor in the other selector are overlapped.

7. A semiconductor integrated circuit device according to claim 1, wherein at least two of the selectors are used to produce first and second outputs that are complementary signals;

the first output is connected to an input of a first output buffer by the first-layer metal;

the second output is connected to an input of a second output buffer by the first-layer metal; and when a coordinate system is set in a direction in which the power supply line extends, the two types of field-effect transistors making up the first and second output buffers are arranged at cell boundaries on the sides where their coordinate values are minimum and maximum.

8. A semiconductor integrated circuit according to claim 7, wherein the first output is connected to the input of the first output buffer by a metal wiring layer different from the first-layer metal; and the second output is connected to the input of the second output buffer by a metal wiring layer different from the first-layer metal.

9. A semiconductor logic circuit including at least one circuit cell, the circuit cell comprising:

a selector;

first and second logic gates; and first and second operation voltage points;

wherein the selector has first and second PMOS transistors, first to fourth NMOS transistors, and first to third nodes;

a gate of the first PMOS transistor is controlled by a first input signal, and a source-drain path of the first PMOS transistor is connected between the first operation voltage point and the first node;

a gate of the second PMOS transistor is controlled by a second input signal, and a source-drain path of the second PMOS transistor is connected between the first operation voltage point and the second node;

a gate of the first NMOS transistor is controlled by the first input signal, and a source-drain path of the first NMOS transistor is connected between the second operation voltage point and the first node;

a gate of the second NMOS transistor is controlled by the second input signal, and a source-drain path of the second NMOS transistor is connected between the second operation voltage point and the second node;

a gate of the third NMOS transistor is controlled by a third input signal, and a source-drain path of the third NMOS transistor is connected between the first node and the third node;

a gate of the fourth NMOS transistor is controlled by a fourth input signal, and a source-drain path of the fourth NMOS transistor is connected between the second node and the third node; and the third node is connected to input terminals of the, first logic gate and the second logic gate.

* * * * *

UNITED STATES PATENT AND TRADEMARK OFFICE
CERTIFICATE OF CORRECTION

PATENT NO. : 6,356,118 B1
DATED : March 12, 2002
INVENTOR(S) : Rikino et al.

It is certified that error appears in the above-identified patent and that said Letters Patent is hereby corrected as shown below:

<u>Title page,</u>
Please insert the following:
-- [73] Assignee(s): Hitachi, Ltd., Tokyo, Japan
Hitachi Device Engineering Co., Ltd., Chiba, Japan --

Signed and Sealed this

Ninth Day of September, 2003

JAMES E. ROGAN
*Director of the United States Patent and Trademark Office*